(12) United States Patent
Yamamichi et al.

(10) Patent No.: US 12,034,416 B2
(45) Date of Patent: Jul. 9, 2024

(54) HEAD UNIT AND LIQUID DISCHARGE APPARATUS

(71) Applicant: SEIKO EPSON CORPORATION, Tokyo (JP)

(72) Inventors: Shunsuke Yamamichi, Nagano (JP); Yusuke Matsumoto, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 472 days.

(21) Appl. No.: 17/456,663

(22) Filed: Nov. 29, 2021

(65) Prior Publication Data

US 2022/0169018 A1 Jun. 2, 2022

(30) Foreign Application Priority Data

Dec. 1, 2020 (JP) .................................. 2020-199485

(51) Int. Cl.
  *B41J 2/045* (2006.01)
  *B41J 29/377* (2006.01)
  *H03F 3/217* (2006.01)

(52) U.S. Cl.
  CPC .......... *H03F 3/217* (2013.01); *B41J 2/04541* (2013.01); *B41J 2/0455* (2013.01); *B41J 2/04581* (2013.01); *B41J 29/377* (2013.01)

(58) Field of Classification Search
  CPC .. B41J 2/04541; B41J 2/0455; B41J 2/14201; B41J 2/04501; B41J 2/04581; B41J 29/377; B41J 2202/19; B41J 2002/14362
  See application file for complete search history.

(56) References Cited

U.S. PATENT DOCUMENTS

| | | | |
|---|---|---|---|
| 6,264,297 B1 * | 7/2001 | Ayata | B41J 2/04593 347/12 |
| 7,699,417 B2 | 4/2010 | Inoue | |
| 2006/0055740 A1 | 3/2006 | Kondoh | |
| 2008/0284815 A1 | 11/2008 | Kubo | |
| 2014/0292887 A1 | 10/2014 | Sugiura et al. | |
| 2015/0062220 A1 | 3/2015 | Kashimura et al. | |
| 2015/0246532 A1 | 9/2015 | Abe et al. | |
| 2018/0029395 A1 | 2/2018 | Sugiura et al. | |
| 2018/0183352 A1 | 6/2018 | Kitazawa et al. | |
| 2018/0361765 A1 | 12/2018 | Sago et al. | |
| 2019/0092061 A1 * | 3/2019 | Yamada | B41J 29/38 |

FOREIGN PATENT DOCUMENTS

| | | | | |
|---|---|---|---|---|
| JP | 2004-058632 A | | 2/2004 | |
| JP | 2015-063119 A | | 4/2015 | |
| JP | 2020138354 | * | 9/2020 | ............... B41J 2/14 |

\* cited by examiner

*Primary Examiner* — Kristal Feggins
(74) *Attorney, Agent, or Firm* — Global IP Counselors, LLP

(57) ABSTRACT

There are provided a substrate on which a first integrated circuit, a first transistor, and a first inductor element are disposed, and which has a first side and a second side facing each other; a heat sink having a fifth side and a sixth side along the first side; the first integrated circuit, the first transistor, and the first inductor element are positioned in order of the first integrated circuit, the first transistor, and the first inductor element from the first side toward the second side, and the heat sink is fixed to the substrate such that a shortest distance between the fifth side and the first side is shorter than a shortest distance between the sixth side and the first side, and a shortest distance between the first integrated circuit and the fifth side is longer than a shortest distance between the first transistor and the sixth side.

10 Claims, 25 Drawing Sheets

| [SIH, SIL] | | [1, 1] (LD) | [1, 0] (MD) | [0, 1] (SD) | [0, 0] (ND) |
|---|---|---|---|---|---|
| S1 | T1 | H | H | H | L |
| | T2 | H | L | L | L |
| S2 | T1 | L | L | L | H |
| | T2 | L | H | L | L |

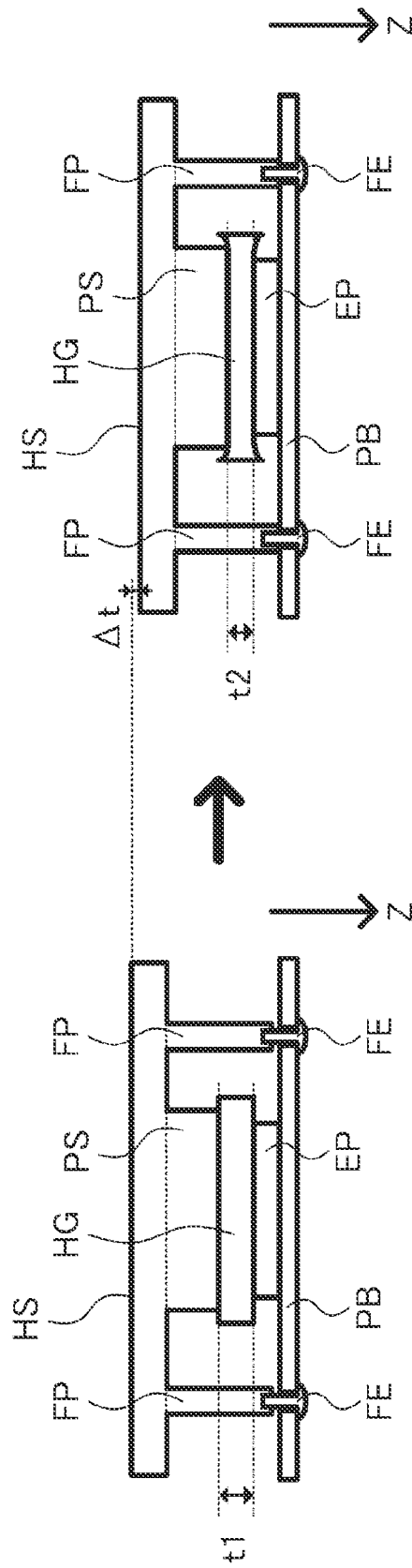

HEAD UNIT AND LIQUID DISCHARGE APPARATUS

The present application is based on, and claims priority from JP Application Serial Number 2020-199485, filed Dec. 1, 2020, the disclosure of which is hereby incorporated by reference herein in its entirety.

BACKGROUND

1. Technical Field

The present disclosure relates to a head unit and a liquid discharge apparatus.

2. Related Art

As a liquid discharge apparatus that forms an image or a document on a medium by discharging ink as a liquid, a configuration is known in which a piezoelectric element provided corresponding to each of a plurality of nozzles for discharging the liquid is provided, a predetermined amount of ink is discharged at a predetermined timing from the corresponding nozzle as the piezoelectric element is driven according to a driving signal, and a desired image or text is formed on the medium as the discharged ink lands on the medium. Since the piezoelectric element used in such a liquid discharge apparatus is a capacitive load such as a capacitor from an electrical point of view, it is necessary to supply a sufficient current to the piezoelectric element in order to drive the piezoelectric element with high accuracy. Therefore, in a liquid discharge apparatus that discharges a liquid by driving a piezoelectric element, a driving signal output circuit that outputs a driving signal is configured to include an amplifier circuit and the like in order to supply a driving signal having a sufficient current to the piezoelectric element.

However, the number of nozzles of the liquid discharge apparatus increases due to the demand for increasing the discharge speed of the liquid in the liquid discharge apparatus. As the number of nozzles increases, the amount of current based on the driving signal output by the driving signal output circuit also increases, and therefore, the amount of heat generated in the driving signal output circuit increases. There are problems that there is a concern that such an increase in the amount of heat generated in the driving signal output circuit accelerates the aging deterioration of components used in the liquid discharge apparatus, there is a concern that the physical property of the liquid discharged from the liquid discharge apparatus are affected, and there is a concern that the reliability of the liquid discharge apparatus deteriorates.

Various measures are taken to deal with the problems caused by the heat generated in such a liquid discharge apparatus. For example, JP-A-2004-058632 discloses a liquid discharge apparatus including a heat sink and a fan for releasing the heat generated by a transistor for driving the head. JP-A-2015-063119 discloses a liquid discharge apparatus in which performance of releasing the heat generated by a transistor is enhanced by forming a plurality of through-holes for the object of enhancing heat dissipation of the transistor on a substrate on which the transistor which is a heat generating component is disposed.

However, in a liquid discharge apparatus such as a line ink jet print head, there is a demand for higher definition of images and texts formed on a medium. In order to respond to the demand for higher definition, the number of nozzles of the liquid discharge apparatus increases day by day, and as a result, the amount of current output by the driving signal output circuit also increases. Furthermore, in order to respond to the demand for high definition, improvement of the driving accuracy of the piezoelectric element is also required, and therefore, improvement of the waveform accuracy of the driving signal for driving the piezoelectric element is required. Therefore, the operating frequency of the driving signal output circuit that outputs the driving signal is high.

As a result, the amount of current output by the driving signal output circuit further increases, and further, the amount of heat generated by the driving signal output circuit further increases due to the increase in the operating frequency of the driving signal output circuit. Therefore, it is required to release the heat generated by the driving signal output circuit with higher efficiency. In particular, in recent years, in addition to the above-described demand for high definition, the demand for miniaturization of the liquid discharge apparatus also increases, and as a result, it becomes difficult to ensure a sufficient region for releasing the heat generated in the driving signal output circuit.

Therefore, it is required that the heat generated in the driving circuit can be efficiently released without affecting the operation of the driving circuit. However, from the viewpoint of making it possible to efficiently release the heat generated in the driving circuit without affecting the operation of the driving circuit, the technology described in JP-A-2004-058632 and JP-A-2015-063119 are not sufficient, and there is room for further improvement.

SUMMARY

According to an aspect of the present disclosure, there is provided a head unit having a first driving element group driven by a first driving signal and discharging a liquid in response to drive of the first driving element group, including: a substrate that propagates the first driving signal; a first driving circuit disposed on the substrate and outputting the first driving signal; a heat sink fixed to the substrate; and a plurality of heat conductive elastic bodies positioned between the substrate and the heat sink, in which the first driving circuit includes a first integrated circuit that outputs a first gate signal based on a first reference driving signal that is a reference of the first driving signal, a first amplifier circuit including a first transistor driven by the first gate signal, and a first smoothing circuit that has a first inductor element, smoothes output from the first amplifier circuit, and outputs the first driving signal, a first heat conductive elastic body among the plurality of heat conductive elastic bodies is positioned between the heat sink and the first integrated circuit, and is in contact with the heat sink and the first integrated circuit, a second heat conductive elastic body among the plurality of heat conductive elastic bodies is positioned between the heat sink and the first transistor, and is in contact with the heat sink and the first transistor, the substrate has a first side and a second side which are positioned facing each other, and a third side and a fourth side which are shorter than the first side and positioned facing each other, the first integrated circuit, the first transistor, and the first inductor element are positioned in order of the first integrated circuit, the first transistor, and the first inductor element along a direction from the first side toward the second side, the heat sink has a fifth side and a sixth side which are positioned facing each other, and is positioned such that the fifth side and the sixth side extend along the first side and a shortest distance between the fifth side and the first side is shorter than a shortest distance between the sixth side and the first side, and a shortest distance between the first integrated circuit and the fifth side is longer than a shortest distance between the first transistor and the sixth side in a plan view when viewed from a normal direction of the substrate.

According to another aspect of the present disclosure, there is provided a liquid discharge apparatus including: the head unit; and a transport unit that transports a medium on which a liquid discharged from the head unit lands.

BRIEF DESCRIPTION OF THE DRAWINGS

FIGS. 26A and 26B are views for describing a plurality of elastic heat dissipating bodies that are deformed as the heat sink is tightened to the wiring substrate.

DESCRIPTION OF EXEMPLARY EMBODIMENTS

Figure 1A:
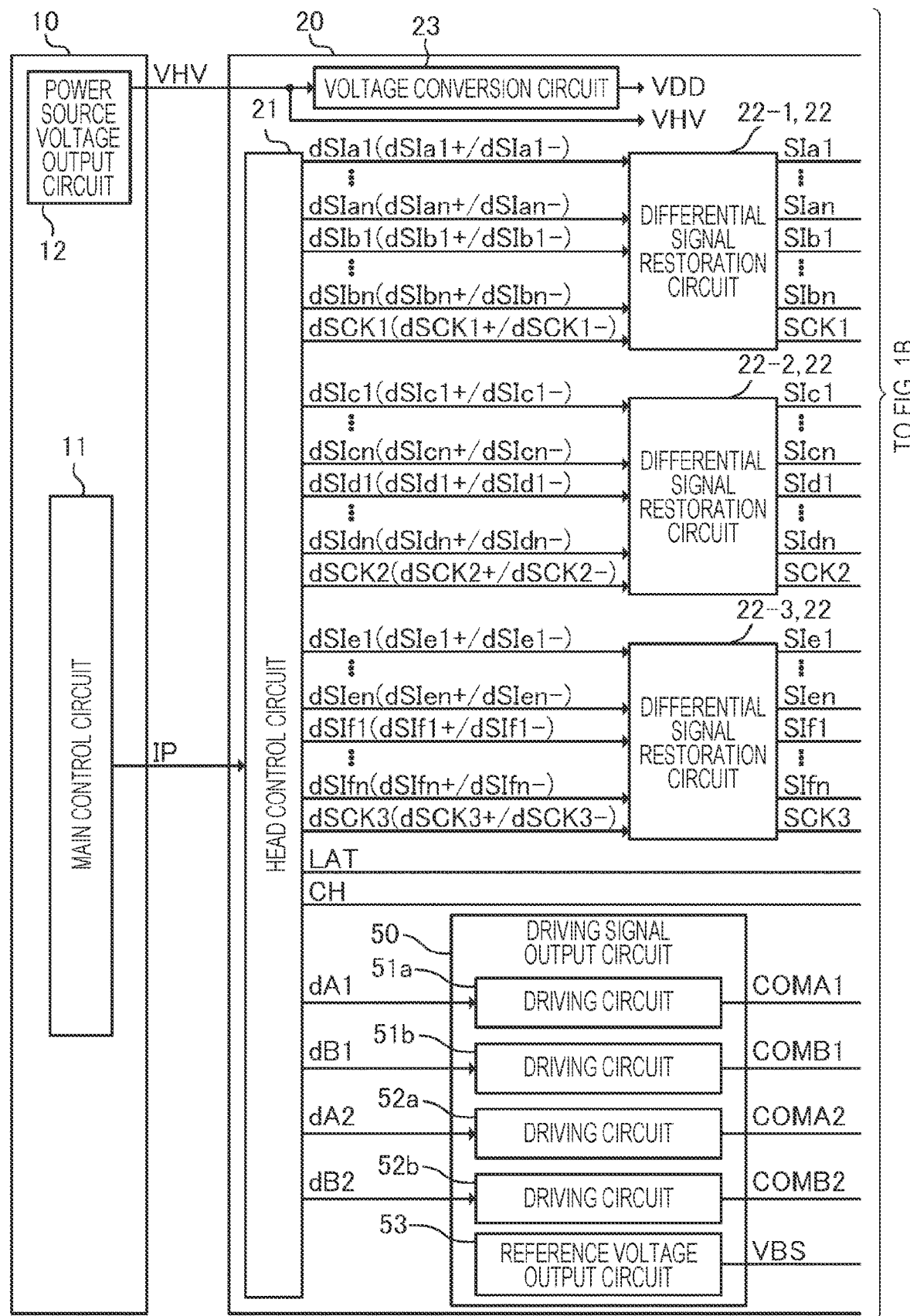
FIGS. 1A and 1B are views illustrating a functional configuration of a liquid discharge apparatus.

Hereinafter, appropriate embodiments of the present disclosure will be described with reference to the drawings. The drawing to be used is for convenience of description. In addition, the embodiments which will be described below do not inappropriately limit the contents of the present disclosure described in the claims. Moreover, not all of the configurations which will be described below are necessarily essential components of the present disclosure.

1. Functional Configuration of Liquid Discharge Apparatus

First, a functional configuration of a liquid discharge apparatus 1 will be described with reference to FIGS. 1A and 1B. The liquid discharge apparatus 1 in the present embodiment will be described by taking as an example an ink jet printer that forms a desired image on a medium by discharging ink as an example of the liquid to the medium. The liquid discharge apparatus 1 receives image data propagated by wired communication or wireless communication from a computer or the like (not illustrated), and forms an image that corresponds to the image data on the medium.

Figure 1B:
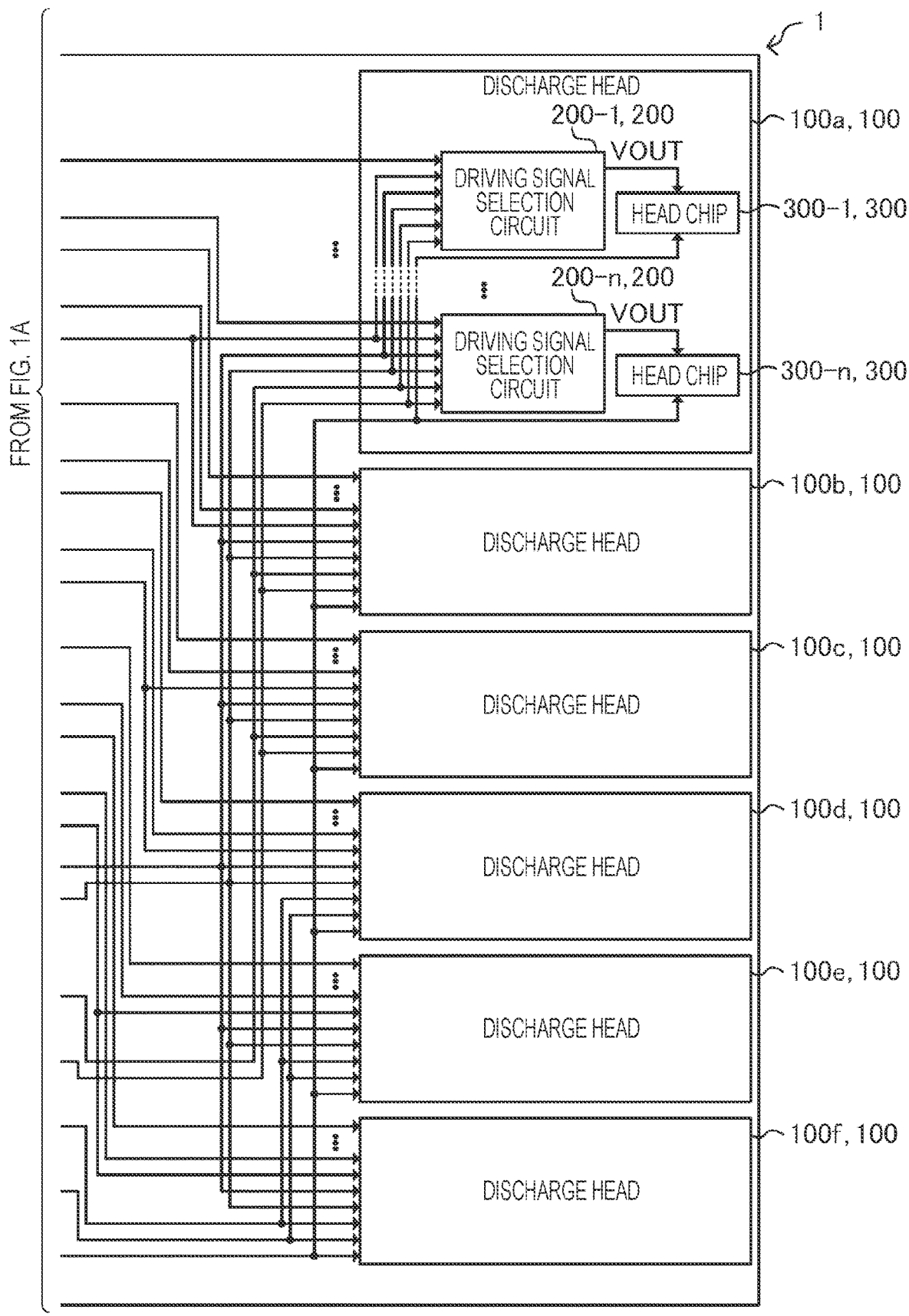

FIGS. 1A and 1B are views illustrating a functional configuration of the liquid discharge apparatus 1. As illustrated in FIGS. 1A and 1B, the liquid discharge apparatus 1 includes a head unit 20 that discharges ink and a control unit 10 that controls an operation of the head unit 20. The control unit 10 has a main control circuit 11 and a power source voltage output circuit 12.

A commercial voltage, which is an AC voltage, is input to the power source voltage output circuit 12 from a commercial AC power source (not illustrated) provided outside the liquid discharge apparatus 1. The power source voltage output circuit 12 generates and outputs a voltage VHV, which is a DC voltage having a voltage value of 42 V, for example, based on the input commercial voltage. In other words, the power source voltage output circuit 12 is an AC/DC converter that converts the AC voltage into the DC voltage, and includes, for example, a flyback circuit and the like. The voltage VHV generated by the power source voltage output circuit 12 is supplied as a power source voltage to each portion of the liquid discharge apparatus 1 including the control unit 10 and the head unit 20. Here, the power source voltage output circuit 12 may generate, in addition to the voltage VHV, a DC voltage having a plurality of voltage values supplied to each configuration of the liquid discharge apparatus 1 including the control unit 10 and the head unit 20, and may output the generated DC voltage to the corresponding configuration.

An image signal is input to the main control circuit 11 from an external device such as a host computer provided outside the liquid discharge apparatus 1 via an interface circuit (not illustrated). Then, the main control circuit 11 outputs a signal obtained by performing predetermined image processing on the input image signal to the head unit 20 as an image information signal IP. The image information signal IP output from the main control circuit 11 may be, for example, an electric signal capable of high-speed communication such as a differential signal, or an optical signal for performing optical communication.

Here, examples of the image processing executed by the main control circuit 11 include color conversion processing that converts the input image signal into red, green, and blue color information, and then converts the converted color information into color information that corresponds to the color of the ink discharged from the liquid discharge apparatus 1, or halftone processing that binarizes the color information to which the color conversion processing is performed. The image processing executed by the main control circuit 11 is not limited to the color conversion processing or the halftone processing described above. The main control circuit 11 is one or a plurality of semiconductor devices having a plurality of functions, and may include, for example, a system on a chip (SoC).

The head unit 20 includes a head control circuit 21, differential signal restoration circuits 22-1 to 22-3, a voltage conversion circuit 23, a driving signal output circuit 50, and discharge heads 100*a* to 100*f*.

The voltage VHV is input to the voltage conversion circuit 23. Then, the voltage conversion circuit 23 generates a DC voltage having a predetermined voltage value such as 3.3 V or 5 V by stepping down or boosting the voltage value of the input voltage VHV, and outputs the generated DC voltage as a voltage VDD. The voltage conversion circuit 23 may output a plurality of DC voltages having different voltage values as the voltage VDD. In other words, the voltage VDD output by the voltage conversion circuit 23 is not limited to one DC voltage.

The head control circuit 21 outputs a control signal for controlling each portion of the head unit 20 based on the image information signal IP input from the main control circuit 11. Specifically, the head control circuit 21 generates differential signals dSCK1 to dSCK3 and differential signals dSIa1 to dSIan, dSIb1 to dSIbn, dSIc1 to dSIcn, dSId1 to dSIdn, dSIe1 to dSIen, and dSIf1 to dSIfn, which are obtained by converting the control signal for controlling the discharge of the ink from the discharge head 100 into the differential signals based on the image information signal IP, and outputs the generated signals to the differential signal restoration circuits 22-1 to 22-3.

The differential signal restoration circuits 22-1 to 22-3 restore corresponding clock signals SCK1 to SCK3 and print data signals SIa1 to SIan, SIb1 to SIbn, SIc1 to SIcn, SId1 to SIdn, SIe1 to SIen, and SIf1 to SIfn from each of the input differential signals dSCK1 to dSCK3 and the differential signals dSIa1 to dSIan, dSIb1 to dSIbn, dSIc1 to dSIcn, dSId1 to dSIdn, dSIe1 to dSIen, and dSIf1 to dSIfn, and outputs the restored signals to discharge heads 100*a* to 100*f*.

Specifically, the head control circuit 21 generates the differential signal dSCK1 having a pair of signals dSCK1+ and dSCK1−, the differential signals dSIa1 to dSIan having a pair of signals dSIa1+ to dSIan+ and dSIa1− to dSIan−, and the differential signals dSIb1 to dSIbn having a pair of signals dSIb1+ to dSIbn+ and dSIb1− to dSIbn−, and outputs the generated signals to the differential signal restoration circuit 22-1. The differential signal restoration circuit 22-1 restores the input differential signal dSCK1 to generate the clock signal SCK1 which is a corresponding single-ended signal, and output the generated clock signal SCK1 to the discharge heads 100*a* and 100*b*, restores the differential signals dSIa1 to dSIan to generate the print data signals SIab to SIan which are the corresponding single-ended signals, and output the generated print data signals SIab to SIan to the discharge head 100*a*, and restores the differential signals dSIb1 to dSIbn to generate the print data signals SIb1 to SIbn which are the corresponding single-ended signals, and output the generated print data signals SIb1 to SIbn to the discharge head 100*b*.

Similarly, the head control circuit 21 generates the differential signal dSCK2 having a pair of signals dSCK2+ and dSCK2−, the differential signals dSIc1 to dSIcn having a pair of signals dSIc1+ to dSIcn+ and dSIc1− to dSIcn−, and the differential signals dSId1 to dSIdn having a pair of signals dSId1+ to dSIdn+ and dSId1− to dSIdn−, and outputs the generated signals to the differential signal restoration circuit 22-2. The differential signal restoration circuit 22-2 restores the input differential signal dSCK2 to generate the clock signal SCK2 which is a corresponding single-ended signal, and output the generated clock signal SCK2 to the discharge heads 100*c* and 100*d*, restores the differential signals dSIc1 to dSIcn to generate the print data signals SIc1 to SIcn which are the corresponding single-ended signals, and output the generated print data signals SIc1 to SIcn to the discharge head 100*c*, and restores the differential signals dSId1 to dSIdn to generate the print data signals SId1 to SIdn which are the corresponding single-ended signals, and output the generated print data signals SId1 to SIdn to the discharge head 100*d*.

Similarly, the head control circuit 21 generates the differential signal dSCK3 having a pair of signals dSCK3+ and dSCK3−, the differential signals dSIe1 to dSIen having a pair of signals dSIe1+ to dSIen+ and dSIe1− to dSIen−, and the differential signals dSIf1 to dSIfn having a pair of signals dSIf1+ to dSIfn+ and dSIf1− to dSIfn−, and outputs the generated signals to the differential signal restoration circuit 22-3. The differential signal restoration circuit 22-3 restores the input differential signal dSCK3 to generate the clock signal SCK3 which is a corresponding single-ended signal, and output the generated clock signal SCK3 to the discharge heads 100*e* and 100*f*, restores the differential signals dSIe1 to dSIen to generate the print data signals SIe1 to SIen which are the corresponding single-ended signals, and output the generated print data signals SIe1 to SIen to the discharge head 100*e*, and restores the differential signals dSIf1 to dSIfn to generate the print data signals SIf1 to SIfn which are the corresponding single-ended signals, and output the generated print data signals SIf1 to SIfn to the discharge head 100*f*.

Here, the differential signals dSCK1 to dSCK3 output from the head control circuit 21 and the differential signals dSIa1 to dSIan, dSIb1 to dSIbn, dSIc1 to dSIcn, dSId1 to dSIdn, dSIe1 to dSIen, and dSIf1 to dSIfn may be, for example, differential signals in a low voltage differential signaling (LVDS) transfer method, or may be differential signals in various high-speed transfer methods such as low voltage positive emitter coupled logic (LVPECL) and current mode logic (CML) other than LVDS.

The head unit 20 includes a differential signal generation circuit that generates a differential signal, and the head control circuit 21 may be configured to output reference control signals oSCK1 to oSCK3, which are references of the differential signals dSCK1 to dSCK3, reference control signals oSIa1 to oSIan, oSIb1 to oSIbn, oSIc1 to oSIcn, oSId1 to oSIdn, oSIe1 to oSIen, and oSIf1 to oSIfn, which are references of the differential signals dSIa1 to dSIan, dSIb1 to dSIbn, dSIc1 to dSIcn, dSId1 to dSIdn, dSIe1 to dSIen, and dSIf1 to dSIfn, to the differential signal generation circuit, and the differential signal generation circuit may be configured to generate the differential signals dSCK1 to dSCK3 and the differential signals dSIa1 to dSIan, dSIb1 to dSIbn, dSIc1 to dSIcn, dSId1 to dSIdn, dSIe1 to dSIen, and dSIf1 to dSIfn based on the input reference control signals oSCK1 to oSCK3 and the reference control signals oSIa1 to oSIan, oSIb1 to oSIbn, oSIc1 to oSIcn, oSId1 to oSIdn, oSIe1 to oSIen, and oSIf1 to oSIfn, and output the generated signals to each of the differential signal restoration circuits 22-1 to 22-3. Here, the differential signal restoration circuits 22-1 to 22-3 all have the same configuration, and when it is not necessary to distinguish the circuits from each other, there is a case of being simply referred to as the differential signal restoration circuit 22.

The head control circuit 21 generates a latch signal LAT and a change signal CH as control signals for controlling the ink discharge timing from the discharge heads 100a to 100d based on the image information signal IP input from the main control circuit 11, and outputs the generated signals to the discharge heads 100a to 100d.

Furthermore, the head control circuit 21 generates reference driving signals dA1, dB1, dA2, and dB2 which are references of driving signals COMA1, COMA2, COMB1, and COMB2 for driving the discharge heads 100a to 100d based on the image information signal IP input from the main control circuit 11, and outputs the generated signals to the driving signal output circuit 50.

The driving signal output circuit 50 includes driving circuits 51a, 51b, 52a, and 52b, and a reference voltage output circuit 53. Then, the driving signal output circuit 50 generates and outputs the driving signals COMA1, COMB1, COMA2, and COMB2 and a reference voltage signal VBS based on the reference driving signals dA1, dB1, dA2, and dB2.

The reference driving signal dA1 is input to the driving circuit 51a. The driving circuit 51a converts the input reference driving signal dA1 into an analog signal, and then applies class D amplification to the converted analog signal based on the voltage VHV to generate the driving signal COMA1, and output the generated driving signal COMA1 to the discharge heads 100a, 100b, and 100c. The reference driving signal dB1 is input to the driving circuit 51b. The driving circuit 51b converts the input reference driving signal dB1 into an analog signal, and then applies class D amplification to the converted analog signal based on the voltage VHV to generate the driving signal COMB1, and output the generated driving signal COMB1 to the discharge heads 100a, 100b, and 100c. The reference driving signal dA2 is input to the driving circuit 52a. The driving circuit 52a converts the input reference driving signal dA2 into an analog signal, and then applies class D amplification to the converted analog signal based on the voltage VHV to generate the driving signal COMA2, and output the generated driving signal COMA2 to the discharge heads 100d, 100e, and 100f. The reference driving signal dB2 is input to the driving circuit 52b. The driving circuit 52b converts the input reference driving signal dB2 into an analog signal, and then applies class D amplification to the converted analog signal based on the voltage VHV to generate the driving signal COMB2, and output the generated driving signal COMB2 to the discharge heads 100d, 100e, and 100f. The reference voltage output circuit 53 generates the reference voltage signal VBS which is a reference potential when ink is discharged from each of the discharge heads 100a to 100f by boosting or stepping down the voltage VDD, and outputs the generated reference voltage signal VBS to the discharge heads 100a to 100f. In other words, the driving signal output circuit 50 includes four class D amplifier circuits that generate driving signals COMA1, COMB1, COMA2, and COMB2, and a step-down circuit or booster circuit that generates the reference voltage signal VBS.

The discharge head 100a has the driving signal selection circuits 200-1 to 200-n, and head chips 300-1 to 300-n corresponding to each of the driving signal selection circuits 200-1 to 200-n.

The print data signal SIa1, the clock signal SCK1, the latch signal LAT, the change signal CH, and the driving signals COMA1 and COMB1 are input to the driving signal selection circuit 200-1 included in the discharge head 100a. The driving signal selection circuit 200-1 included in the discharge head 100a selects or deselects the signal waveforms of the driving signals COMA1 and COMB1 at the timing defined by the latch signal LAT and the change signal CH based on the print data signal SIa1 to generate the driving signal VOUT, and supply the generated driving signal VOUT to the head chip 300-1 included in the discharge head 100a. Accordingly, the piezoelectric element 60 described later in the head chip 300-1 is driven, and ink is discharged from the nozzle as the piezoelectric element 60 is driven.

Similarly, the print data signal SIan, the clock signal SCK1, the latch signal LAT, the change signal CH, and the driving signals COMA1 and COMB1 are input to the driving signal selection circuit 200-n included in the discharge head 100a. The driving signal selection circuit 200-n included in the discharge head 100a selects or deselects the signal waveforms of the driving signals COMA1 and COMB1 at the timing defined by the latch signal LAT and the change signal CH based on the print data signal SIan to generate the driving signal VOUT, and supply the generated driving signal VOUT to the head chip 300-n included in the discharge head 100a. Accordingly, the piezoelectric element 60 described later in the head chip 300-n is driven, and ink is discharged from the nozzle as the piezoelectric element 60 is driven.

In other words, each of the driving signal selection circuits 200-1 to 200-n switches whether or not to supply the driving signals COMA1 and COMB1 as the driving signals VOUT to the piezoelectric elements 60 included in the corresponding head chips 300-1 to 300-n.

Here, the discharge head 100a and the discharge heads 100b to 100f are different from each other only in the input signal, and the configuration and operation are the same. Therefore, the description of the configuration and operation of the discharge heads 100b to 100f will be omitted. In the following description, when it is not necessary to particularly distinguish the discharge heads 100a to 100f from each other, there is a case of being simply referred to as the discharge head 100. Furthermore, the driving signal selection circuits 200-1 to 200-n included in the discharge head 100 all have the same configuration, and the head chips 300-1 to 300-n all have the same configuration. Therefore, a case where it is not necessary to distinguish the driving signal selection circuits 200-1 to 200-n from each other will be simply referred to as the driving signal selection circuit 200.

The number of discharge heads 100, the number of driving signal selection circuits 200, the number of head chips 300, and the number of differential signal restoration circuits 22 in the liquid discharge apparatus 1, and the number of various configurations included in the liquid discharge apparatus 1 are not limited to the above-described numbers, and may be appropriately changed according to the number of nozzles of the liquid discharge apparatus 1.

2. Configuration of Driving Circuit

Next, the configuration and operation of the driving circuits 51a, 51b, 52a, and 52b included in the driving signal output circuit 50 will be described. Here, the driving circuits 51a, 51b, 52a, and 52b have the same configuration except that the input signal and the output signal are different. Therefore, in the following description, the configuration and operation of the driving circuit 51a that outputs the driving signal COMA1 based on the reference driving signal dA1 will be described, and the detailed description of the configurations and operations of the driving circuit 51b that outputs the driving signal COMB1 based on the reference driving signal dB1, the driving circuit 52a that outputs the driving signal COMA2 based on the reference driving signal dA2, and the driving circuit 52b that outputs the driving signal COMB2 based on the reference driving signal dB2 will be omitted.

Figure 2:
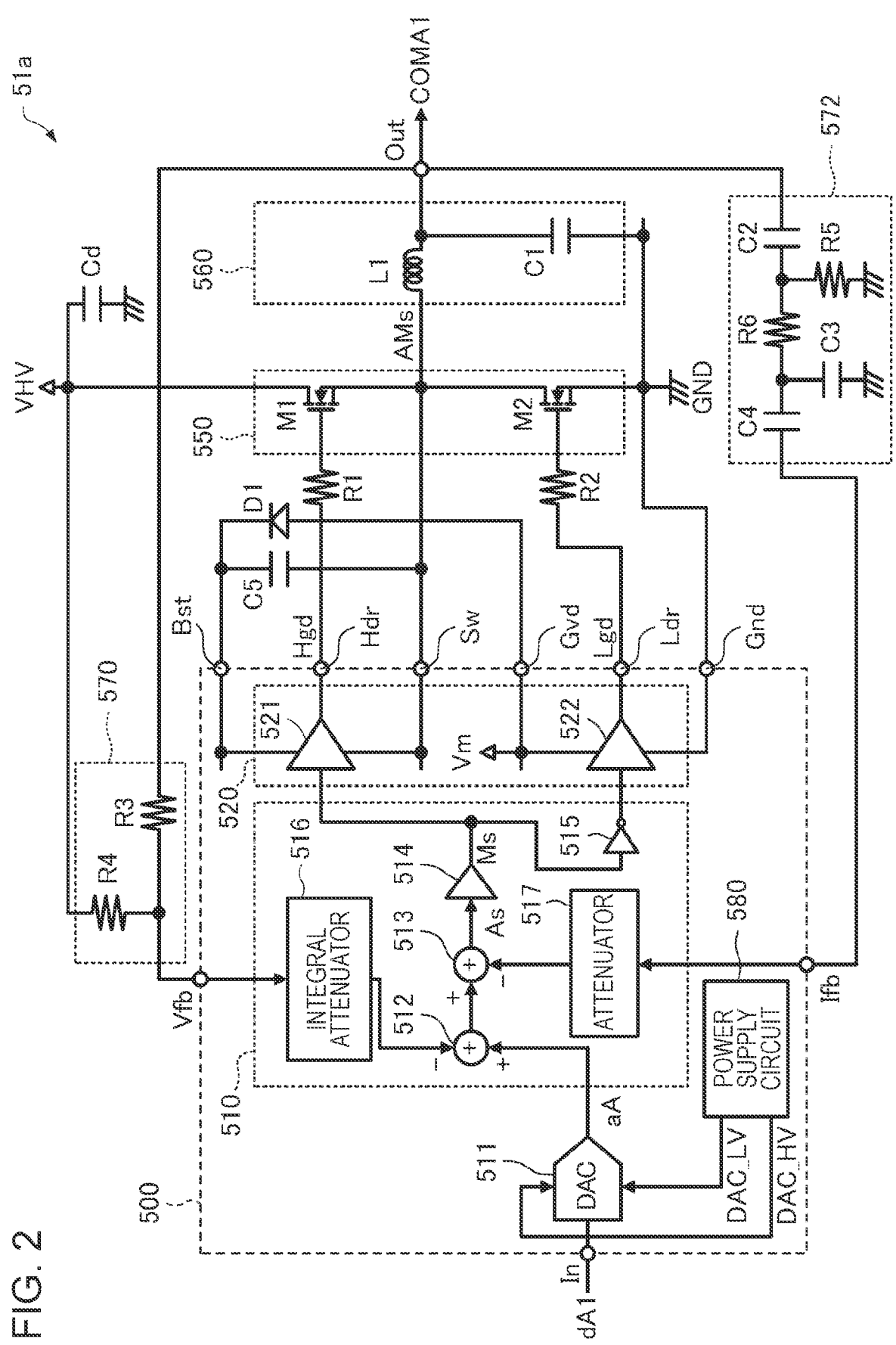
FIG. 2 is a view illustrating a configuration of a driving circuit.

FIG. 2 is a view illustrating the configuration of the driving circuit 51a. As illustrated in FIG. 2, the driving circuit 51a includes an integrated circuit 500 including a modulation circuit 510, an amplifier circuit 550, a smoothing circuit 560, feedback circuits 570 and 572, and a plurality of other circuit elements. The integrated circuit 500 outputs a gate signal Hgd and a gate signal Lgd based on the reference driving signal dA1 which is the reference of the driving signal COMA1. The amplifier circuit 550 includes the transistor M1 driven by the gate signal Hgd and the transistor M2 driven by the gate signal Lgd, which are output by the integrated circuit 500, and generates and outputs the amplified modulated signal AMs to the smoothing circuit 560. The smoothing circuit 560 includes the coil L1, smoothes the amplified modulated signal AMs which is the output from the amplifier circuit 550, and outputs the smoothed amplified modulated signal AMs as the driving signal COMA1.

The integrated circuit 500 is electrically coupled to the outside of the integrated circuit 500 via a plurality of terminals including a terminal In, a terminal Bst, a terminal Hdr, a terminal Sw, a terminal Gvd, a terminal Ldr, a terminal Gnd, and a terminal Vbs. The integrated circuit 500 modulates the reference driving signal dA1 input from the terminal In, and outputs the gate signal Hgd for driving the transistor M1 included in the amplifier circuit 550 and the gate signal Lgd for driving the transistor M2.

The integrated circuit 500 includes a digital to analog converter (DAC) 511, a modulation circuit 510, a gate drive circuit 520, and a power supply circuit 580.

The power supply circuit 580 generates a first voltage signal DAC_HV and a second voltage signal DAC_LV, and supplies the generated signals to the DAC 511.

The DAC 511 converts the digital reference driving signal dA1 that defines the signal waveform of the driving signal COMA1 into a reference driving signal aA which is an analog signal of the voltage value between the first voltage signal DAC_HV and the second voltage signal DAC_LV, and outputs the reference driving signal aA to the modulation circuit 510. The maximum value of the voltage amplitude of the reference driving signal aA is defined by the first voltage signal DAC_HV, and the minimum value is defined by the second voltage signal DAC_LV. In other words, the first voltage signal DAC_HV is a reference voltage on a high voltage side of the DAC 511, and the second voltage signal DAC_LV is a reference voltage on a low voltage side of the DAC 511. Then, a signal obtained by amplifying the analog reference driving signal aA becomes the driving signal COMA1. In other words, the reference driving signal aA corresponds to a target signal before amplification of the driving signal COMA1. The voltage amplitude of the reference driving signal aA in the present embodiment is, for example, 1 V to 2 V.

The modulation circuit 510 generates a modulated signal Ms obtained by modulating the reference driving signal aA, and outputs the generated modulated signal Ms to the amplifier circuit 550 via the gate drive circuit 520. The modulation circuit 510 includes adders 512 and 513, a comparator 514, an inverter 515, an integral attenuator 516, and an attenuator 517.

The integral attenuator 516 attenuates and integrates the voltage of a terminal Out input via a terminal Vfb, that is, the driving signal COMA1, and supplies the driving signal COMA1 to the input end on the − side of the adder 512. The reference driving signal aA is input to the input end on the + side of the adder 512. Then, the adder 512 supplies the voltage obtained by subtracting and integrating the voltage input to the input end on the − side from the voltage input to the input end on the + side, to the input end on the + side of the adder 513.

Here, while the maximum value of the voltage amplitude of the reference driving signal aA is approximately 2 V as described above, there is a case where the maximum value of the voltage of the driving signal COMA1 exceeds 40 V. Therefore, the integral attenuator 516 attenuates the voltage of the driving signal COMA1 input via the terminal Vfb in order to match the amplitude ranges of both voltages when obtaining the deviation.

The attenuator 517 supplies a voltage obtained by attenuating the high frequency component of the driving signal COMA1 input via a terminal Ifb, to the input end on the − side of the adder 513. The voltage output from the adder 512 is input to the input end on the + side of the adder 513. Then, the adder 513 outputs a voltage signal As, which is obtained by subtracting the voltage input to the input end on the − side from the voltage input to the input end on the + side, to the comparator 514.

The voltage signal As output from the adder 513 is a voltage obtained by subtracting the voltage of the signal supplied to the terminal Vfb, and further subtracting the voltage of the signal supplied to the terminal Ifb, from the voltage of the reference driving signal aA. Therefore, the voltage of the voltage signal As output from the adder 513 becomes a signal obtained by correcting the deviation obtained by subtracting the attenuated voltage of the driving signal COMA1 from the voltage of the target reference driving signal aA with the high frequency component of the driving signal COMA1.

The comparator 514 outputs the pulse-modulated modulated signal Ms based on the voltage signal As output from the adder 513. Specifically, the comparator 514 outputs the modulated signal Ms that becomes an H level when the voltage signal As output from the adder 513 reaches a threshold value Vth1 or greater, which will be described later, when the voltage rises, and becomes an L level when the voltage signal As falls below a threshold value Vth2, which will be described later, when the voltage drops. Here, the threshold values Vth1 and Vth2 are set in the relationship of threshold value Vth1 >threshold value Vth2. The frequency and duty ratio of the modulated signal Ms change according to the reference driving signals dA1 and aA. Therefore, as the attenuator 517 adjusts the modulation gain corresponding to the sensitivity, it is possible to adjust the amount of change in the frequency and duty ratio of the modulated signal Ms.

The modulated signal Ms output from the comparator 514 is supplied to a gate driver 521 included in the gate drive circuit 520. The modulated signal Ms is also supplied to the gate driver 522 included in the gate drive circuit 520 after the logic level is inverted by the inverter 515. In other words, the logic levels of the signals supplied to the gate driver 521 and the gate driver 522 are in an exclusive relationship with each other.

Here, the timing may be controlled such that the logic levels of the signals supplied to the gate driver 521 and the gate driver 522 do not become the H level at the same time. In other words, strictly speaking, the exclusive relationship means that the logic levels of the signals supplied to the gate driver 521 and the gate driver 522 do not become the H level at the same time, and more specifically means that the transistor M1 and the transistor M2 included in the amplifier circuit 550 are not turned on at the same time.

The gate drive circuit 520 includes the gate driver 521 and the gate driver 522.

The gate driver 521 level-shifts the modulated signal Ms output from the comparator 514 and outputs the level-shifted modulated signal Ms as the gate signal Hgd from the terminal Hdr. The higher side of the power source voltage of the gate driver 521 is the voltage applied via the terminal Bst, and the lower side is the voltage applied via the terminal Sw. The terminal Bst is coupled to one end of a capacitor C5 and the cathode of a diode D1 for preventing a reverse flow. The terminal Sw is coupled to the other end of the capacitor C5. The anode of the diode D1 is coupled to the terminal Gvd. Accordingly, the anode of the diode D1 is supplied with a voltage Vm, which is a DC voltage of, for example, 7.5 V, which is supplied from a power supply circuit (not illustrated). Therefore, the potential difference between the terminal Bst and the terminal Sw is approximately equal to the potential difference between both ends of the capacitor C5, that is, the voltage Vm. Then, the gate driver 521 generates the gate signal Hgd having a voltage greater than that of the terminal Sw by the voltage Vm following the input modulated signal Ms, and outputs the generated gate signal Hgd from the terminal Hdr.

The gate driver 522 operates on the lower potential side than that of the gate driver 521. The gate driver 522 level-shifts the signal in which the logic level of the modulated signal Ms output from the comparator 514 is inverted by the inverter 515, and outputs the level-shifted signal from the terminal Ldr to the gate signal Lgd. The voltage Vm is applied to the higher side of the power source voltage of the gate driver 522, and a ground potential of, for example, 0 V is supplied to the lower side via the terminal Gnd. Then, the gate signal Lgd having a voltage greater than that of the terminal Gnd by the voltage Vm following the signal input to the gate driver 522 is generated and output from the terminal Ldr.

The amplifier circuit 550 includes the transistors M1 and M2. The voltage VHV, which is a DC voltage of, for example, 42 V, is supplied to the drain of the transistor M1. The gate of the transistor M1 is electrically coupled to one end of a resistor R1, and the other end of the resistor R1 is electrically coupled to the terminal Hdr of the integrated circuit 500. In other words, the gate signal Hgd output from the terminal Hdr of the integrated circuit 500 is supplied to the gate of the transistor M1. The source of the transistor M1 is electrically coupled to the terminal Sw of the integrated circuit 500.

The drain of the transistor M2 is electrically coupled to the terminal Sw of the integrated circuit 500. In other words, the drain of the transistor M2 and the source of the transistor M1 are electrically coupled to each other. The gate of the transistor M2 is electrically coupled to one end of a resistor R2, and the other end of the resistor R2 is electrically coupled to the terminal Ldr of the integrated circuit 500. In other words, the gate signal Lgd output from the terminal Ldr of the integrated circuit 500 is supplied to the gate of the transistor M2. The ground potential is supplied to the source of the transistor M2.

In the amplifier circuit 550 configured as described above, when the transistor M1 is controlled to be turned off and the transistor M2 is controlled to be turned on, the voltage of the node to which the terminal Sw is coupled becomes the ground potential. Therefore, the voltage Vm is supplied to the terminal Bst. Meanwhile, when the transistor M1 is controlled to be turned on and the transistor M2 is controlled to be turned off, the voltage of the node to which the terminal Sw is coupled becomes the voltage VHV. Therefore, a voltage signal having a potential of a voltage VHV+Vm is supplied to the terminal Bst.

In other words, the gate driver 521 that drives the transistor M1 uses the capacitor C5 as a floating power source, the potential of the terminal Sw changes to 0 V or the voltage VHV according to the operation of the transistor M1 and the transistor M2, and accordingly, the gate driver 521 supplies the gate signal Hgd, of which the L level is a potential of the voltage VHV and the H level is the potential of the voltage VHV+the voltage Vm, to the gate of the transistor M1.

Meanwhile, the gate driver 522 that drives the transistor M2 supplies the gate signal Lgd, of which the L level is the ground potential and the H level is the potential of the voltage Vm, to the gate of the transistor M2, regardless of the operation of the transistor M1 and the transistor M2.

As described above, the amplifier circuit 550 amplifies the modulated signal Ms in which the reference driving signals dA1 and aA are modulated by the transistor M1 and the transistor M2 based on the voltage VHV, generates the amplified modulated signal AMs at a coupling point where the source of the transistor M1 and the drain of the transistor M2 are commonly coupled to each other, and outputs the generated amplified modulated signal AMs to the smoothing circuit 560.

Here, a capacitor Cd is positioned in a propagation path where the input voltage VHV of the amplifier circuit 550 propagates. Specifically, the voltage VHV is supplied to one end of the capacitor Cd, and a ground potential is supplied to the other end. The capacitor Cd reduces the concern that the potential of the voltage VHV fluctuates due to the operation of the amplifier circuit 550. In other words, the capacitor Cd stabilizes the potential of the voltage VHV. Such a capacitor preferably has a large capacity, and for example, an electrolytic capacitor is used.

The smoothing circuit 560 generates the driving signal COMA1 by smoothing the amplified modulated signals AMs output from the amplifier circuit 550, and outputs the generated driving signal COMA1 from the driving circuit 51a.

The smoothing circuit 560 includes the coil L1 and a capacitor C1. The amplified modulated signals AMs output from the amplifier circuit 550 are input to one end of the coil L1, and the other end of the coil L1 is coupled to the terminal Out which is the output of the driving circuit 51a. The other end of the coil L1 is also coupled to one end of the capacitor C1. A ground potential is supplied to the other end of the capacitor C1. In other words, the coil L1 and the capacitor C1 are demodulated by smoothing the amplified modulated signals AMs output from the amplifier circuit 550, and are output as the driving signal COMA1.

The feedback circuit 570 includes a resistor R3 and a resistor R4. One end of the resistor R3 is coupled to the terminal Out that outputs the driving signal COMA1, and the other end is coupled to one end of the terminal Vfb and the resistor R4. The voltage VHV is supplied to the other end of the resistor R4. Accordingly, the driving signal COMA1 that passes through the feedback circuit 570 from the terminal Out is fed back to the terminal Vfb in a pulled-up state.

The feedback circuit 572 includes capacitors C2, C3, and C4 and resistors R5 and R6. One end of the capacitor C2 is coupled to the terminal Out that outputs the driving signal COMA1, and the other end is coupled to one end of the resistor R5 and one end of the resistor R6. A ground potential is supplied to the other end of the resistor R5. Accordingly, the capacitor C2 and the resistor R5 function as a high pass filter. A cutoff frequency of the high pass filter is set to, for example, approximately 9 MHz. The other end of the resistor R6 is coupled to one end of the capacitor C4 and one end of the capacitor C3. The ground potential is supplied to the other end of the capacitor C3. Accordingly, the resistor R6 and the capacitor C3 function as a low pass filter. The cutoff frequency of the low pass filter is set to, for example, approximately 160 MHz. In this manner, the feedback circuit 572 is configured to include the high pass filter and the low pass filter, and accordingly, the feedback circuit 572 functions as a band pass filter that allows the cutoff frequency to pass through a predetermined frequency range of the driving signal COMA1.

The other end of the capacitor C4 is coupled to the terminal Ifb of the integrated circuit 500. Accordingly, a signal, in which the DC component is cut among the high frequency components of the driving signal COMA1 that passes through the feedback circuit 572 that functions as a band pass filter that allows the frequency to pass through a predetermined frequency component, is fed back to the terminal Ifb.

Incidentally, the driving signal COMA1 output from the terminal Out is a signal obtained by smoothing the amplified modulated signal AMs based on the reference driving signal dA1 by the smoothing circuit 560. Then, the driving signal COMA1 is integrated and subtracted via the terminal Vfb, and then fed back to the adder 512. Accordingly, the driving circuit 51a self-excited oscillates at a frequency determined by the feedback delay and the feedback transfer function. However, since the feedback path via the terminal Vfb has a large delay amount, there is a case where the frequency of self-excited oscillation cannot be high enough to ensure the accuracy of the driving signal COMA1 only by the feedback via the terminal Vfb. Therefore, by providing a path for feeding back the high frequency component of the driving signal COMA1 via the terminal Ifb separately from the path via the terminal Vfb, the delay in the entire circuit is reduced. Accordingly, the frequency of the voltage signal As can be made high enough to ensure the accuracy of the driving signal COMA1 compared to a case where the path via the terminal Ifb does not exist.

Here, the oscillation frequency of the self-excited oscillation in the driving circuit 51a in the present embodiment is preferably 1 MHz or greater and 8 MHz or less from the viewpoint of reducing the heat generated in the driving circuit 51a while sufficiently ensuring the accuracy of the driving signal COMA1, and in particular, when reducing the power consumption of the liquid discharge apparatus 1, the oscillation frequency of the self-excited oscillation of the driving circuit 51a is preferably 1 MHz or greater and 4 MHz or less.

In the liquid discharge apparatus 1 of the present embodiment, the driving circuit 51a smoothes the amplified modulated signals AMs to generate the driving signal COMA1 and supplies the generated driving signal COMA1 to the piezoelectric element 60 of the head chip 300 described later. Then, the piezoelectric element 60 is driven by being supplied with the signal waveform included in the driving signal COMA1, and ink having an amount that corresponds to the drive of the piezoelectric element 60 is discharged.

When the frequency spectrum analysis of the signal waveform of the driving signal COMA1 for driving the piezoelectric element 60 is executed, it is known that the driving signal COMA1 contains a frequency component of 50 kHz or greater. When the signal waveform of the driving signal COMA1 containing such a frequency component of 50 kHz or greater is generated with high accuracy, and when the frequency of the modulated signal is lower than 1 MHz, the edge portion of the signal waveform of the driving signal COM1 output from the driving circuit 51a becomes dull, and the dullness occurs. In other words, in order to generate the signal waveform of the driving signal COMA1 with high accuracy, the frequency of the modulated signal Ms needs to be 1 MHz or greater. When the oscillation frequency of the self-excited oscillation of the driving circuit 51a is 1 MHz or less, the waveform accuracy of the driving signal COMA1 is lowered, and thus, the driving accuracy of the piezoelectric element 60 deteriorates, and as a result, there is a concern that the discharge characteristics of the ink discharged from the liquid discharge apparatus 1 deteriorates.

In response to such a problem, as the frequency of the modulated signal Ms, that is, the oscillation frequency of the self-excited oscillation of the driving circuit 51a is set to 1 MHz or greater, the concern that the edge portion of the signal waveform of the driving signal COMA1 becomes dull is reduced. In other words, the waveform accuracy of the signal waveform of the driving signal COMA1 is improved, and the driving accuracy of the piezoelectric element 60 driven based on the driving signal COMA1 is improved. Accordingly, the concern that the discharge characteristics of the ink discharged from the liquid discharge apparatus 1 deteriorates, is reduced.

However, when the frequency of the modulated signal Ms, that is, the oscillation frequency of the self-excited oscillation of the driving circuit 51a is increased, the switching frequency of the transistors M1 and M2 increases, and the switching loss in the transistors M1 and M2 increases. The switching loss in such transistors M1 and M2 increases the power consumption in the driving circuit 51a and also increases the amount of heat generated in the driving circuit 51a. In other words, when the oscillation frequency of the self-excited oscillation of the driving circuit 51a is set to be extremely high, the switching loss in the transistors M1 and M2 increases, and there is a concern that power saving property, which is one of the advantages of class D amplifiers over linear amplification of class AB amplifiers or the like, and heat saving property are impaired. From the viewpoint of reducing the switching loss of the transistors M1 and M2, the frequency of the modulated signal Ms, that is, the oscillation frequency of the self-excited oscillation of the driving circuit 51a, is preferably 8 MHz or less, and in particular, when it is required to improve the power saving property of the liquid discharge apparatus 1, the frequency is preferably 4 MHz or less.

From the above, from the viewpoint of achieving both improvement in the accuracy of the signal waveform of the output driving signal COMA1 and power saving in the driving circuit 51a using the class D amplifier, the oscillation frequency of the self-excited oscillation of the driving circuit 51a is preferably 1 MHz or greater and 8 MHz or less, and in particular, when the power consumption of the liquid discharge apparatus 1 is reduced, the oscillation frequency of the self-excited oscillation of the driving circuit 51a is preferably 1 MHz or greater and 4 MHz or less. Here, the oscillation frequency of the self-excited oscillation of the driving circuit 51a includes not only the frequency of the modulated signal Ms but also the frequency at which the transistors M1 and M2 of the amplifier circuit 550 operate for switching. In other words, the oscillation frequency of the self-excited oscillation of the driving circuit 51a includes at least one of the frequency of the modulated signal Ms, the frequency of the gate signals Hgd and Lgd, and the frequency of the amplified modulated signal AMs.

Here, as described above, in FIG. 2, among the driving circuits 51a, 51b, 52a, and 52b included in the driving signal output circuit 50, the driving circuit 51a that outputs the driving signal COMA1 has been illustrated and described. However, the driving circuit 51b that outputs driving signal COMB1, the driving circuit 52a that outputs driving signal COMA2, and the driving circuit 52b that outputs driving signal COMB2 also include the same configuration, and the same operation is executed.

In other words, the driving circuit 51b includes the integrated circuit 500 including a modulation circuit 510, the amplifier circuit 550, the smoothing circuit 560, the feedback circuits 570 and 572, and the plurality of other circuit elements. The integrated circuit 500 outputs the gate signal Hgd and the gate signal Lgd based on the reference driving signal dB1 which is the reference of the driving signal COMB1. The amplifier circuit 550 includes the transistor M1 driven by the gate signal Hgd and the transistor M2 driven by the gate signal Lgd, and generates and outputs the amplified modulated signal AMs to the smoothing circuit 560. The smoothing circuit 560 includes the coil L1, smoothes the amplified modulated signal AMs which is the output from the amplifier circuit 550, and outputs the smoothed amplified modulated signal AMs as the driving signal COMB1. In this case, in the driving circuit 51b, from the viewpoint of achieving both improvement in the accuracy of the signal waveform of the output driving signal COMB1 and power saving, the oscillation frequency of the self-excited oscillation of the driving circuit 51b is preferably 1 MHz or greater and 8 MHz or less, and in particular, when the power consumption of the liquid discharge apparatus 1 is reduced, the oscillation frequency of the self-excited oscillation of the driving circuit 51b is preferably 1 MHz or greater and 4 MHz or less.

Similarly, the driving circuit 52a includes the integrated circuit 500 including the modulation circuit 510, the amplifier circuit 550, the smoothing circuit 560, the feedback circuits 570 and 572, and the plurality of other circuit elements. The integrated circuit 500 outputs the gate signal Hgd and the gate signal Lgd based on the reference driving signal dA2 which is the reference of the driving signal COMA2. The amplifier circuit 550 includes the transistor M1 driven by the gate signal Hgd and the transistor M2 driven by the gate signal Lgd, and generates and outputs the amplified modulated signal AMs to the smoothing circuit 560. The smoothing circuit 560 includes the coil L1, smoothes the amplified modulated signal AMs which is the output from the amplifier circuit 550, and outputs the smoothed amplified modulated signal AMs as the driving signal COMA2. In this case, in the driving circuit 52a, from the viewpoint of achieving both improvement in the accuracy of the signal waveform of the output driving signal COMA2 and power saving, the oscillation frequency of the self-excited oscillation of the driving circuit 52a is preferably 1 MHz or greater and 8 MHz or less, and in particular, when the power consumption of the liquid discharge apparatus 1 is reduced, the oscillation frequency of the self-excited oscillation of the driving circuit 52a is preferably 1 MHz or greater and 4 MHz or less.

Similarly, the driving circuit 52b includes the integrated circuit 500 including the modulation circuit 510, the amplifier circuit 550, the smoothing circuit 560, the feedback circuits 570 and 572, and the plurality of other circuit elements. The integrated circuit 500 outputs the gate signal Hgd and the gate signal Lgd based on the reference driving signal dB2 which is the reference of the driving signal COMB2. The amplifier circuit 550 includes the transistor M1 driven by the gate signal Hgd and the transistor M2 driven by the gate signal Lgd, and generates and outputs the amplified modulated signal AMs to the smoothing circuit 560. The smoothing circuit 560 includes the coil L1, smoothes the amplified modulated signal AMs which is the output from the amplifier circuit 550, and outputs the smoothed amplified modulated signal AMs as the driving signal COMB2. In addition, in the driving circuit 52b, from the viewpoint of achieving both improvement in the accuracy of the signal waveform of the output driving signal COMB2 and power saving, the oscillation frequency of the self-excited oscillation of the driving circuit 52b is preferably 1 MHz or greater and 8 MHz or less, and in particular, when the power consumption of the liquid discharge apparatus 1 is reduced, the oscillation frequency of the self-excited oscillation of the driving circuit 52b is preferably 1 MHz or greater and 4 MHz or less.

3. Configuration and Operation of Driving Signal Selection Circuit

Next, the configuration and operation of the driving signal selection circuit 200 included in the discharge head 100 will be described. In the following description, it is described that the print data signal SI which is a generic term for the print data signals SIa1 to SIan, SIb1 to SIbn, SIc1 to SIcn, SId1 to SIdn, SIe1 to SIen, and SIf1 to SIfn, the clock signal SCK which is a generic term for the clock signals SCK1 to SCK3, the latch signal LAT, the change signal CH, the driving signal COMA which is a generic term for the driving signals COMA1 and COMA2, and the driving signal COMB which is a generic term for the driving signals COMB1 and COMB2 are input to the driving signal selection circuit 200.

In describing the configuration and operation of the driving signal selection circuit 200, first, an example of the signal waveforms of the driving signals COMA and COMB input to the driving signal selection circuit 200, and an example of the signal waveform of the driving signal VOUT output from the driving signal selection circuit 200 are described.

Figure 3:
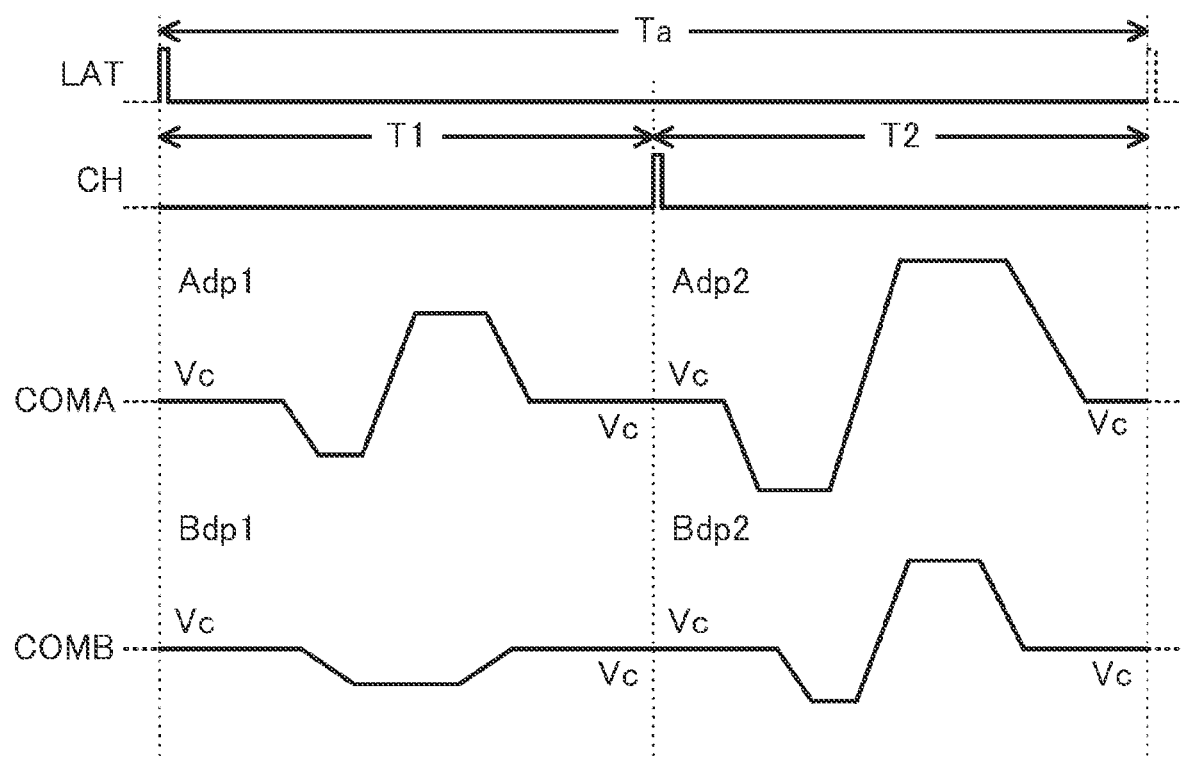
FIG. 3 is a view illustrating an example of signal waveforms of driving signals.

FIG. 3 is a view illustrating an example of the signal waveforms of the driving signals COMA and COMB. As illustrated in FIG. 3, the driving signal COMA has a signal waveform in which a trapezoidal waveform Adp1 disposed in a period T1 from the rise of the latch signal LAT to the rise of the change signal CH, and a trapezoidal waveform Adp2 disposed in a period T2 from the rise of the change signal CH to the rise of the latch signal LAT are continuous to each other. Then, when the trapezoidal waveform Adp1 is supplied to the head chip 300, a small amount of ink is discharged from the corresponding nozzle of the head chip 300, and when the trapezoidal waveform Adp2 is supplied to the head chip 300, a medium amount of ink, more than a small amount, is discharged from the corresponding nozzle of the head chip 300.

As illustrated in FIG. 3, the driving signal COMB has a signal waveform in which a trapezoidal waveform Bdp1 disposed in the period T1 and a trapezoidal waveform Bdp2 disposed in the period T2 are continuous to each other. When the trapezoidal waveform Bdp1 is supplied to the head chip 300, the ink is not discharged from the corresponding nozzle of the head chip 300. The trapezoidal waveform Bdp1 is a waveform for slightly vibrating the ink near the opening portion of the nozzle to prevent an increase in ink viscosity. When the trapezoidal waveform Bdp2 is supplied to the head chip 300, a small amount of ink is discharged from the corresponding nozzle of the head chip 300 similar to a case where the trapezoidal waveform Adp1 is supplied.

Here, as illustrated in FIG. 3, the voltage values at the start timing and end timing of each of the trapezoidal waveforms Adp1, Adp2, Bdp1, and Bdp2 are all common to a voltage Vc. In other words, each of the trapezoidal waveforms Adp1, Adp2, Bdp1, and Bdp2 has a waveform that starts at the voltage Vc and ends at the voltage Vc. Then, a cycle Ta including a period T1 and a period T2 corresponds to a printing cycle for forming new dots on the medium.

Although FIG. 3 illustrates a case where the trapezoidal waveform Adp1 and the trapezoidal waveform Bdp2 have the same waveform, the trapezoidal waveform Adp1 and the trapezoidal waveform Bdp2 may have different waveforms. It is described that a small amount of ink is discharged from the corresponding nozzles both when the trapezoidal waveform Adp1 is supplied to the head chip 300 and when the trapezoidal waveform Bdp1 is supplied to the head chip 300, but the present disclosure is not limited thereto. In other words, the signal waveforms of the driving signals COMA and COMB are not limited to the waveforms illustrated in FIG. 3, and signals of various waveform combinations depending on the nature of the ink discharged from the nozzle of the head chip 300, the material of the medium on which the ink lands, and the like may be used. The signal waveform of the driving signal COMA1 output by the driving circuit 51*a* and the signal waveform of the driving signal COMA2 output by the driving circuit 52*a* may be different from each other, and similarly, the signal waveform of the driving signal COMB1 output by the driving circuit 51*b* and the signal waveform of the driving signal COMB2 output by the driving circuit 52*b* may be different from each other.

Figure 4:
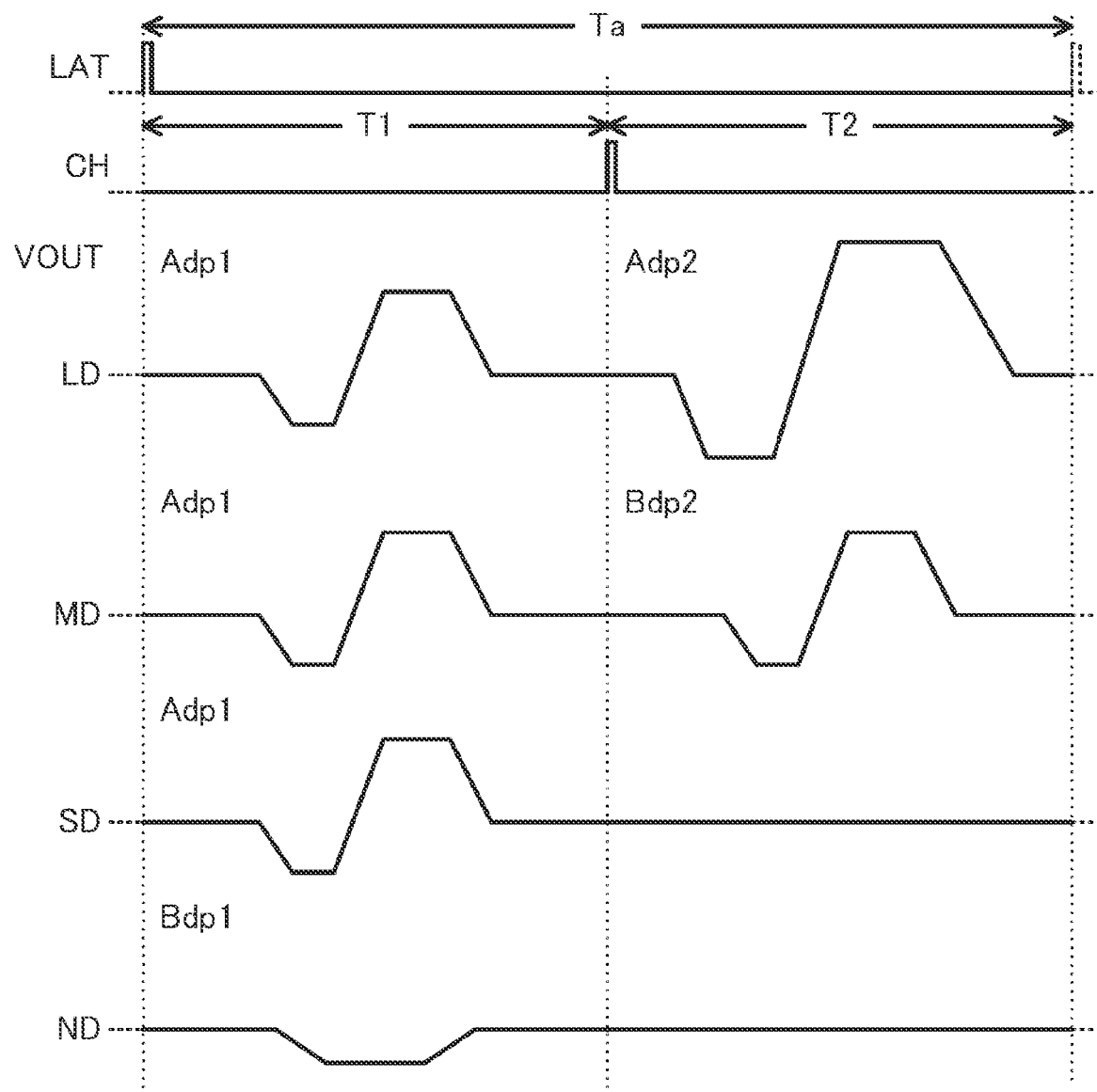
FIG. 4 is a view illustrating an example of a waveform of a driving signal.

FIG. 4 is a view illustrating an example of the waveform of the driving signal VOUT when the size of the dots formed on the medium is any of a large dot LD, a medium dot MD, a small dot SD, and non-recording ND.

As illustrated in FIG. 4, the driving signal VOUT when the large dot LD is formed on the medium is a signal waveform in which the trapezoidal waveform Adp1 disposed in the period T1 and the trapezoidal waveform Adp2 disposed in the period T2 in the cycle Ta are continuous to each other. When the driving signal VOUT is supplied to the head chip 300, a small amount of ink and a medium amount of ink are discharged from the corresponding nozzles. Therefore, in the cycle Ta, each ink lands on the medium and coalesces to form the large dot LD on the medium.

The driving signal VOUT when the medium dot MD is formed on the medium is a signal waveform in which the trapezoidal waveform Adp1 disposed in the period T1 and the trapezoidal waveform Bdp2 disposed in the period T2 are continuous to each other in the cycle Ta. When the driving signal VOUT is supplied to the head chip 300, a small amount of ink is discharged two times from the corresponding nozzle. Therefore, in the cycle Ta, each ink lands on the medium and coalesces to form the medium dot MD on the medium.

The driving signal VOUT when the small dot SD is formed on the medium is a signal waveform in which the trapezoidal waveform Adp1 disposed in the period T1 and a constant waveform disposed in the period T2 at the voltage Vc are continuous to each other in the cycle Ta. When the driving signal VOUT is supplied to the head chip 300, a small amount of ink is discharged one time from the corresponding nozzle. Therefore, in the cycle Ta, the ink lands on the medium to form the small dot SD on the medium.

The driving signal VOUT that corresponds to the non-recording ND that does not form dots on the medium is a signal waveform in which the trapezoidal waveform Bdp1 disposed in the period T1 and a constant waveform disposed in the period T2 at the voltage Vc are continuous to each other in the cycle Ta. When the driving signal VOUT is supplied to the head chip 300, only by the slight vibration of the ink near the opening portion of the corresponding nozzle, and the ink is not discharged. Therefore, in the cycle Ta, the ink does not land on the medium and dots are not formed on the medium.

Here, the constant waveform at the voltage Vc in the driving signal VOUT is a waveform of the voltage value that holds the voltage Vc immediately before the trapezoidal waveforms Adp1, Adp2, Bdp1, and Bdp2 when none of the trapezoidal waveforms Adp1, Adp2, Bdp1, and Bdp2 is selected as the driving signal VOUT. In other words, when none of the trapezoidal waveforms Adp1, Adp2, Bdp1, and Bdp2 is selected as the driving signal VOUT, the immediately preceding voltage Vc is supplied to the head chip 300 as the driving signal VOUT.

Figure 5:
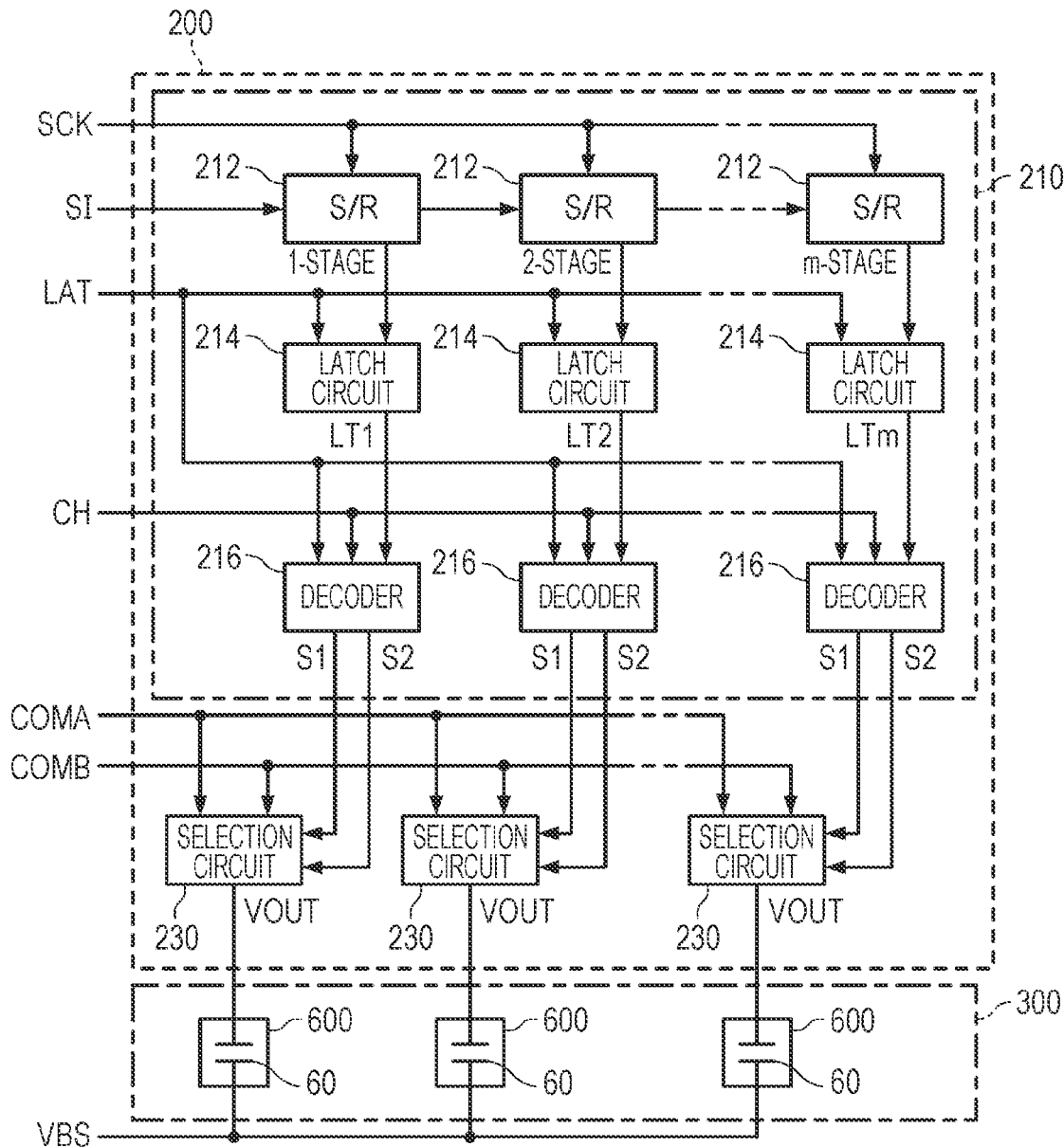
FIG. 5 is a view illustrating a configuration of a driving signal selection circuit.

The driving signal selection circuit 200 generates the driving signal VOUT by selecting or deselecting the waveforms included in the driving signals COMA and COMB, and outputs the generated driving signal VOUT to the head chip 300. FIG. 5 is a view illustrating the configuration of the driving signal selection circuit 200. As illustrated in FIG. 5, the driving signal selection circuit 200 includes a selection control circuit 210 and a plurality of selection circuits 230. FIG. 5 illustrates an example of the head chip 300 to which the driving signal VOUT output from the driving signal selection circuit 200 is supplied. As illustrated in FIG. 5, the head chip 300 includes m discharge sections 600 each having the piezoelectric element 60.

The print data signal SI, the latch signal LAT, the change signal CH, and the clock signal SCK are input to the selection control circuit 210. In the selection control circuit 210, sets of a shift register (S/R) 212, a latch circuit 214, and a decoder 216 are provided corresponding to each of the m discharge sections 600 of the head chip 300. In other words, the driving signal selection circuit 200 includes the same number of sets of the shift register 212, the latch circuit 214, and the decoder 216 as that of the m discharge sections 600 included in the head chip 300.

The print data signal SI is a signal synchronized with the clock signal SCK, and is a signal of a total of 2m bits including 2-bit print data [SIH, SIL] for selecting any one of the large dot LD, the medium dot MD, the small dot SD, and the non-recording ND with respect to each of the m discharge sections 600. The input print data signal SI is held in the shift register 212 for each of the two bits of print data [SIH, SIL] included in the print data signal SI, corresponding to the m discharge sections 600.

Specifically, in the selection control circuit 210, the m-stage shift registers 212 that correspond to the m discharge sections 600 are vertically coupled to each other, and the print data [SIH, SIL] serially input as the print data signal SI is sequentially transferred to the subsequent stage according to the clock signal SCK. In FIG. 5, in order to distinguish the shift registers 212 from each other, the shift register 212 is denoted as 1-stage, 2-stage, . . . , m-stage in order from the upstream to which the print data signal SI is input.

Each of the m latch circuits 214 latches the 2-bit print data [SIH, SIL] held by each of the m shift registers 212 at the rise of the latch signal LAT.

Figures 6, 7:
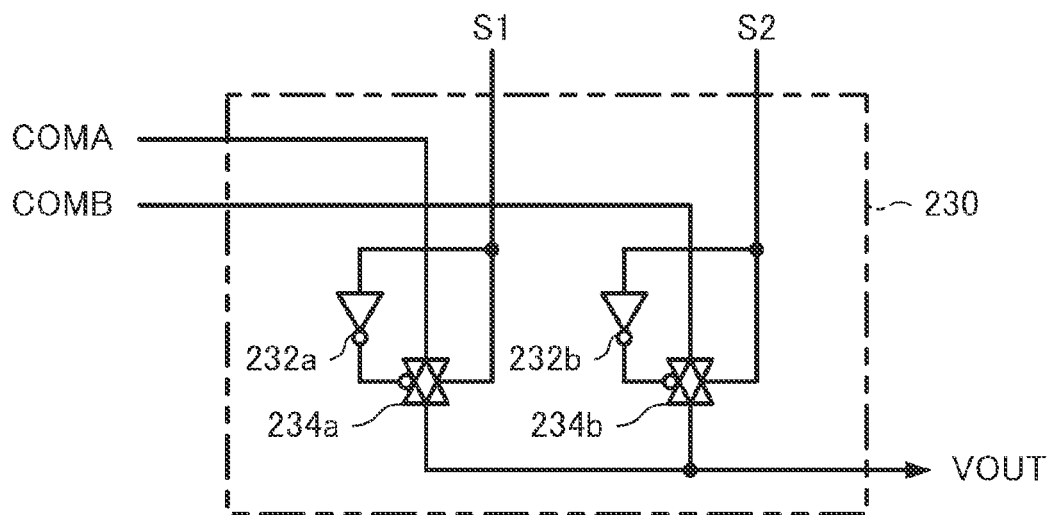
FIG. 6 is a view illustrating decoding contents in a decoder.
FIG. 7 is a view illustrating a configuration of a selection circuit.

FIG. 6 is a view illustrating the decoding contents in the decoder 216. The decoder 216 outputs the selection signals S1 and S2 according to the latched 2-bit print data [SIH, SIL]. For example, when the 2-bit print data [SIH, SIL] is [1, 0], the decoder 216 outputs the logic level of the selection signal S1 as the H and L levels in the periods T1 and T2, and outputs the logic level of the selection signal S2 to the selection circuit 230 as the L and H levels in the periods T1 and T2.

The selection circuit 230 is provided corresponding to each of the discharge sections 600. In other words, the number of selection circuits 230 of the driving signal selection circuit 200 is m, which is the same as the number of the discharge sections 600. FIG. 7 is a view illustrating a configuration of the selection circuit 230 that corresponds to one discharge section 600. As illustrated in FIG. 7, the selection circuit 230 has inverters 232a and 232b, which are NOT circuits, and transfer gates 234a and 234b.

While the selection signal S1 is input to a positive control end, which is not marked with a circle, at the transfer gate 234a, the selection signal S1 is logically inverted by the inverter 232a and is input to a negative control end marked with a circle at the transfer gate 234a. The driving signal COMA is supplied to the input end of the transfer gate 234a. While the selection signal S2 is input to a positive control end, which is not marked with a circle at the transfer gate 234b, the selection signal S2 is logically inverted by the inverter 232b and is input to a negative control end marked with a circle at the transfer gate 234b. The driving signal COMB is supplied to the input end of the transfer gate 234b. Then, the output ends of the transfer gates 234a and 234b are commonly coupled to each other, and the signal is output as the driving signal VOUT.

Specifically, the transfer gate 234a conducts the input end and the output end to each other when the selection signal S1 is the H level, and does not conduct the input end and the output end to each other when the selection signal S1 is the L level. The transfer gate 234b conducts the input end and the output end to each other when the selection signal S2 is the H level, and does not conduct the input end and the output end to each other when the selection signal S2 is the L level. As described above, the selection circuit 230 selects the waveforms of the driving signals COMA and COMB based on the selection signals S1 and S2, and outputs the driving signal VOUT.

Figure 8:
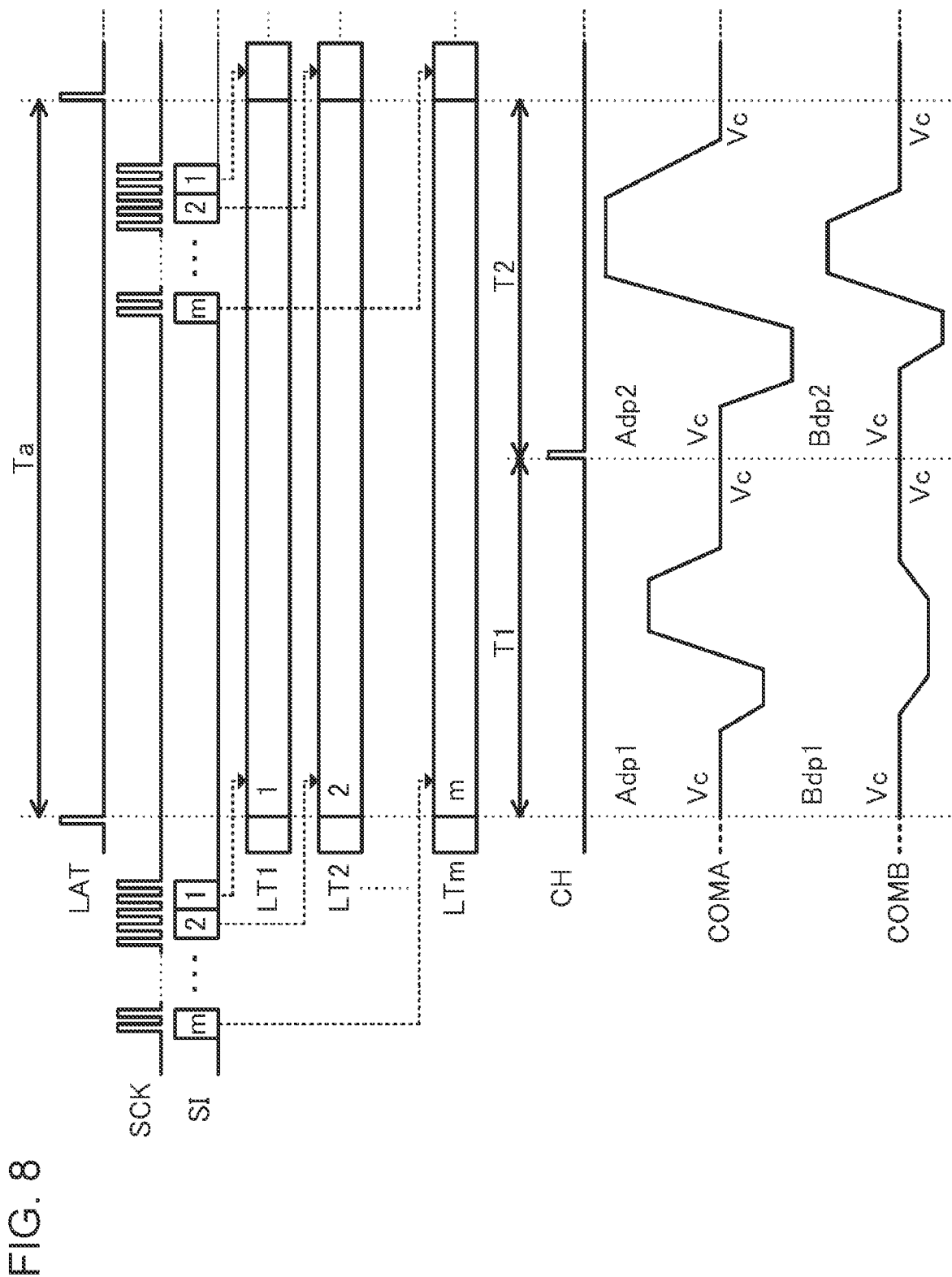
FIG. 8 is a view for describing an operation of the driving signal selection circuit.

The operation of the driving signal selection circuit 200 will be described with reference to FIG. 8. FIG. 8 is a view for describing the operation of the driving signal selection circuit 200. The print data [SIH, SIL] included in the print data signal SI are serially input in synchronization with the clock signal SCK and sequentially transferred in the shift register 212 that corresponds to the discharge section 600. Then, when the input of the clock signal SCK is stopped, the 2-bit print data [SIH, SIL] that corresponds to each of the m discharge sections 600 is held in each of the shift registers 212. The print data [SIH, SIL] included in the print data signal SI is input in order that corresponds to the m-stage, . . . , 2-stage, and 1-stage discharge sections 600 of the shift register 212.

When the latch signal LAT rises, each of the latch circuits 214 latches the 2-bit print data [SIH, SIL] held in the shift register 212 all at once. In FIG. 8, LT1, LT2, . . . , and LTm indicate the 2-bit print data [SIH, SIL] latched by the latch circuit 214 that corresponds to the 1-stage, 2-stage, . . . , and m-stage shift registers 212.

The decoder 216 outputs the logic levels of the selection signals S1 and S2 in each of the periods T1 and T2 with the contents illustrated in FIG. 6, in accordance with the size of the dot defined by the latched 2-bit print data [SIH, SIL].

Specifically, when the input print data [SIH, SIL] is [1, 1], the decoder 216 sets the selection signal S1 to the H and H levels in the periods T1 and T2, and sets the selection signal S2 to the L and L levels in the periods T1 and T2. In this case, the selection circuit 230 selects the trapezoidal waveform Adp1 in the period T1 and selects the trapezoidal waveform Adp2 in the period T2. As a result, the driving signal VOUT that corresponds to the large dot LD illustrated in FIG. 4 is generated.

When the input print data [SIH, SIL] is [1, 0], the decoder 216 sets the selection signal S1 to the H and L levels in the periods T1 and T2, and sets the selection signal S2 to the L and H levels in the periods T1 and T2. In this case, the selection circuit 230 selects the trapezoidal waveform Adp1 in the period T1 and selects the trapezoidal waveform Bdp2 in the period T2. As a result, the driving signal VOUT that corresponds to the medium dot MD illustrated in FIG. 3 is generated.

When the input print data [SIH, SIL] is [0, 1], the decoder 216 sets the selection signal S1 to the H and L levels in the periods T1 and T2, and sets the selection signal S2 to the L and L levels in the periods T1 and T2. In this case, the selection circuit 230 selects the trapezoidal waveform Adp1 in the period T1 and selects none of the trapezoidal waveforms Adp2 and Bdp2 in the period T2. As a result, the driving signal VOUT that corresponds to the small dot SD illustrated in FIG. 4 is generated.

When the input print data [SIH, SIL] is [0, 0], the decoder 216 sets the selection signal S1 to the L and L levels in the periods T1 and T2, and sets the selection signal S2 to the H and L levels in the periods T1 and T2. In this case, the selection circuit 230 selects the trapezoidal waveform Bdp1 in the period T1 and selects none of the trapezoidal waveforms Adp2 and Bdp2 in the period T2. As a result, the driving signal VOUT that corresponds to the non-recording ND illustrated in FIG. 4 is generated.

As described above, the driving signal selection circuit 200 selects the waveforms of the driving signals COMA and COMB based on the print data signal SI, the latch signal LAT, the change signal CH, and the clock signal SCK, and outputs the selected waveforms as the driving signal VOUT. Then, the driving signal selection circuit 200 selects or deselects the waveforms of the driving signals COMA and COMB, and accordingly, the size of the dots formed on the medium is controlled, and as a result, the liquid discharge apparatus 1 forms dots having a desired size on the medium.

4. Structure of Liquid Discharge Apparatus

Figure 9:
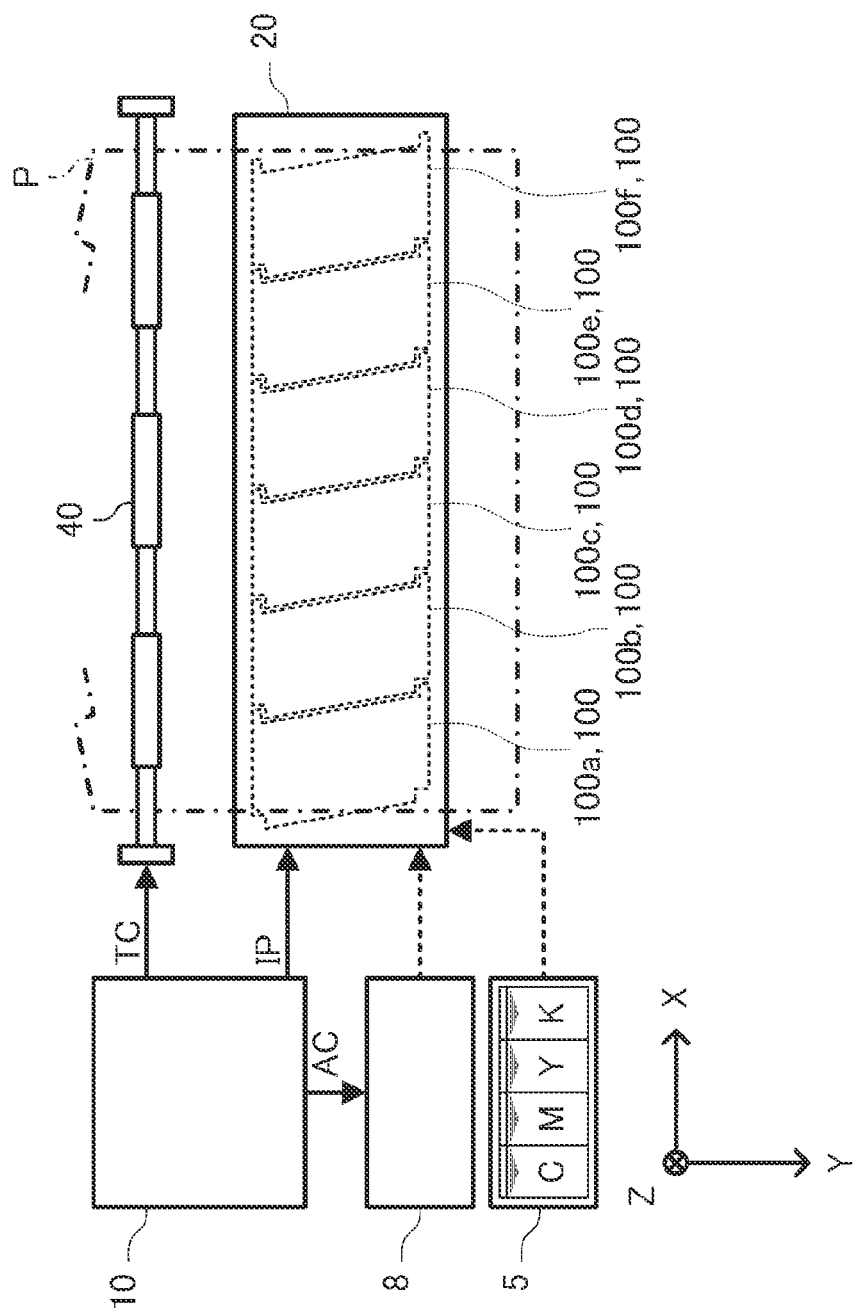
FIG. 9 is an explanatory view illustrating a schematic structure of the liquid discharge apparatus.

Next, the schematic structure of the liquid discharge apparatus 1 will be described. FIG. 9 is an explanatory view illustrating the schematic structure of the liquid discharge apparatus 1. FIG. 9 illustrates arrows indicating the X, Y, and Z directions that are orthogonal to each other. Here, the Y direction corresponds to the direction in which the medium P is transported, the X direction is a direction orthogonal to the Y direction and parallel to the horizontal plane and corresponds to the main scanning direction, and the Z direction is the up-down direction of the liquid discharge apparatus 1 and corresponds to the vertical direction. In the following description, when specifying the directions along the X direction, the Y direction, and the Z direction, there is a case where the distal end side of the arrow indicating the X direction is referred to as the +X side and the starting point side is referred to as the −X side, the distal end side of the arrow indicating the Y direction is referred to as the +Y side and the starting point side is referred to as the −Y side, and the distal end side of the arrow indicating the Z direction illustrated in the drawing is referred to as the +Z side and the starting point side is referred to as the −Z side.

As illustrated in FIG. 9, the liquid discharge apparatus 1 includes a liquid container 5, a pump 8, and a transport mechanism 40, in addition to the control unit 10 and the head unit 20 described above.

The control unit 10 includes the main control circuit 11 and the power source voltage output circuit 12 as described above, and controls the operation of the liquid discharge apparatus 1 including the head unit 20. The control unit 10 may include a storage circuit for storing various information, an interface circuit for communicating with a host computer provided outside the liquid discharge apparatus 1, and the like, in addition to the main control circuit 11 and the power source voltage output circuit 12.

The control unit 10 receives an image signal input from the host computer or the like provided outside the liquid discharge apparatus 1, performs predetermined image processing on the received image signal, and then outputs the signal to which the image processing is performed to the head unit 20 as the image information signal IP. The control unit 10 outputs the transport control signal TC to the transport mechanism 40 that transports the medium P by controlling the transport of the medium P, and outputs the pump control signal AC to the pump 8 to control the operation of the pump 8.

The liquid container 5 stores the ink to be discharged to the medium P. Specifically, the liquid container 5 includes four containers in which inks having four colors of cyan C, magenta M, yellow Y, and black K are individually stored. Then, the ink stored in the liquid container 5 is supplied to the head unit 20 via a tube or the like. The number of containers in which the ink contained in the liquid container 5 is stored is not limited to four, and may include containers in which inks having colors other than the cyan C, the magenta M, the yellow Y, and the black K are stored, or may include a plurality of containers of any of the cyan C, the magenta M, the yellow Y, and the black K.

The head unit 20 includes discharge heads 100a to 100f aligned side by side in the X direction. The discharge heads 100a to 100f included in the head unit 20 are aligned side by side in order of the discharge head 100a, the discharge head 100b, the discharge head 100c, the discharge head 100d, the discharge head 100e, and the discharge head 100f from the −X side to the +X side so as to have a width equal to or greater than the width of the medium P along the X direction. Then, the head unit 20 distributes the ink supplied from the liquid container 5 to each of the discharge heads 100a to 100f, and each of the discharge heads 100a to 100f is operated based on the image information signal IP input from the control unit 10 to discharge the ink supplied from the liquid container 5 from each of the discharge heads 100a to 100f toward the medium P. Here, the number of discharge heads 100 included in the head unit 20 is not limited to 6, and may be 5 or less, or 7 or greater.

The transport mechanism 40 transports the medium P along the Y direction based on the transport control signal TC input from the control unit 10. The transport mechanism 40 is configured to include, for example, a roller (not illustrated) for transporting the medium P, a motor for rotating the roller, and the like.

The pump 8 controls whether or not to supply air A to the head unit 20 and the supply amount of the air A to the head unit 20 based on the pump control signal AC input from the control unit 10. The pump 8 is coupled to the head unit 20 via, for example, two tubes. Then, the pump 8 controls the opening and closing of the valve of the head unit 20 by controlling the air A flowing through each tube.

As described above, in the liquid discharge apparatus 1, the control unit 10 generates the image information signal IP based on the image signal input from the host computer or the like, controls the operation of the head unit 20 by the generated image information signal IP, and controls the transport of the medium P in the transport mechanism 40 by the transport control signal TC.

Accordingly, the liquid discharge apparatus 1 can make the ink land at a desired position on the medium P, and thus can form a desired image on the medium P. In other words, the liquid discharge apparatus 1 includes the head unit 20 that discharges the ink to the medium P, and the transport mechanism 40 that transports the medium P on which the ink discharged from the head unit 20 lands. Here, the transport mechanism 40 that transports the medium P is an example of a transport unit.

5. Structure of Head Unit

Figure 10:
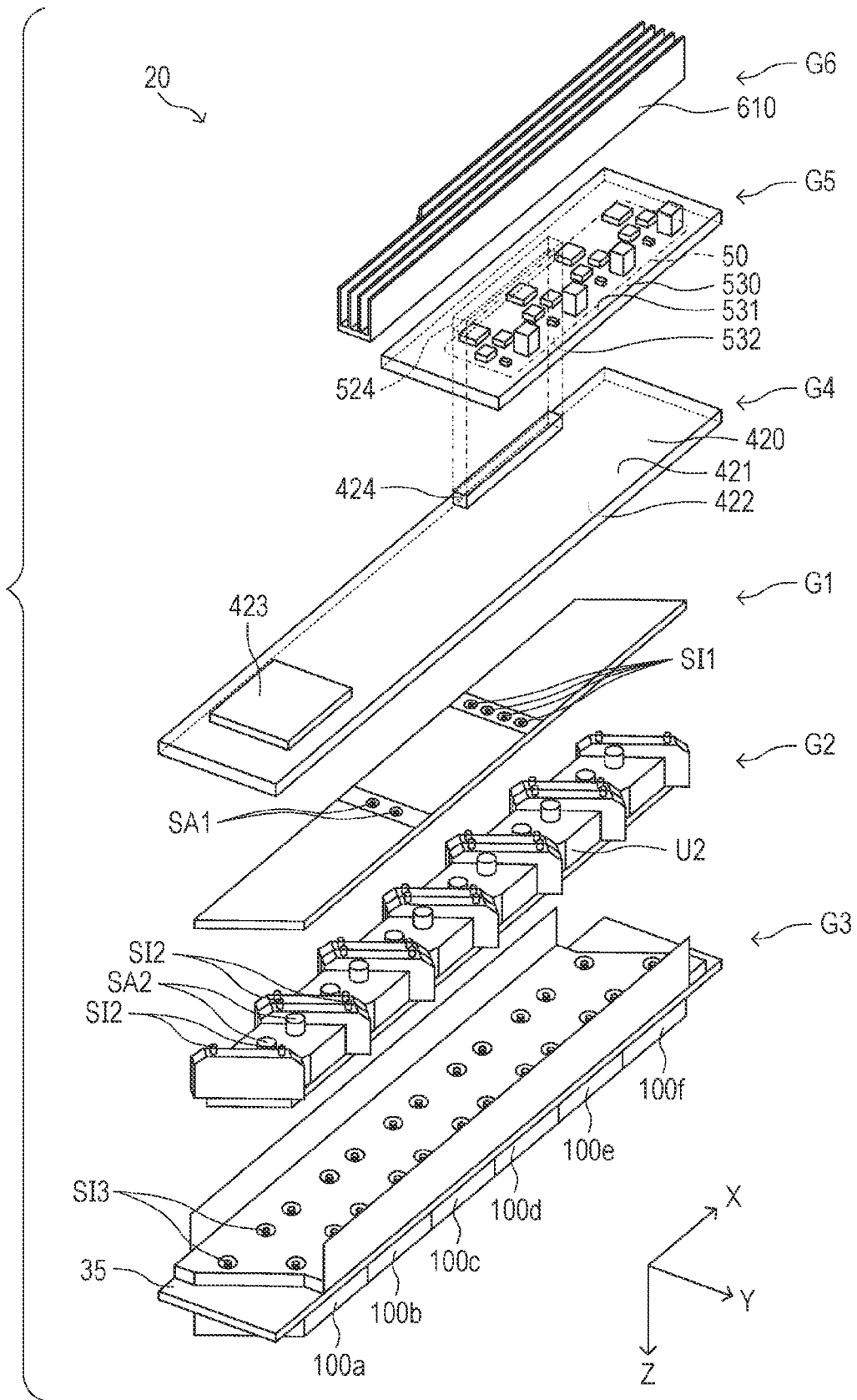
FIG. 10 is an exploded perspective view when a head unit is viewed from a −Z side.

Next, the structure of the head unit 20 will be described. FIG. 10 is an exploded perspective view when the head unit 20 is viewed from the −Z side, and FIG. 11 is an exploded perspective view when the head unit 20 is viewed from the +Z side.

Figure 11:
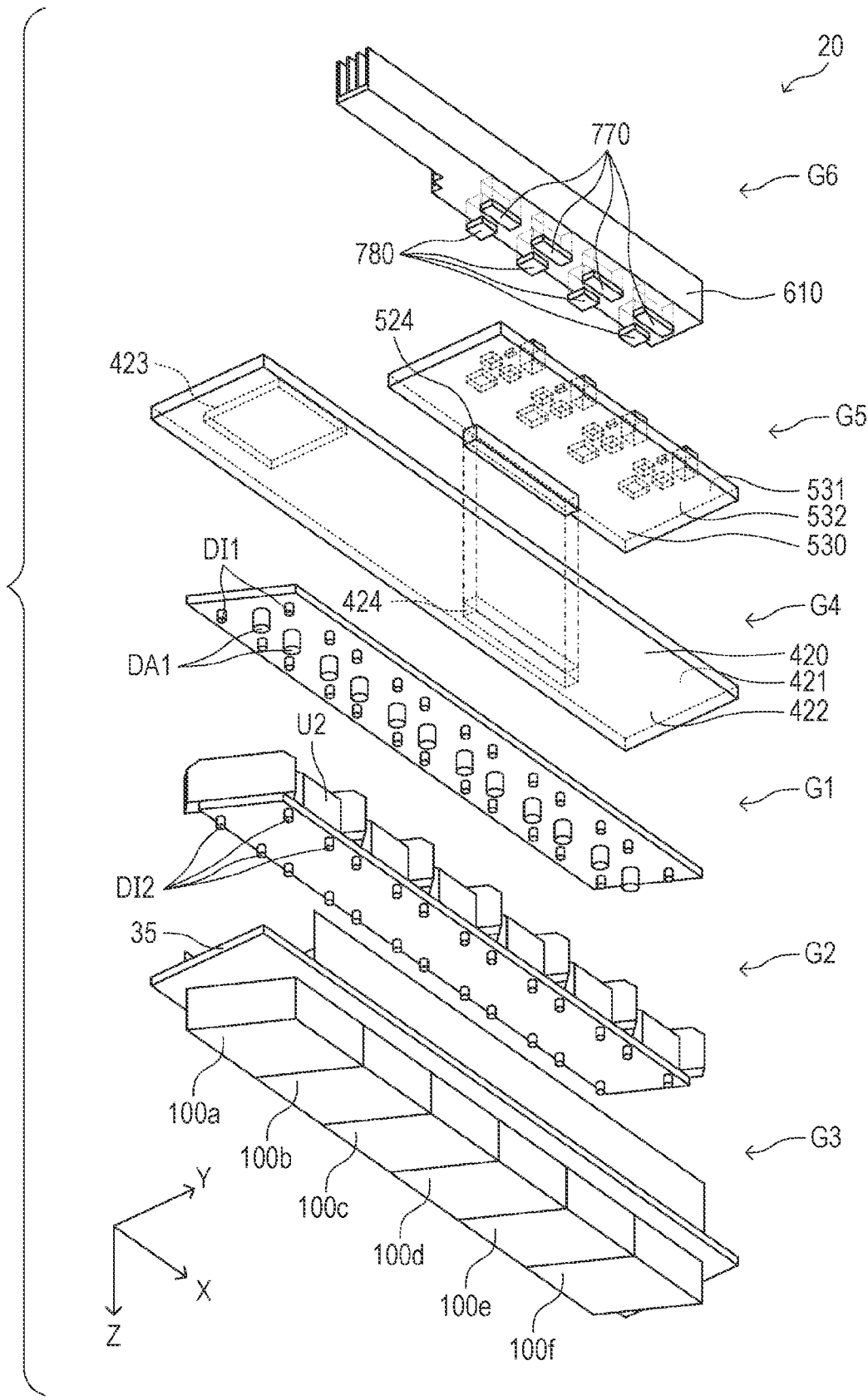
FIG. 11 is an exploded perspective view when the head unit is viewed from a +Z side.

As illustrated in FIGS. 10 and 11, the head unit 20 includes: a flow path structure G1 for introducing ink from the liquid container 5; a supply control section G2 that controls supply of the introduced ink to the discharge head 100; a liquid discharge section G3 having the discharge head 100 for discharging the supplied ink; a discharge control section G4 that controls the discharge of ink from the discharge head 100; a driving signal output section G5 provided with the driving signal output circuit 50; and a heat dissipation section G6 that releases heat generated in the driving signal output circuit 50. Then, in the head unit 20, the flow path structure G1, the supply control section G2, the liquid discharge section G3, the discharge control section G4, the driving signal output section G5, and the heat dissipation section G6 are laminated in order of the heat dissipation section G6, the driving signal output section G5, the discharge control section G4, the flow path structure G1, the supply control section G2, and the liquid discharge section G3 from the −Z side to the +Z side along the Z direction, and fixed to each other by fixing means, such as adhesives or screws (not illustrated).

As illustrated in FIGS. 10 and 11, the flow path structure G1 has a plurality of liquid introduction ports SI1 that correspond to the number of ink colors supplied to the head unit 20, and a plurality of liquid discharge ports DI1 that correspond to the number of the ink colors and the number of the discharge heads 100. Each of the plurality of liquid introduction ports SI1 is positioned on the surface on the −Z side of the flow path structure G1, and is coupled to the liquid container 5 through a tube or the like (not illustrated). Each of the plurality of liquid discharge ports DI1 is positioned on the surface on the +Z side of the flow path structure G1. An ink flow path that makes one liquid introduction port SI1 and the plurality of liquid discharge ports DI1 communicate with each other is formed inside the flow path structure G1.

The flow path structure G1 is provided with a plurality of air introduction ports SA1 and a plurality of air discharge ports DA1. Each of the plurality of air introduction ports SA1 is provided on the surface on the −Z side of the flow path structure G1, and is coupled to the pump 8 through a tube or the like (not illustrated). Each of the plurality of air discharge ports DA1 is provided on the surface on the +Z side of the flow path structure G1. An air flow path that makes one air introduction port SA1 and the plurality of air discharge ports DA1 communicate with each other is formed inside the flow path structure G1.

As illustrated in FIGS. 10 and 11, the supply control section G2 has a plurality of pressure adjusting units U2 that correspond to the number of discharge heads 100 of the head unit 20. Each of the plurality of pressure adjusting units U2 has a plurality of liquid introduction ports SI2 that correspond to the number of ink colors supplied to the head unit 20, a plurality of liquid discharge ports DI2 that correspond to the number of ink colors supplied to the head unit 20, and a plurality of air introduction ports SA2 that correspond to the number of tubes coupled to the pump 8.

Each of the plurality of liquid introduction ports SI2 is positioned on the −Z side of the pressure adjusting unit U2 corresponding to each of the liquid discharge ports DI1 of the flow path structure G1 and is coupled to each of the corresponding liquid discharge ports DI1. Each of the plurality of liquid discharge ports DI2 is positioned on the −Z side of the pressure adjusting unit U2. An ink flow path that communicates with one liquid introduction port SI2 and one liquid discharge port DI2 is formed inside the pressure adjusting unit U2.

Each of the plurality of air introduction ports SA2 is positioned on the −Z side of the pressure adjusting unit U2 corresponding to each of the flow path structure G1 and the air discharge port DA1 and is coupled to each of the corresponding air discharge ports DA1. Inside the pressure adjusting unit U2, a plurality of valves that control the supply of the ink to the discharge head 100, such as a valve that opens and closes the ink flow path or the valve that adjusts the pressure of the ink flowing through the ink flow path, and an air flow path that couples one air introduction port SA2 and one valve to each other, are formed.

The pressure adjusting unit U2 configured as described above controls the operation of the valve provided inside by the air A supplied via the air flow path (not illustrated) that couples the air introduction port SA2 and the valve to each other, and accordingly controls the amount of ink flowing through the ink flow path (not illustrated) that communicates with the liquid introduction port SI2 and the liquid discharge port DI2.

As illustrated in FIGS. 10 and 11, the liquid discharge section G3 has discharge heads 100a to 100f and a support member 35. Each of the discharge heads 100a to 100f is positioned on the +Z side of the support member 35, and is fixed to the support member 35 by fixing means such as an adhesive or a screw (not illustrated).

The support member 35 is formed with opening portions that correspond to a plurality of liquid introduction ports SI3. On the −Z sides of each of the discharge heads 100a to 100f, a plurality of liquid introduction ports SI3 are positioned corresponding to each of the liquid discharge ports DI2 of the supply control section G2. The plurality of liquid introduction ports SI3 are exposed on the −Z side of the liquid discharge section G3 by inserting through the opening portions formed in the support member 35. Then, each of the liquid introduction ports SI3 is coupled to the corresponding liquid discharge port DI2.

Here, the flow in which the ink is supplied from the liquid container 5 to the discharge head 100 will be described. The ink stored in the liquid container 5 is supplied to the liquid introduction port SI1 of the flow path structure G1 via a tube (not illustrated) or the like. The ink supplied to the liquid introduction port SI1 is distributed by an ink flow path (not illustrated) provided inside the flow path structure G1, and then is supplied to the liquid introduction port SI2 of the pressure adjusting unit U2 via the liquid discharge port DI1. The ink supplied to the liquid introduction port SI2 is supplied to the liquid introduction ports SI3 of each of the six discharge heads 100 of the liquid discharge section G3 via the ink flow path provided inside the pressure adjusting unit U2 and the liquid discharge port DI2. In other words, the ink supplied from the liquid container 5 is branched by the flow path structure G1, and then the supply amount is controlled in the supply control section G2, and the ink is supplied to the discharge heads 100a to 100f of the liquid discharge section G3.

Figure 12:
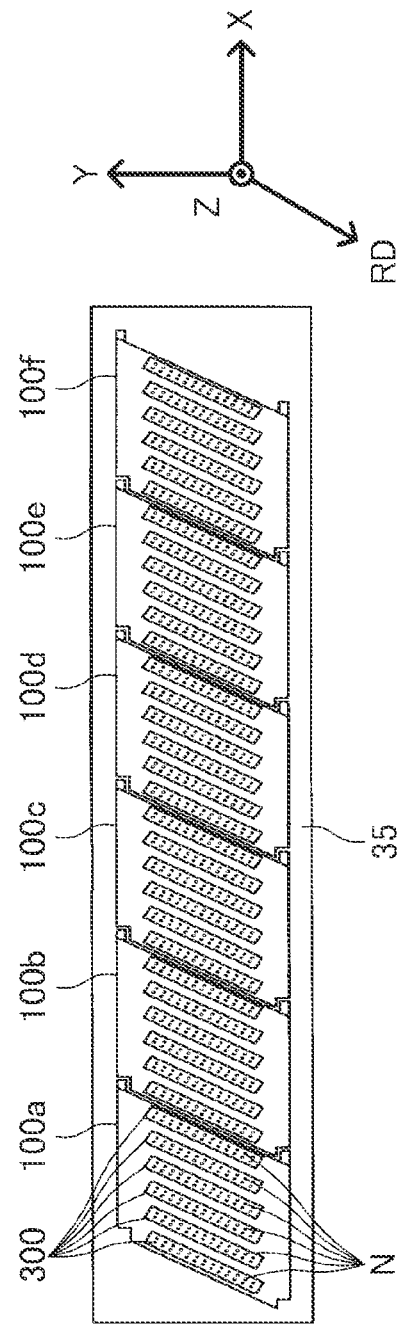
FIG. 12 is a view when the head unit is viewed from the +Z side.

Next, an example of the arrangement of the discharge heads 100a to 100f in the head unit 20 will be described. FIG. 12 is a view when the head unit 20 is viewed from the +Z side. As illustrated in FIG. 12, each of the discharge heads 100a to 100f of the head unit 20 has six head chips 300 aligned side by side along the X direction. Each of the head chips 300 is aligned side by side along a row direction RD in a plane perpendicular to the Z direction and formed by the X direction and the Y direction, and has a plurality of nozzles N for discharging the ink. In the following description, there is a case where the plurality of nozzles N aligned side by side along the row direction RD is referred to as a nozzle row.

Here, the head chip 300 in the present embodiment has two nozzle rows along the row direction RD. The two rows of nozzles N of the discharge head 100 have a group that discharges ink of the cyan C color, a group that discharges ink of the magenta M color, a group that discharges ink of the yellow Y color, and a group that discharges ink of the black K color. In the present embodiment, a case where each of the discharge heads 100a to 100f has six head chips 300 is illustrated, but the number of head chips 300 of the discharge heads 100a to 100f is not limited to six.

Figure 13:
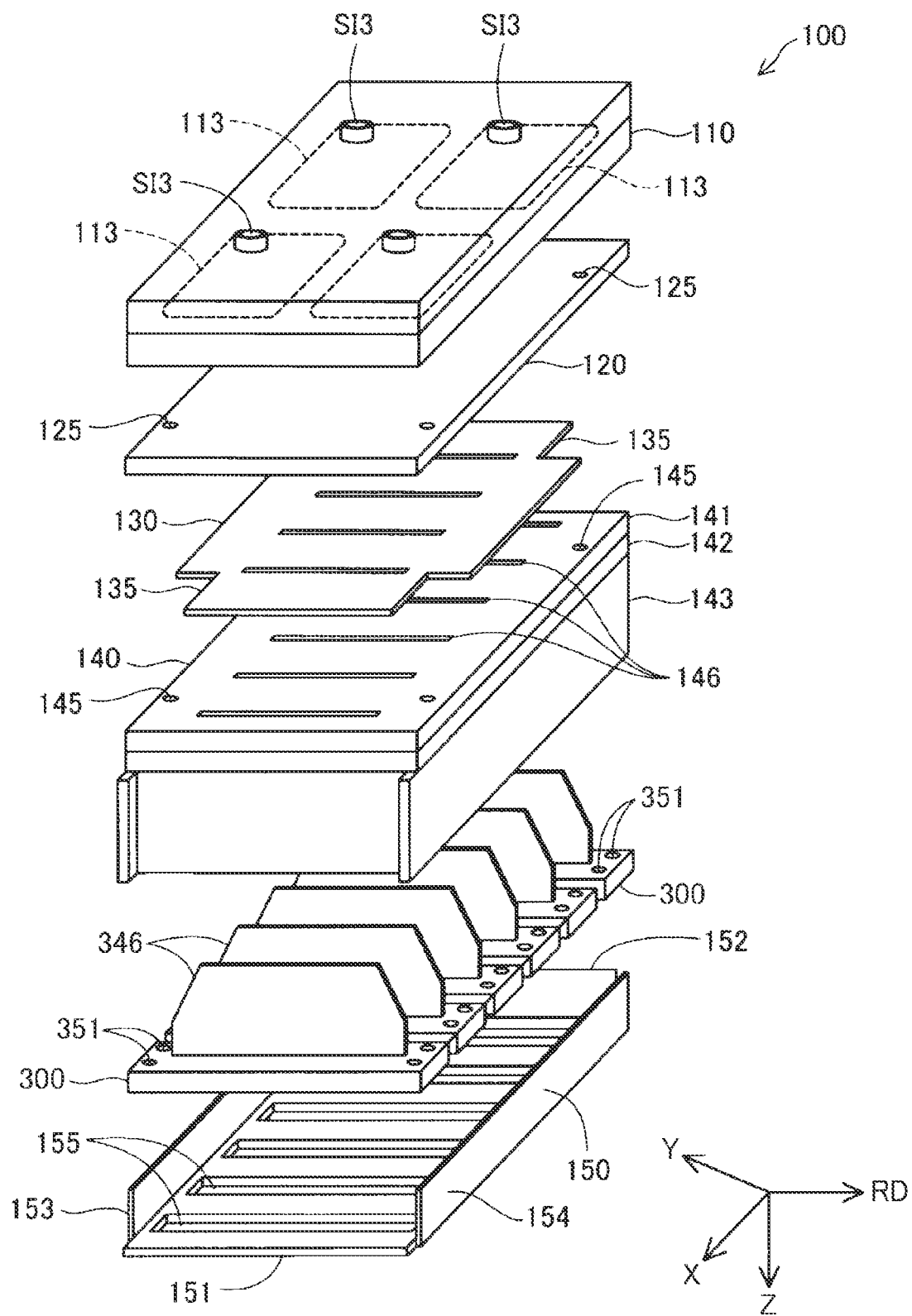
FIG. 13 is an exploded perspective view illustrating a schematic configuration of a discharge head.

Next, the structure of the discharge head 100 will be described. FIG. 13 is an exploded perspective view illustrating a schematic configuration of the discharge head 100. The discharge head 100 includes a filter section 110, a seal member 120, a wiring substrate 130, a holder 140, the six head chips 300, and a fixing plate 150. Then, in the discharge head 100, the filter section 110, the seal member 120, the wiring substrate 130, the holder 140, and the fixing plate 150 are directed from the −Z side to the +Z side along the Z direction, the filter section 110, the seal member 120, the wiring substrate 130, the holder 140, and the fixing plate 150 are stacked in this order, and six head chips 300 are accommodated between the holder 140 and the fixing plate 150.

The filter section 110 has a substantially parallel quadrilateral shape in which two facing sides extend along the X direction and two facing sides extend along the row direction RD. The filter section 110 includes four filters 113 and four liquid introduction ports SI3. The four filters 113 are positioned inside the filter section 110 and are provided corresponding to each of the four liquid introduction ports SI3. The filter 113 collects air bubbles or foreign substances contained in the ink supplied from the liquid introduction port SI3.

The seal member 120 is positioned on the +Z side of the filter section 110, and has a substantially parallel quadrilateral shape in which two facing sides extend along the X direction and two facing sides extend along the row direction RD. The seal member 120 is formed of, for example, an elastic member such as rubber, and through-holes 125 through which ink supplied from the filter section 110 flows are positioned at the four corners of the seal member 120.

The seal member 120 is provided on the surface on +Z side of the filter section 110, and make a liquid discharge hole (not illustrated) that communicates with the liquid introduction port S13 via the filter 113 in the filter section 110, and a liquid introduction port 145 of the holder 140 communicate with each other in a liquid-tight manner.

The wiring substrate 130 is positioned on the +Z side of the seal member 120, and has a substantially parallel quadrilateral shape in which two facing sides extend along the X direction and two facing sides extend along the row direction RD. The wiring substrate 130 is formed with wiring for propagating various signals such as the driving signals COMA and COMB or the voltage VHV supplied to the discharge head 100. At the four corners of the wiring substrate 130, notch sections 135, which are provided so as not to block the ink flow path formed between the through-hole 125 of the seal member 120 and the liquid introduction port 145 of the holder 140, are formed.

The holder 140 is positioned on the +Z side of the wiring substrate 130, and has a substantially parallel quadrilateral shape in which two facing sides extend along the X direction and two facing sides extend along the row direction RD. The holder 140 has holder members 141, 142, and 143. The holder members 141, 142, and 143 are laminated in order of the holder member 141, the holder member 142, and the holder member 143 from the −Z side to the +Z side along the Z direction. The holder member 141 and the holder member 142, and the holder member 142 and the holder member 143 are adhered to each other by an adhesive or the like.

Inside the holder member 143, an opening portion is provided on the +Z side, and an accommodation space (not illustrated) for accommodating the head chip 300 is formed. The accommodation space formed inside the holder member 143 may be an accommodation space individually formed corresponding to each of the six head chips 300, or may be one accommodation space for accommodating the six head chips 300 all together. The holder 140 is provided with slit holes 146 that correspond to each of the six head chips 300. A flexible wiring substrate 346 for propagating various signals such as the driving signals COMA and COMB or the voltage VHV to each of the six head chips 300, is inserted through the slit holes 146. Each of the six head chips 300 accommodated in the accommodation space formed inside the holder member 143 is fixed to the holder member 143 with an adhesive or the like.

Liquid introduction ports 145 are provided at the four corners of the upper surface of the holder 140. As described above, each of the liquid introduction ports 145 is coupled to the liquid discharge holes (not illustrated) that communicate with the liquid introduction ports S13 via the filter 113 in the filter section 110, via the through-holes 125 provided in the seal member 120. Accordingly, the ink supplied from the liquid introduction port S13 is supplied to the holder 140 from the liquid introduction port 145. The ink introduced from each of the liquid introduction ports 145 is distributed to the six head chips 300 via an ink flow path (not illustrated) provided inside the holder 140, and accordingly, the ink is supplied to each of the six head chips 300.

The fixing plate 150 is positioned on the +Z side of the holder 140 and seals the accommodation space formed inside the holder member 143. The fixing plate 150 has a flat surface portion 151 and bent portions 152, 153, and 154. The flat surface portion 151 has a substantially parallel quadrilateral shape in which two facing sides extend along the X direction and two facing sides extend along the row direction RD. The flat surface portion 151 has six opening portions 155 for exposing the head chip 300. Then, the head chip 300 is fixed to the flat surface portion 151 such that two nozzle rows are exposed via the opening portion 155.

The bent portion 152 is a member coupled to one side extending along the X direction of the flat surface portion 151 and integrated with the flat surface portion 151 bent to the −Z side, the bent portion 153 is a member coupled to one side extending along the row direction RD of the flat surface portion 151 and integrated with the flat surface portion 151 bent to the −Z side, and the bent portion 154 is a member coupled to the other side extending along the row direction RD of the flat surface portion 151 and integrated with the flat surface portion 151 bent to the −Z side.

Figure 14:
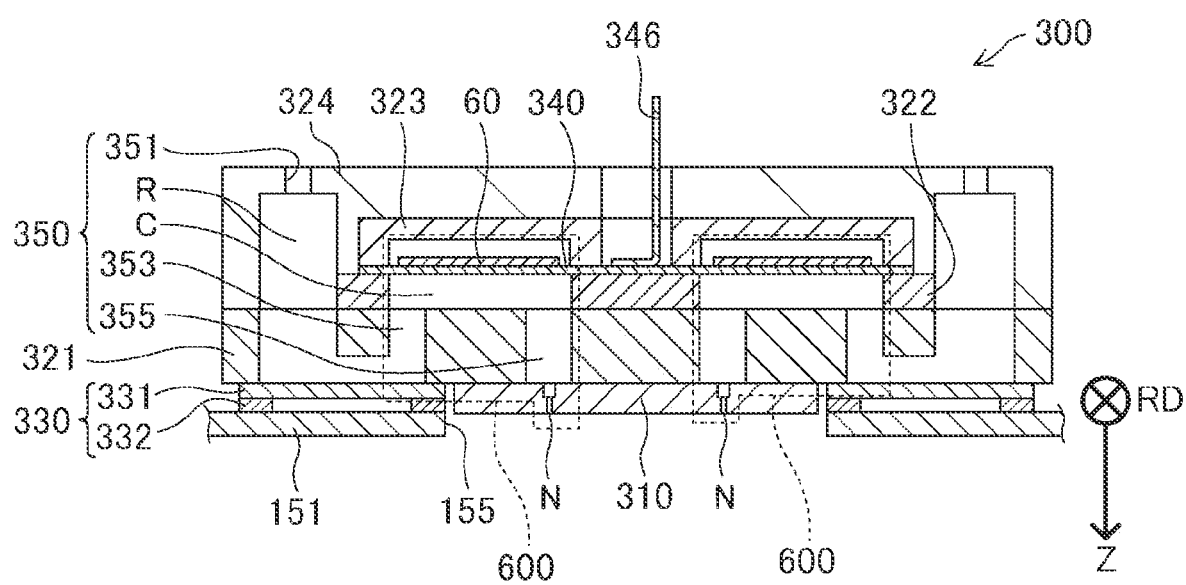
FIG. 14 is a view illustrating a schematic structure of a head chip.

Here, an example of the structure of the head chip 300 will be described. FIG. 14 is a view illustrating a schematic structure of the head chip 300, and is a sectional view when the head chip 300 is cut in a direction perpendicular to the row direction RD so as to include at least one nozzle N. As illustrated in FIG. 14, the head chip 300 includes: a nozzle plate 310 on which the plurality of nozzles N for discharging the ink are provided; a flow path forming substrate 321 that defines a communication flow path 355, an individual flow path 353, and a reservoir R; a pressure chamber substrate 322 that defines a pressure chamber C; a protective substrate 323; a compliance section 330; a vibrating plate 340; the piezoelectric element 60; a flexible wiring substrate 346; and a case 324 that defines the reservoir R and the liquid introduction port 351. Ink is supplied to the head chip 300 from the liquid discharge port (not illustrated) provided in the holder 140 via the liquid introduction port 351. The ink supplied to the head chip 300 reaches the nozzle N via the ink flow path 350 including the reservoir R, the individual flow path 353, the pressure chamber C, and the communication flow path 355, and is discharged as the piezoelectric element 60 is driven. Here, there is a case where the configuration including the piezoelectric element 60, the vibrating plate 340, the nozzle N, the individual flow path 353, the pressure chamber C, and the communication flow path 355 is referred to as the discharge section 600.

Specifically, the ink flow path 350 is configured by laminating the flow path forming substrate 321, the pressure chamber substrate 322, and the case 324 along the Z direction. The ink introduced into the case 324 from the liquid introduction port 351 is stored in the reservoir R. The reservoir R is a common flow path that communicates with the plurality of individual flow paths 353 corresponding to each of the plurality of nozzles N that configure the nozzle row. The ink stored in the reservoir R is supplied to the pressure chamber C via the individual flow path 353.

In the pressure chamber C, by applying pressure to the stored ink, the ink is discharged from the nozzle N via the communication flow path 355. The vibrating plate 340 is positioned on the −Z side of the pressure chamber C so as to seal the pressure chamber C, and the piezoelectric element 60 is positioned on the −Z side of the vibrating plate 340. The piezoelectric element 60 is configured with a piezoelectric body and a pair of electrodes formed on both surfaces of the piezoelectric body. Then, the driving signal VOUT is supplied to one of the pair of electrodes of the piezoelectric element 60 via the flexible wiring substrate 346, the reference voltage signal VBS is supplied to the other one of the pair of electrodes of the piezoelectric element 60 via the flexible wiring substrate 346, and accordingly, the piezoelectric body is displaced by the potential difference generated between the pair of electrodes. In other words, the piezoelectric element 60 including the piezoelectric body is driven. Then, as the piezoelectric element 60 is driven, the vibrating plate 340 provided with the piezoelectric element 60 is deformed, the internal pressure of the pressure chamber C changes due to the deformation of the vibrating plate 340, and accordingly, the ink stored in the pressure chamber C is discharged from the nozzle N via the communication flow path 355.

The nozzle plate 310 and the compliance section 330 are fixed to the +Z side of the flow path forming substrate 321. The nozzle plate 310 is positioned on the +Z side of the communication flow path 355. The plurality of nozzles N are arranged side by side on the nozzle plate 310 along the row direction RD. The compliance section 330 is positioned on the +Z side of the reservoir R and the individual flow path 353, and includes a sealing film 331 and a support 332. The sealing film 331 is a flexible film-like member, and seals the +Z side of the reservoir R and the individual flow path 353. The outer peripheral edge of the sealing film 331 is supported by a frame-shaped support 332. The +Z side of the support 332 is fixed to the flat surface portion 151 of the fixing plate 150. The compliance section 330 configured as described above protects the head chip 300 and reduces ink pressure fluctuations inside the reservoir R or inside the individual flow path 353.

Returning to FIG. 13, as described above, the discharge head 100 distributes the ink supplied from the liquid container 5 to the plurality of nozzles N, and discharges the ink from the nozzle N by driving the piezoelectric element 60 driven by the driving signal VOUT supplied via the flexible wiring substrate 346. Here, the driving signal selection circuit 200 may be provided on the wiring substrate 130, or may be provided on the flexible wiring substrate 346 that corresponds to each of the head chips 300.

As described above, the head unit 20 includes: the plurality of piezoelectric elements 60 driven by the driving signals VOUT generated based on the driving signals COMA1 and COMB1; and the plurality of piezoelectric elements 60 driven by the driving signal VOUT generated based on the driving signals COMA2 and COMB2, and discharges the liquid in response to the drive of each of the plurality of piezoelectric elements 60 driven by the driving signal VOUT generated based on the driving signals COMA1 and COMB1, and the plurality of piezoelectric elements 60 driven by the driving signal VOUT generated based on the driving signals COMA2 and COMB2.

Returning to FIGS. 10 and 11, the discharge control section G4 is positioned on the −Z side of the flow path structure G1 and includes the wiring substrate 420. The wiring substrate 420 includes a surface 422 and a surface 421 positioned on the opposite side of the surface 422 and facing the surface 422. The surface 422 of the wiring substrate 420 is disposed to face the flow path structure G1, the supply control section G2, and the liquid discharge section G3, and the surface 421 is disposed to face the opposite sides of the flow path structure G1, the supply control section G2, and the liquid discharge section G3.

A semiconductor device 423 is provided in the region on the −X side within the surface 421 of the wiring substrate 420. The semiconductor device 423 is a circuit component that configures at least a part of the head control circuit 21, and includes, for example, a SoC. In other words, the image information signal IP supplied from the control unit 10 to the head unit 20 is input to the semiconductor device 423. Then, the semiconductor device 423 generates various signals based on the input image information signal IP, outputs corresponding control signals for various configurations included in the head unit 20, and also outputs reference driving signals dA1, dB1, dA2, and dB2.

A connector 424 is provided along the end side of the wiring substrate 420 positioned on the −Y side, which is a region further on the +X side than the semiconductor device 423 within the surface 421 of the wiring substrate 420. The connector 424 is electrically coupled to the driving signal output section G5. Accordingly, the reference driving signals dA1, dB1, dA2, and dB2 output by the semiconductor device 423 are supplied to the driving signal output circuit 50, and the driving signals COMA1, COMB1, COMA2, and COMB2 output by the driving signal output circuit 50 of the driving signal output section G5 are input to the discharge control section G4. Then, the driving signals COMA1, COMB1, COMA2, and COMB2 input to the discharge control section G4 are propagated on the wiring substrate 420, and then supplied to the discharge section 600 of the discharge head 100.

As illustrated in FIGS. 10 and 11, the driving signal output section G5 is positioned on the −Z side of the discharge control section G4 and includes a wiring substrate 530. The wiring substrate 530 includes a surface 532 and a surface 531 positioned on the opposite side of the surface 532 and facing the surface 532. The wiring substrate 530 is disposed such that the surface 532 faces the discharge control section G4 side and the surface 531 faces the side opposite to the discharge control section G4. In other words, the surface 421 of the wiring substrate 420 and the surface 532 of the wiring substrate 530 are positioned facing each other.

The driving signal output circuit 50 that outputs the driving signals COMA1, COMB1, COMA2, and COMB2 is provided on the surface 531 of the wiring substrate 530. A connector 524 is provided on the surface 532 of the wiring substrate 530. The connector 524 inputs the reference driving signals dA1, dB1, dA2, and dB2 input from the discharge control section G4 to the driving signal output circuit 50, and the driving signals COMA1, COMB1, COMA2, and COMB2 output by the driving signal output circuit 50 are output to the discharge control section G4.

As described above, the wiring substrate 420 of the discharge control section G4 and the wiring substrate 530 of the driving signal output section G5 are electrically coupled to each other via the connector 424 provided on the wiring substrate 420 and the connector 524 provided on the wiring substrate 530. The connectors 424 and 524 are preferably so-called board to board (B to B) connectors that electrically couple the wiring substrate 420 and the wiring substrate 530 to each other without using a flexible flat cable (FFC) or the like.

When the wiring substrate 420 and the wiring substrate 530 are coupled to each other by an FFC or the like, the shape of the FFC changes due to the vibration or the like applied to the liquid discharge apparatus 1, and the wiring impedance generated by the FFC changes. As a result, there is a concern that distortion occurs in the signal waveforms of the reference driving signals dA1, dB1, dA2, and dB2 and the driving signals COMA1, COMB1, COMA2, and COMB2, and the ink discharge accuracy of the liquid discharge apparatus 1 deteriorates. In response to such a problem, by using the B to B connector as the connectors 424 and 524 for electrically coupling the wiring substrate 420 and the wiring substrate 530 to each other, even when the vibration or the like occurs in the liquid discharge apparatus 1, it is possible to reduce the concern that the impedance of the propagation paths of the reference driving signals dA1, dB1, dA2, and dB2 and the driving signals COMA1, COMB1, COMA2, and COMB2 changes. As a result, the concern that distortion occurs in the signal waveforms of the reference driving signals dA1, dB1, dA2, and dB2 and the driving signals COMA1, COMB1, COMA2, and COMB2 are distorted, is reduced, and the concern that the ink discharge accuracy of the liquid discharge apparatus 1 deteriorates, is reduced.

Figure 15:
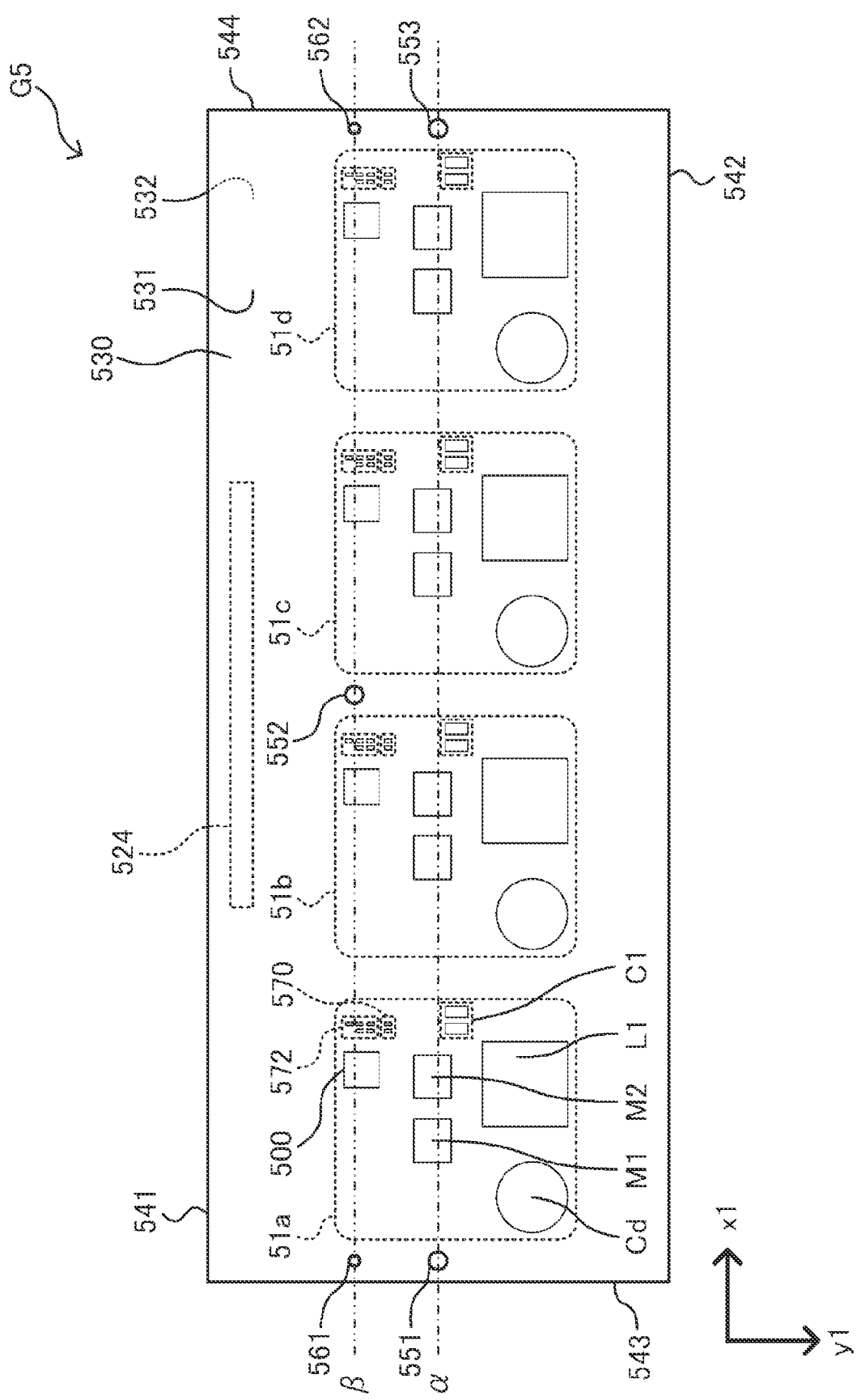
FIG. 15 is a view illustrating an example of arrangement of a driving signal output circuit provided on a wiring substrate.

Here, the details of the arrangement of the driving signal output circuit 50 on the surface 531 of the wiring substrate 530 included in the driving signal output section G5 will be described with reference to FIG. 15. FIG. 15 is a view illustrating an example of arrangement of the driving signal output circuit 50 provided on the surface 531 of the wiring substrate 530. Here, FIG. 15 illustrates the x1 direction and the y1 direction that are orthogonal to each other. In the following description, the distal end side of the arrow indicating the x1 direction illustrated in the drawing is referred to as the +x1 side and the starting point side is referred to as the −x1 side, and the distal end side of the arrow indicating the y1 direction illustrated in the drawing is referred to as the +y1 side and the starting point side is referred to as the −y1 side.

The wiring substrate 530 has a substantially rectangular shape including a side 541 extending along the x1 direction, a side 542 positioned further on the +y1 side than the side 541 and extending along the x1 direction, a side 543 extending along the y1 direction, and a side 544 positioned further on the +x1 side than the side 543 and extending along the y1 direction. In other words, the wiring substrate 530 includes the side 541 and the side 542 extending along the x1 direction and positioned facing each other in the y1 direction, and the side 543 and the side 544 which are shorter than the side 541 and side 542, extend along the y1 direction, and are positioned facing each other in the x1 direction.

The driving circuits 51a, 51b, 52a, and 52b included in the driving signal output circuit 50 are provided in order of the driving circuit 51a, the driving circuit 51b, the driving circuit 52a, and the driving circuit 52b from the −x1 side to the +x1 side along the x1 direction, on the wiring substrate 530.

Specifically, each of the driving circuits 51a, 51b, 52a, and 52b includes the integrated circuit 500, the transistors M1 and M2, and the coil L1 as described above. Then, in each of the driving circuits 51a, 51b, 52a, and 52b, the transistor M1 and the transistor M2 are arranged side by side in order of the transistor M1 and the transistor M2 from the −x1 side to the +x1 side along the x1 direction, the integrated circuit 500 is positioned on the −y1 side of the transistors M1 and M2 arranged side by side, and the coil L1 is positioned on the +y1 side of the transistors M1 and M2 arranged side by side. In other words, in each of the driving circuits 51a, 51b, 52a, and 52b, the integrated circuits 500, the transistors M1 and M2 arranged side by side along the x1 direction, and the coil L1 are positioned in order of the integrated circuit 500, the transistors M1 and M2 arranged side by side along the x1 direction, and the coil L1 along the direction from the −y1 side toward the +y1 side along the y1 direction, that is, the direction from the side 541 toward the side 542 of the wiring substrate 530.

The driving circuits 51a, 51b, 52a, and 52b are positioned such that the transistors M1 and M2 included in each of the driving circuits 51a, 51b, 52a, and 52b are arranged side by side along the x1 direction. Specifically, the transistors M1 and M2 included in each of the driving circuits 51a, 51b, 52a, and 52b are aligned side by side in order of the transistor M1 included in the driving circuit 51a, the transistor M2 included in the driving circuit 51a, the transistor M1 included in the driving circuit 51b, the transistor M2 included in the driving circuit 51b, the transistor M1 included in the driving circuit 52a, the transistor M2 included in the driving circuit 52a, the transistor M1 included in the driving circuit 52b, and the transistor M2 included in the driving circuit 52b, from the −x1 side to the +x1 side along the x1 direction.

In this case, at least a part of the transistor M1 and at least a part of the transistor M2 which are included in the driving circuit 51a, at least a part of the transistor M1 and at least a part of the transistor M2 which are included in the driving circuit 51b, at least a part of the transistor M1 and at least a part of the transistor M2 which are included in the driving circuit 52a, and at least a part of the transistor M1 and at least a part of the transistor M2 which are included in the driving circuit 52b are positioned so as to overlap a virtual straight line α along the x1 direction. In other words, the virtual straight line α is a straight line that overlaps all of the transistors M1 and M2 included in each of the driving circuits 51a, 51b, 52a, and 52b.

The integrated circuits 500 included in each of the driving circuits 51a, 51b, 52a, and 52b are arranged side by side along the x1 direction. Specifically, the integrated circuits 500 included in each of the driving circuits 51a, 51b, 52a, and 52b is positioned to be aligned side by side in order of the integrated circuit 500 included in the driving circuit 51a, the integrated circuit 500 included in the driving circuit 51b, the integrated circuit 500 included in the driving circuit 52a, and the integrated circuit 500 included in the driving circuit 52b, from the −x1 side to the +x1 side along the x1 direction.

In this case, at least a part of the integrated circuit 500 included in the driving circuit 51a, at least a part of the integrated circuit 500 included in the driving circuit 51b, at least a part of the integrated circuit 500 included in the driving circuit 52a, at least a part of the integrated circuit 500 included in the driving circuit 52b are positioned so as to overlap a virtual straight line β along the x1 direction. In other words, the virtual straight line β is a straight line that overlaps all of the integrated circuits 500 included in each of the driving circuits 51a, 51b, 52a, and 52b.

In other words, on the wiring substrate 530, the driving circuits 51a, 51b, 52a, and 52b are provided in order of the driving circuit 51a, the driving circuit 51b, the driving circuit 52a, and the driving circuit 52b from the −x1 side to the +x1 side along the x1 direction such that the transistors M1 and M2 included in each of the driving circuits 51a, 51b, 52a, and 52b overlap the virtual straight lines a extending along the x1 direction and the integrated circuits 500 included in each of the driving circuits 51a, 51b, 52a, and 52b overlap the virtual straight line β extending along the x1 direction.

As illustrated in FIG. 15, the wiring substrate 530 is formed with through-holes 551, 552, 553, 561, and 562 penetrating the surface 531 and the surface 532.

The through-hole 551 at least partially overlaps the virtual straight line α and is positioned on the −x1 side of the transistors M1 and M2 included in each of the driving circuits 51a, 51b, 52a, and 52b which are arranged side by side along the virtual straight line a. The through-hole 553 at least partially overlaps the virtual straight line α and is positioned on the +x1 side of the transistors M1 and M2 included in each of the driving circuits 51a, 51b, 52a, and 52b which are arranged side by side along the virtual straight line α. In other words, the transistors M1 and M2 included in each of the driving circuits 51a, 51b, 52a, and 52b and the through-holes 551 and 553 are arranged side by side along the virtual straight line α, and the transistors M1 and M2 which are included in each of the driving circuits 51a, 51b, 52a, and 52b are positioned between the through-hole 551 and the through-hole 553 when viewed along the y1 direction orthogonal to the x1 direction in which the virtual straight line α extends.

The through-hole 552 at least partially overlaps the virtual straight line β, and is positioned between the integrated circuit 500 included in the driving circuit 51b and the integrated circuit 500 included in the driving circuit 52a, among the integrated circuits 500 included in each of the driving circuit 51a, 51b, 52a, and 52b which are arranged side by side along the virtual straight line β. In other words, the integrated circuits 500 included in each of the driving circuits 51a, 51b, 52a, and 52b and the through-hole 552 are positioned along the virtual straight line β, and the through-hole 552 is positioned between the integrated circuit 500 included in the driving circuit 51b and the integrated circuit 500 included in the driving circuit 52a when viewed along the y1 direction orthogonal to the x1 direction in which the virtual straight line β extends.

The through-hole 561 at least partially overlaps the virtual straight line β and is positioned on the −x1 side of the integrated circuits 500 included in each of the driving circuits 51a, 51b, 52a, and 52b which are arranged side by side along the virtual straight line β. The through-hole 562 at least partially overlaps the virtual straight line β and is positioned on the +x1 side of the integrated circuits 500 included in each of the driving circuits 51a, 51b, 52a, and 52b which are arranged side by side along the virtual straight line β. In other words, the integrated circuits 500 included in each of the driving circuits 51a, 51b, 52a, and 52b and the through-holes 561 and 562 are positioned along the virtual straight line β, and the integrated circuits 500 included in each of the driving circuits 51a, 51b, 52a, and 52b are positioned between the through-hole 561 and the through-hole 562 when viewed along the y1 direction orthogonal to the x1 direction in which the virtual straight line β extends.

As described above, on the wiring substrate 530, the driving circuit 51a that outputs the driving signal COMA1, the driving circuit 51b that outputs the driving signal COMB1, the driving circuit 52a that outputs the driving signal COMA2, and the driving circuit 52b that outputs the driving signal COMB2 are disposed. Then, the reference driving signals dA1, dB1, dA2, and dB2 input to each of the driving circuits 51a, 51b, 52a, and 52b and the driving signals COMA1, COMB1, COMA2, and COMB2 output by each of the driving circuits 51a, 51b, 52a, and 52b are propagated to the wiring substrate 530.

In the driving signal output section G5 configured as described above, the sides 541 and 542 of the wiring substrate 530 extend such that the side 541 extends to the −Y side and the side 542 extends to the +Y side along the X direction, and the sides 543 and 544 extend such that the side 543 extends to the −X side and the side 544 extends to the +X side along the X direction. In other words, in the head unit 20, the wiring substrate 530 is positioned such that the x1 direction illustrated in FIG. 15 corresponds to the X direction illustrated in FIG. 10 and the like, and the y1 direction corresponds to the Y direction illustrated in FIG. 10 and the like. Then, in the driving signal output section G5, the driving circuits 51a, 51b, 52a, and 52b included in the driving signal output circuit 50 provided on the wiring substrate 530 generates the driving signals COMA1, COMB1, COMA2, and COMB2 based on the reference driving signals dA1, dB1, dA2, and dB2 input via the connector 524, and outputs the generated driving signals COMA1, COMB1, COMA2, and COMB2 to the wiring substrate 420 of the discharge control section G4 via the connector 524.

Returning to FIGS. 10 and 11, the heat dissipation section G6 is positioned on the −Z side of the driving signal output section G5 and includes a heat sink 610, a plurality of elastic heat dissipating bodies 770, and a plurality of elastic heat dissipating bodies 780.

The plurality of elastic heat dissipating bodies 770 and 780 are positioned between the driving signal output section G5 and the heat sink 610. Specifically, the plurality of elastic heat dissipating bodies 770 are provided corresponding to the transistor pairs including the transistors M1 and M2 included in each of the driving circuits 51a, 51b, 52a, and 52b in the driving signal output circuit 50 of the driving signal output section G5, between the driving signal output section G5 and the heat sink 610, and the plurality of elastic heat dissipating bodies 780 are provided corresponding to the integrated circuits 500 included in each of the driving circuits 51a, 51b, 52a, and 52b in the driving signal output circuit 50 of the driving signal output section G5 between the driving signal output section G5 and the heat sink 610. In other words, the heat dissipation section G6 includes four elastic heat dissipating bodies 770 that correspond to the transistor pairs including the transistors M1 and M2 included in each of the driving circuits 51a, 51b, 52a, and 52b, and the four elastic heat dissipating bodies 780 that correspond to the integrated circuits 500 included in each of the driving circuits 51a, 51b, 52a, and 52b.

Here, in the present embodiment, it is described that the plurality of elastic heat dissipating bodies 770 are commonly provided for each of the transistor pairs including the transistors M1 and M2 included in each of the driving circuits 51a, 51b, 52a, and 52b. However, the plurality of elastic heat dissipating bodies 770 may be individually provided for each of the transistors M1 and M2 included in each of the driving circuits 51a, 51b, 52a, and 52b. In other words, the heat dissipation section G6 may include eight elastic heat dissipating bodies 770 individually corresponding to the transistors M1 and the transistors M2 included in each of the driving circuits 51a, 51b, 52a, and 52b.

Here, the plurality of elastic heat dissipating bodies 770 and 780 are all in the form of a gel having flame retardancy and electric insulation property, and are preferably made of a silicone gel. The details of the plurality of elastic heat dissipating bodies 770 and 780 in the head unit 20 will be described later.

Next, the structure of the heat sink 610 included in the heat dissipation section G6 will be described with reference to FIGS. 16 to 21. Here, FIGS. 16 to 21 illustrate arrows indicating the x2 direction, the y2 direction, and the z2 direction that are orthogonal to each other. In the following description, when specifying the directions along the x2 direction, the y2 direction, and the z2 direction, there is a case where the distal end side of the arrow indicating the x2 direction is referred to as the +x2 side and the starting point side is referred to as the −x2 side, the distal end side of the arrow indicating the y2 direction is referred to as the +y2 side and the starting point side is referred to as the −y2 side, and the distal end side of the arrow indicating the z2 direction is referred to as the +z2 side and the starting point side is referred to as the −z2 side.

Figure 16:
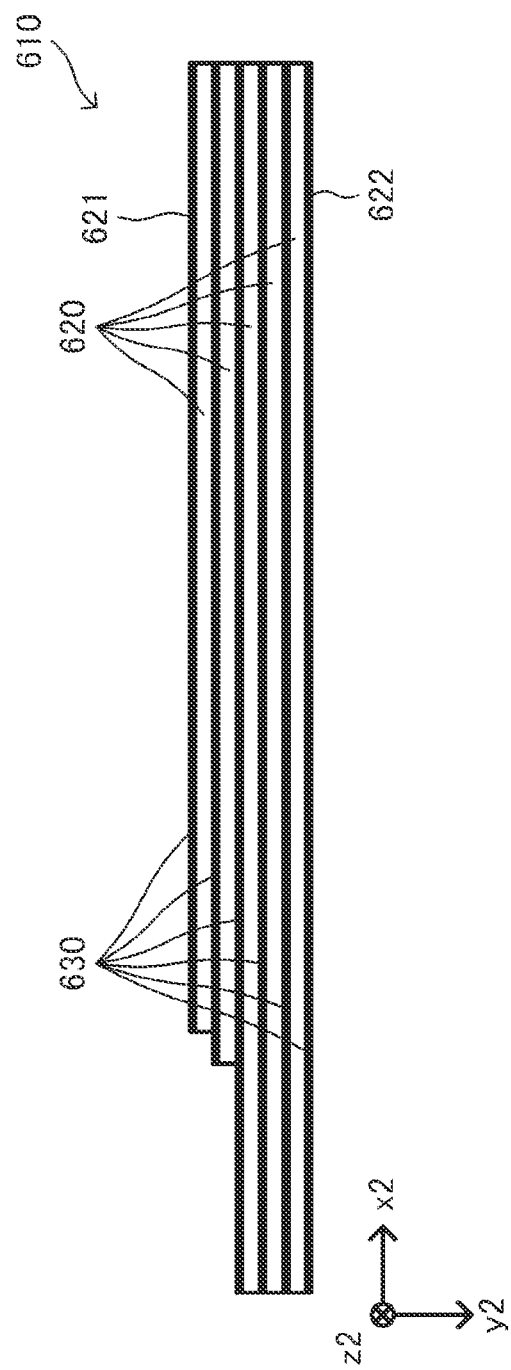
FIG. 16 is a view when a heat sink is viewed from a −z2 side.
Figure 17:
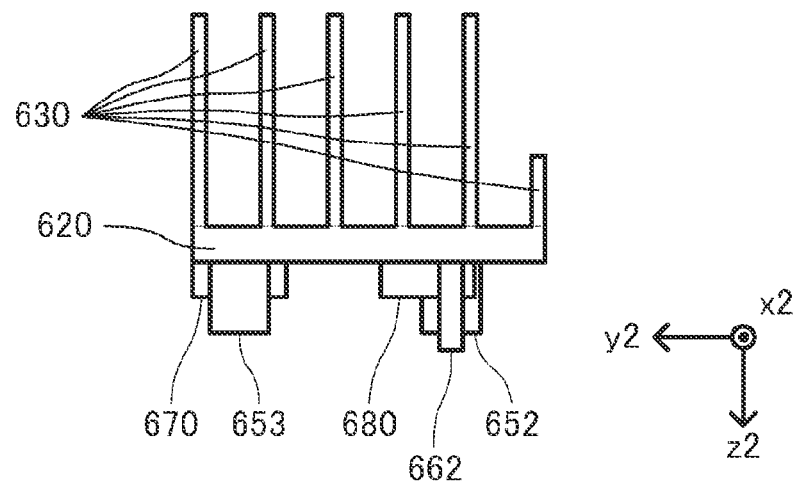
FIG. 17 is a view when the heat sink is viewed from a +x2 side.
Figure 18:
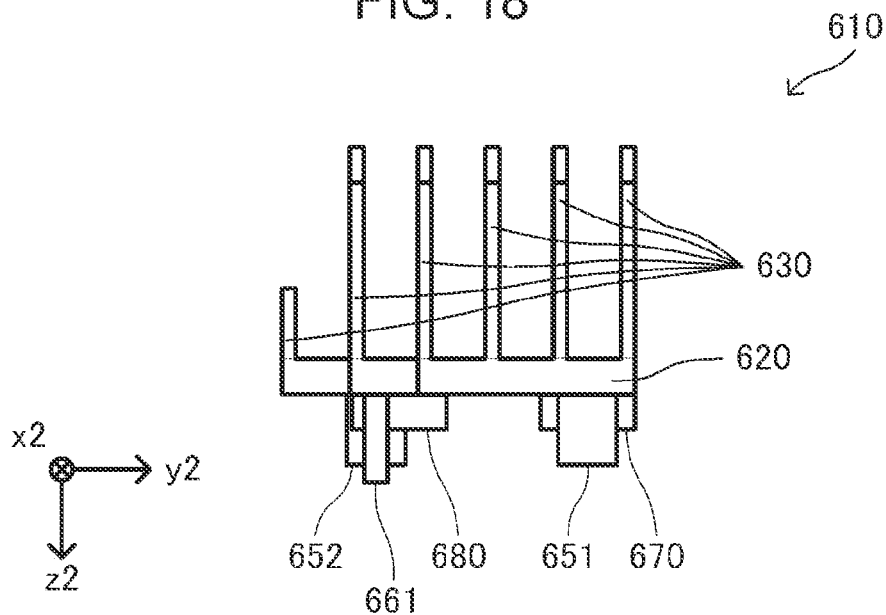
FIG. 18 is a view when the heat sink is viewed from a −x2 side.
Figure 19:
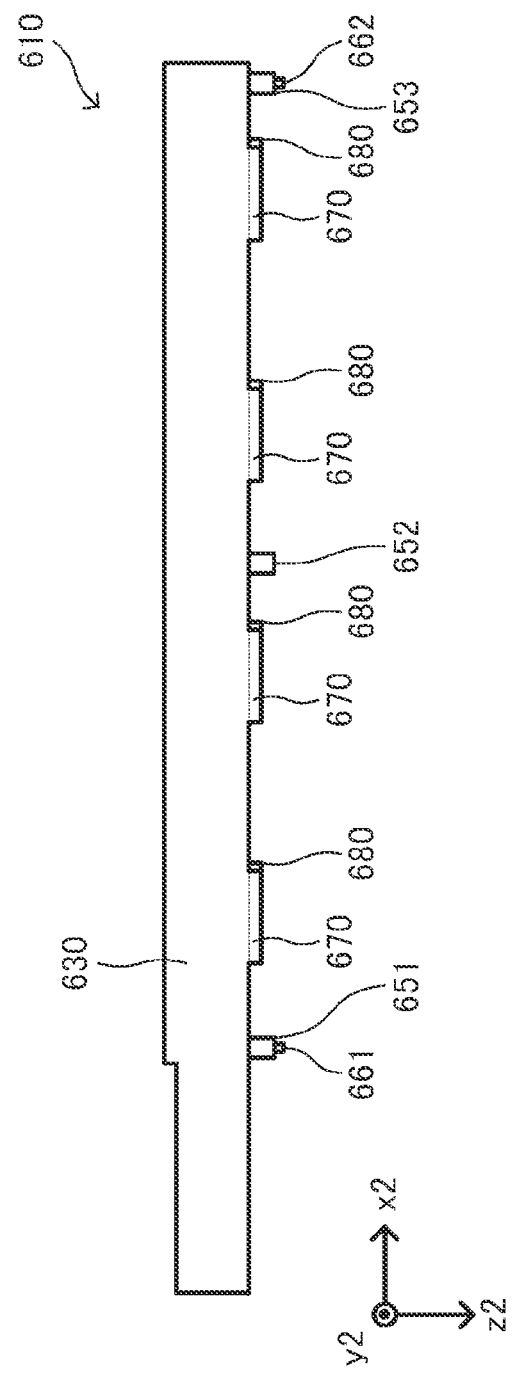
FIG. 19 is a view when the heat sink is viewed from a +y2 side.
Figure 20:
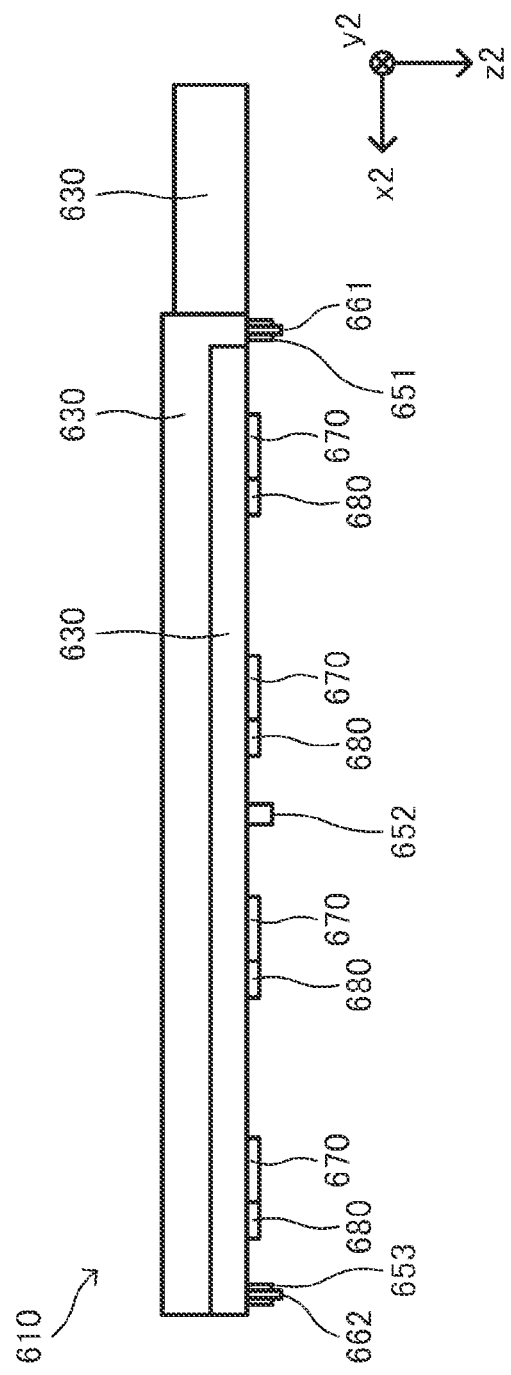
FIG. 20 is a view when the heat sink is viewed from a −y2 side.
Figure 21:
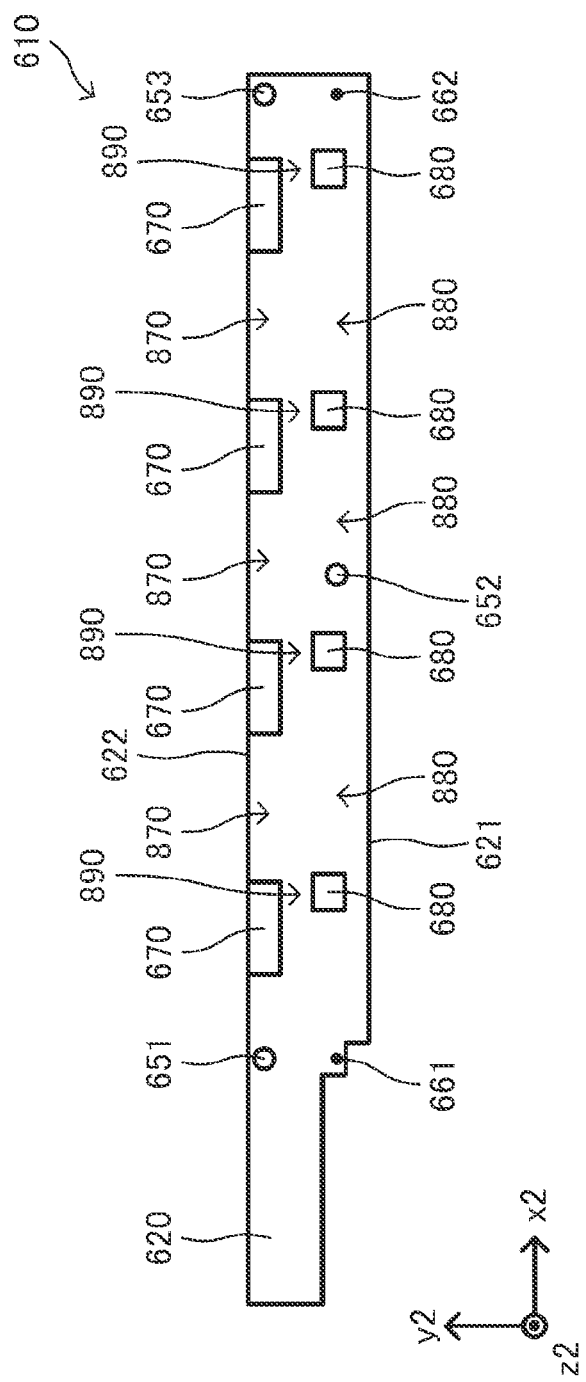
FIG. 21 is a view when the heat sink is viewed from a +z2 side.

FIG. 16 is a view when the heat sink 610 is viewed from the −z2 side. FIG. 17 is a view when the heat sink 610 is viewed from the +x2 side. FIG. 18 is a view when the heat sink 610 is viewed from the −x2 side. FIG. 19 is a view when the heat sink 610 is viewed from the +y2 side. FIG. 20 is a view when the heat sink 610 is viewed from the −y2 side. FIG. 21 is a view when the heat sink 610 is viewed from the +z2 side. In other words, FIGS. 16 to 21 correspond to a hexagonal view of the heat sink 610.

As illustrated in FIGS. 16 to 21, the heat sink 610 includes a base portion 620, a plurality of fin portions 630, a plurality of projection portions 670 and 680, fixing sections 651, 652, and 653, and reference pins 661 and 662.

The base portion 620 includes a side 621 extending along the x2 direction, a side 622 positioned facing the side 621 in the y2 direction and positioned on the +y2 side of the side 621, and a plurality of short sides intersecting with both the side 621 and the side 622 and are shorter than the side 621 and the side 622, and has a plate-like configuration extending along the plane made by the x2 direction and the y2 direction.

The plurality of fin portions 630 have a plate-like configuration positioned on the −z2 side of the base portion 620, and are aligned side by side along the y2 direction such that the normal line of the surface that form the plate shape is in the direction along the y2 direction in a state where the end portions on the +z2 sides of each of the plurality of fin portions 630 are coupled to the surfaces on the −z2 side of the base portion 620. In other words, the plurality of fin portions 630 are erected such that the surface direction is substantially perpendicular to the base portion 620, and are arranged side by side along the y2 direction.

The plurality of projection portions 670 are arranged side by side along the side 622 of the base portion 620 extending along the x2 direction on the surface on the +Z side of the base portion 620. The plurality of projection portions 680 are on the surfaces on the +Z side of the base portion 620, and are arranged side by side along the side 621 of the base portion 620 extending along the x2 direction on the −y2 side of the plurality of projection portions 670 arranged side by side along the x2 direction.

Here, the plurality of projection portions 670 are provided corresponding to the transistor pairs including the transistors M1 and M2 included in each of the driving circuits 51*a*, 51*b*, 52*a*, and 52*b* in the driving signal output circuit 50 of the driving signal output section G5, and the plurality of elastic heat dissipating bodies 780 are provided corresponding to the integrated circuits 500 included in each of the driving circuits 51*a*, 51*b*, 52*a*, and 52*b* included in the driving signal output circuit 50 of the driving signal output section G5. In other words, the heat sink 610 includes four projection portions 670 that correspond to the transistor pairs including the transistors M1 and M2 included in each of the driving circuits 51*a*, 51*b*, 52*a*, and 52*b*, and four projection portions 680 that correspond to the integrated circuits 500 included in each of the driving circuits 51*a*, 51*b*, 52*a*, and 52*b*.

In the present embodiment, it is described that the plurality of projection portions 670 are commonly provided for each of the transistor pairs including the transistors M1 and M2 included in each of the driving circuits 51*a*, 51*b*, 52*a*, and 52*b*. However, the plurality of projection portions 670 may be individually provided for each of the transistors M1 and M2 included in each of the driving circuits 51*a*, 51*b*, 52*a*, and 52*b*. In other words, the heat sink 610 may include eight projection portions 670 individually corresponding to the transistors M1 and the transistors M2 included in each of the driving circuits 51*a*, 51*b*, 52*a*, and 52*b*.

In the fixing sections 651, 652, and 653, on the surface on the +z2 side of the base portion 620, the fixing sections 651 and 653 are arranged side by side along the side 622 of the base portion 620 extending along the x2 direction, and the fixing section 652 is positioned further on the side 621 side of the fixing sections 651 and 653 which are arranged side by side along the side 622 of the base portion 620 extending along the x2 direction. Specifically, the fixing sections 651 and 653 are arranged side by side along the side 622 together with the plurality of projection portions 670 arranged side by side along the side 622 of the base portion 620 extending along the x2 direction, on the surface on the +z2 side of the base portion 620, and the fixing sections 652 are arranged side by side along the side 621 together with the plurality of projection portions 680 arranged side by side along the side 621 of the base portion 620 extending along the x2 direction.

The reference pins 661 and 662 are arranged side by side along the side 621 of the base portion 620 extending along the x2 direction on the surface on the +z2 side of the base portion 620. Specifically, the reference pins 661 and 662 are arranged side by side along the side 621 together with the plurality of projection portions 680 arranged side by side along the side 621 of the base portion 620 extending along the x2 direction, and the fixing section 652.

In the heat sink 610 configured as described above, for the base portion 620, the plurality of fin portions 630, the plurality of projection portions 670 and 680, the fixing sections 651, 652, and 653, and the reference pins 661 and 662, a metal having excellent thermal conductivity such as aluminum, iron, or copper is used. In this case, the base portion 620, the plurality of fin portions 630, the plurality of projection portions 670 and 680, the fixing sections 651, 652, and 653, and the reference pins 661 and 662 may have different configurations from each other, but the base portion 620, the plurality of fin portions 630, the plurality of projection portions 670 and 680, the fixing sections 651, 652, and 653, and the reference pins 661 and 662 are preferably made of the same material.

When at least one of the base portion 620, the plurality of fin portions 630, the plurality of projection portions 670 and 680, the fixing sections 651, 652, and 653, and the reference pins 661 and 662 are made of different substances, due to the difference in physical property such as a coefficient of thermal expansion between substances, unintended distortion occurs in the heat sink, and as a result, there is a concern that the heat dissipation characteristics of the heat sink 610 deteriorate. On the other hand, by using the same material for the base portion 620, the plurality of fin portions 630, the plurality of projection portions 670 and 680, the fixing sections 651, 652, and 653, and the reference pins 661 and 662, the concern that the difference occurs in the physical property between the configurations is reduced, and as a result, the concern that the heat dissipation characteristics deteriorate in the heat sink 610 due to the difference in the physical property is reduced.

The base portion 620, the plurality of fin portions 630, the plurality of projection portions 670 and 680, the fixing sections 651, 652, and 653, and the reference pins 661 and 662 may be coupled to each other by a coupling method such as welding. However, in the heat sink 610, manufacturing is performed by a so-called cutting method for forming the base portion 620, the plurality of fin portions 630, the plurality of projection portions 670 and 680, the fixing sections 651, 652, and 653, and the reference pins 661 and 662 by performing machining from one material, or by a die-casting method for forming the base portion 620, the plurality of fin portions 630, the plurality of projection portions 670 and 680, the fixing sections 651, 652, and 653, and the reference pins 661 and 662 by using a predetermined mold.

When the members are coupled to each other by a coupling method such as welding, physical property such as thermal resistance change at the coupling section, and as a result, the heat concentrates on a part of the heat sink 610, and there is a concern that the heat dissipation characteristics of the heat sink 610 deteriorate. On the other hand, by forming the heat sink 610 by processing one material, it is possible to reduce the concern that the heat concentrates on a part of the heat sink 610, and the concern that the heat dissipation characteristics of the heat sink 610 deteriorate is reduced.

As described above, the heat dissipation section G6 includes the heat sink 610 fixed to the wiring substrate 530 and the plurality of elastic heat dissipating bodies 770 and 780 positioned between the wiring substrate 530 and the heat sink 610. The heat sink 610 is fixed to the wiring substrate 530 to release the heat generated by the driving signal output circuit 50 provided on the wiring substrate 530 via the plurality of elastic heat dissipating bodies 770 and 780.

Here, a specific example of a fixing method of the heat sink 610 fixed to the wiring substrate 530 will be described with reference to FIGS. 22 to 25. In the description of FIGS. 22 to 25, among the plurality of elastic heat dissipating bodies 770 and the plurality of projection portions 670, which correspond to the transistor pairs including the transistors M1 and M2 included in each of the driving circuits 51*a*, 51*b*, 52*a*, and 52*b*, there is a case where the elastic heat dissipating body 770 and the projection portion 670, which correspond to the transistor pair including the transistors M1 and M2 included in the driving circuit 51*a*, are respectively referred to as an elastic heat dissipating body 771 and a projection portion 671. Similarly, among the plurality of elastic heat dissipating bodies 770 and the plurality of projection portions 670, there is a case where the elastic heat dissipating body 770 and the projection portion 670, which correspond to the transistor pair including the transistors M1 and M2 included in the driving circuit 51*b*, are respectively referred to as an elastic heat dissipating body 772 and a projection portion 672, the elastic heat dissipating body 770 and the projection portion 670, which correspond to the transistor pair including the transistors M1 and M2 included in the driving circuit 52*a*, are respectively referred to as an elastic heat dissipating body 773 and a projection portion 673, and the elastic heat dissipating body 770 and the projection portion 670, which correspond to the transistor pair including the transistors M1 and M2 included in the driving circuit 52*b*, are respectively referred to as an elastic heat dissipating body 774 and a projection portion 674.

Among the plurality of elastic heat dissipating bodies 780 and the plurality of projection portions 680, which correspond to the integrated circuits 500 included in each of the driving circuits 51*a*, 51*b*, 52*a*, and 52*b*, the elastic heat dissipating body 780 and the projection portion 680, which correspond to the integrated circuit 500 included in the driving circuit 51*a* are respectively referred to as an elastic heat dissipating body 781 and a projection portion 681. Similarly, among the plurality of elastic heat dissipating bodies 780 and the plurality of projection portions 680, there is a case where the elastic heat dissipating body 780 and the projection portion 680, which correspond to the integrated circuit 500 included in the driving circuit 51*b*, are respectively referred to as an elastic heat dissipating body 782 and a projection portion 682, the elastic heat dissipating body 780 and the projection portion 680, which correspond to the integrated circuit 500 included in the driving circuit 52*a*, are respectively referred to as an elastic heat dissipating body 783 and a projection portion 683, and the elastic heat dissipating body 780 and the projection portion 680, which correspond to the integrated circuit 500 included in the driving circuit 52*b*, are respectively referred to as an elastic heat dissipating body 784 and a projection portion 684.

Figure 22:
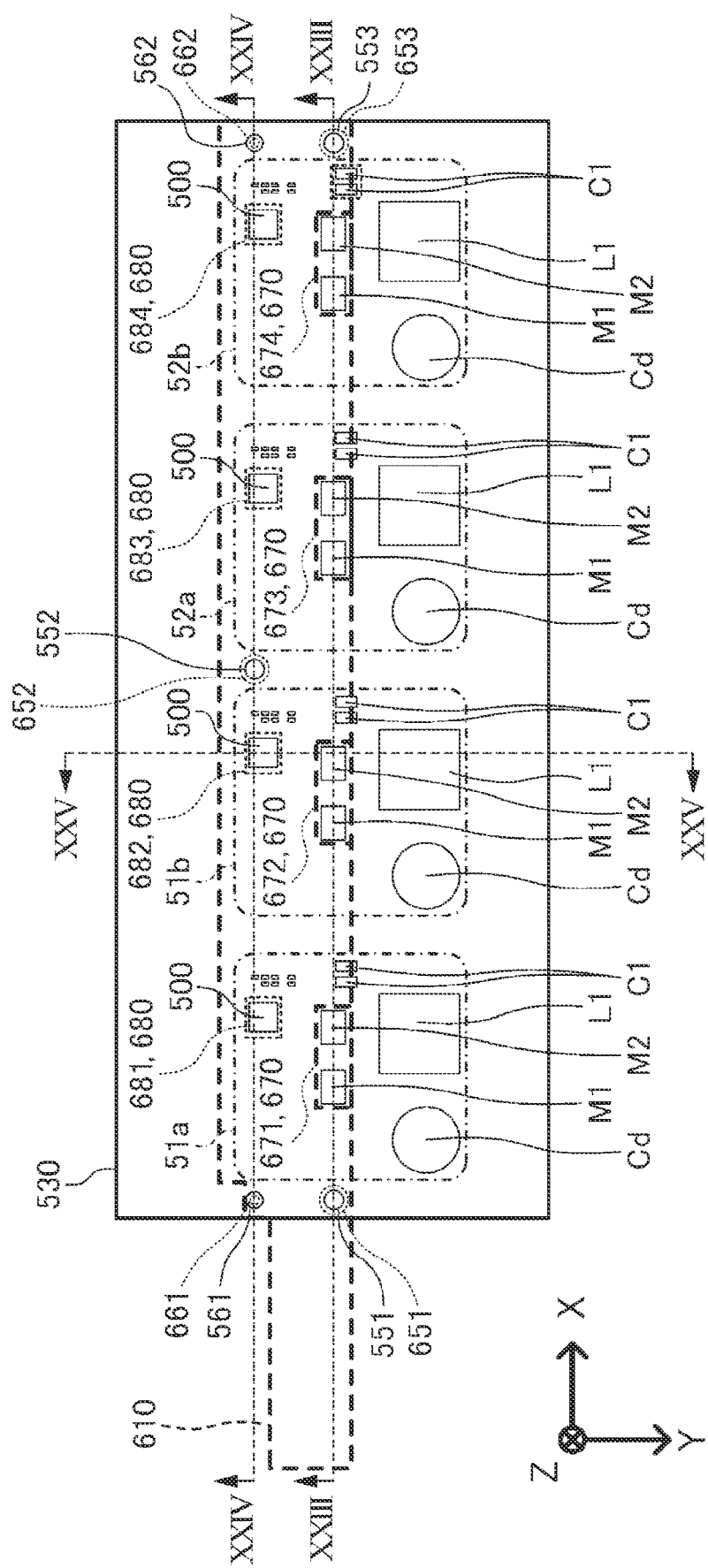
FIG. 22 is a view for describing a specific example of a fixing method of the heat sink to be fixed to the wiring substrate.
Figure 23:
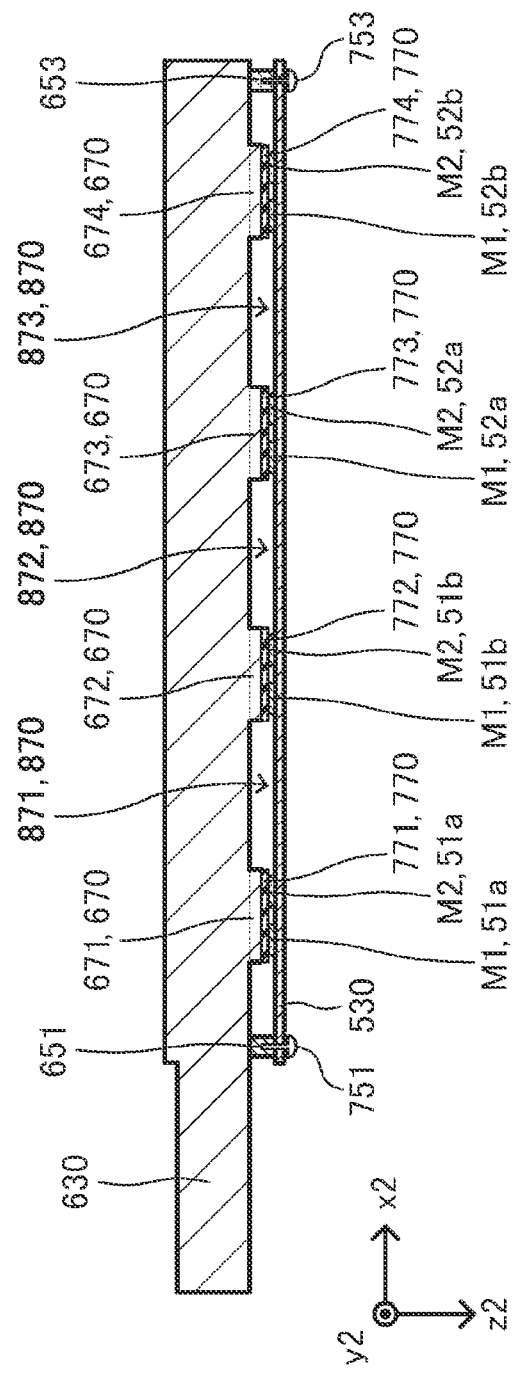
FIG. 23 is a sectional view taken along the line XXIII-XXIII illustrated in FIG. 22.
Figure 24:
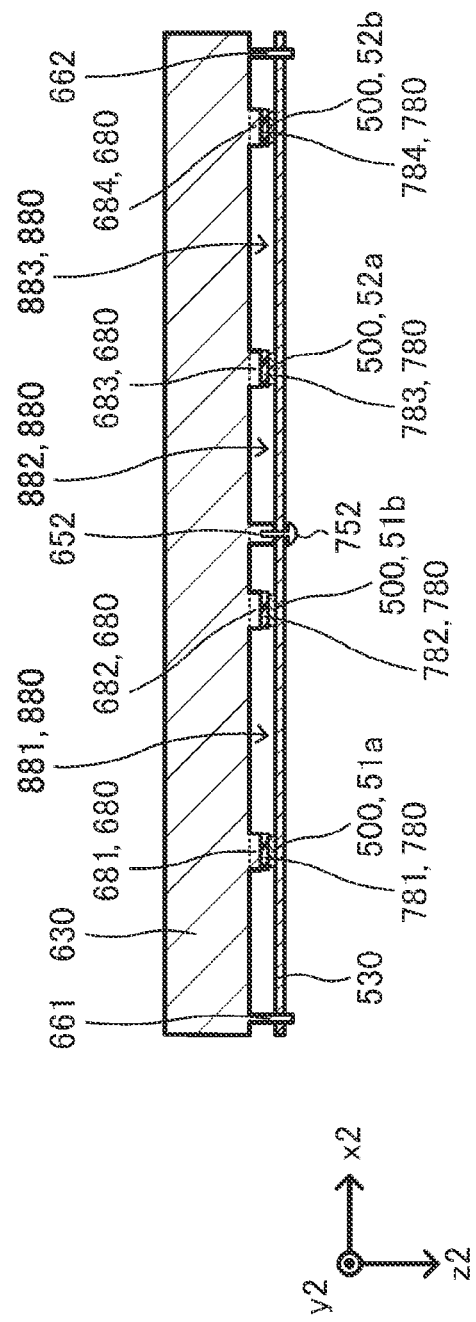
FIG. 24 is a sectional view taken along the line XXIV-XXIV illustrated in FIG. 22.
Figure 25:
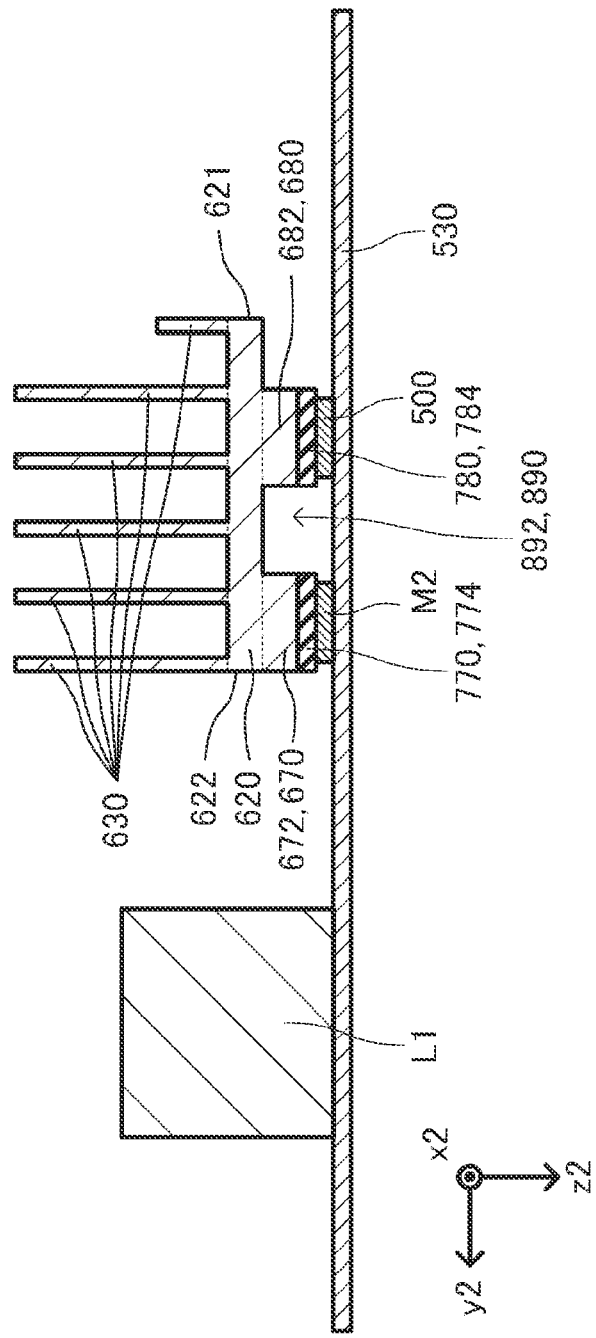
FIG. 25 is a sectional view taken along the line XXV-XXV illustrated in FIG. 22.

FIG. 22 is a view for describing a specific example of the fixing method of the heat sink 610 fixed to the wiring substrate 530. FIG. 23 is a sectional view taken along the line XXIII-XXIII illustrated in FIG. 22. FIG. 24 is a sectional view taken along the line XXIV-XXIV illustrated in FIG. 22. FIG. 25 is a sectional view taken along the line XXV-XXV illustrated in FIG. 22. Here, FIG. 22 illustrates the wiring substrate 530 and each configuration included in the driving signal output circuit 50 provided on the surface 531 of the wiring substrate 530, and the heat sink 610 fixed to the wiring substrate 530 is illustrated by a broken line.

As illustrated in FIGS. 22 and 24, the reference pin 661 of the heat sink 610 is inserted through the through-hole 561 of the wiring substrate 530, and the reference pin 662 is inserted through the through-hole 562 of the wiring substrate 530. Accordingly, the arrangement of the heat sink 610 with respect to the wiring substrate 530 is determined.

In other words, the fixing position where the heat sink 610 is fixed to the wiring substrate 530 is defined by the through-holes 561 and 562 formed on the wiring substrate 530 and the reference pins 661 and 662 included in the heat sink 610. In this case, the heat sink 610 is positioned such that the sides 621 and 622 of the base portion 620 are along the side 541 of the wiring substrate 530, the side 621 is on the side 541 side, and the side 622 is on the side 542 side. In other words, the heat sink 610 includes the side 621 and the side 622 positioned facing each other, and is positioned such that the side 621 and the side 622 extend along the side 541 and the shortest distance between the side 621 and the side 541 is shorter than the shortest distance between the side 622 and the side 541, in the head unit 20.

At the fixing position where the reference pin 661 is inserted through the through-hole 561 of the wiring substrate 530 and the reference pin 662 is inserted through the through-hole 562, in a plan view of the wiring substrate 530 when the wiring substrate 530 is viewed from the −Z side to the +Z side as illustrated in FIG. 22, at least a part of the transistor pair including the transistors M1 and M2 included in the driving circuit 51*a* provided on the wiring substrate 530 and at least a part of the projection portion 671 of the heat sink 610 are positioned overlapping each other, at least a part of the transistor pair including the transistors M1 and M2 included in the driving circuit 51*b* provided on the wiring substrate 530 and at least a part of the projection portion 672 of the heat sink 610 are positioned overlapping each other, at least a part of the transistor pair including the transistors M1 and M2 included in the driving circuit 52*a* provided on the wiring substrate 530 and at least a part of the projection portion 673 of the heat sink 610 are positioned overlapping each other, and at least a part of the transistor pair including the transistors M1 and M2 included in the driving circuit 52*b* provided on the wiring substrate 530 and at least a part of the projection portion 674 of the heat sink 610 are positioned overlapping each other.

As illustrated in FIG. 23, the elastic heat dissipating body 771 is positioned between the transistor pair including the transistors M1 and M2 included in the driving circuit 51*a* and the projection portion 671 of the heat sink 610, the elastic heat dissipating body 772 is positioned between the transistor pair including the transistors M1 and M2 included in the driving circuit 51*b* and the projection portion 672 of the heat sink 610, the elastic heat dissipating body 773 is positioned between the transistor pair including the transistors M1 and M2 included in the driving circuit 52*a* and the projection portion 673 of the heat sink 610, and the elastic heat dissipating body 774 is positioned between the transistor pair including the transistors M1 and M2 included in the driving circuit 52b and the projection portion 674 of the heat sink 610.

In other words, the elastic heat dissipating body 771 among the plurality of elastic heat dissipating bodies 770 is positioned between the heat sink 610 and the transistors M1 and M2 included in the driving circuit 51a and is in contact with the heat sink 610 and the transistors M1 and M2 included in the driving circuit 51a, the elastic heat dissipating body 772 among the plurality of elastic heat dissipating bodies 770 is positioned between the heat sink 610 and the transistors M1 and M2 included in the driving circuit 51b and is in contact with the heat sink 610 and the transistors M1 and M2 included in the driving circuit 51b, the elastic heat dissipating body 773 among the plurality of elastic heat dissipating bodies 770 is positioned between the heat sink 610 and the transistors M1 and M2 included in the driving circuit 52a and is in contact with the heat sink 610 and the transistors M1 and M2 included in the driving circuit 52a, and the elastic heat dissipating body 774 among the plurality of elastic heat dissipating bodies 770 is positioned between the heat sink 610 and the transistors M1 and M2 included in the driving circuit 52b and is in contact with the heat sink 610 and the transistors M1 and M2 included in the driving circuit 52b.

In this case, the area of the transistor pair including the transistors M1 and M2 included in the driving circuit 51a in a plan view is preferably smaller than the area of the projection portion 671 in a plan view, and the area of the transistor pair including the transistors M1 and M2 included in the driving circuit 51a in a plan view is preferably smaller than the area of the elastic heat dissipating body 771 in a plan view. Furthermore, in a plan view, all of the transistor pairs including the transistors M1 and M2 included in the driving circuit 51a are preferably positioned overlapping the projection portion 671, and all of the transistor pairs including the transistors M1 and M2 included in the driving circuit 51a are preferably positioned overlapping the elastic heat dissipating body 771.

Similarly, the areas of the transistor pairs including the transistors M1 and M2 included in each of the driving circuits 51b, 52a, and 52b in a plan view are preferably smaller than the areas of the corresponding projection portions 672, 673, and 674 in a plan view, and the areas of the transistor pairs including the transistors M1 and M2 included in each of the driving circuits 51b, 52a, and 52b in a plan view are preferably smaller than the areas of the corresponding elastic heat dissipating bodies 772, 773, and 774 in a plan view. Furthermore, all of the transistor pairs including the transistors M1 and M2 included in each of the driving circuits 51b, 52a, and 52b in a plan view are preferably positioned overlapping the corresponding projection portions 672, 673, and 674 in a plan view, and all of the transistor pairs including the transistors M1 and M2 included in each of the driving circuits 51b, 52a, and 52b are preferably positioned overlapping the corresponding elastic heat dissipating bodies 772, 773, and 774 in a plan view.

In other words, the area of the elastic heat dissipating body 771 when viewed along the Z direction, which is the normal direction of the surface 531 of the wiring substrate 530, is greater than the area of the transistor pair including the transistors M1 and M2 included in the driving circuit 51a when viewed along the normal direction of the surface 531 of the wiring substrate 530, the area of the elastic heat dissipating body 772 when viewed along the normal direction of the surface 531 of the wiring substrate 530 is greater than the area of the transistor pair including the transistors M1 and M2 included in the driving circuit 51b when viewed along the normal direction of the surface 531 of the wiring substrate 530, the area of the elastic heat dissipating body 773 when viewed along the normal direction of the surface 531 of the wiring substrate 530 is greater than the area of the transistor pair including the transistors M1 and M2 included in the driving circuit 52a when viewed along the normal direction of the surface 531 of the wiring substrate 530, and the area of the elastic heat dissipating body 774 when viewed along the normal direction of the surface 531 of the wiring substrate 530 is greater than the area of the transistor pair including the transistors M1 and M2 included in the driving circuit 52b when viewed along the normal direction of the surface 531 of the wiring substrate 530.

In the head unit 20 of the present embodiment, by inserting the reference pins 661 and 662 of the heat sink 610 through the through-holes 561 and 562 of the wiring substrate 530, the fixing position of the heat sink 610 fixed to the wiring substrate 530 is defined. However, since the wiring substrate 530 provided with the driving signal output circuit 50 having a concern that a large amount of heat is generated and the heat sink 610 that releases the heat generated by the driving signal output circuit 50 have different configurations, there is a possibility that a slight positional deviation occurs. In response to such a problem, by setting the areas of the elastic heat dissipating bodies 771, 772, 773, and 774 when viewed along the normal direction of the surface 531 of the wiring substrate 530 to be greater than the area of the transistor pair including the corresponding transistors M1 and M2 included in each of the driving circuits 51a, 51b, 52a, and 52b when viewed along the normal direction of the surface 531 of the wiring substrate 530, it becomes possible to efficiently conduct the heat generated by the transistor pair including the corresponding transistors M1 and M2 included in each of the driving circuits 51a, 51b, 52a, and 52b to the heat sink 610 via each of the elastic heat dissipating bodies 771, 772, 773, and 774. As a result, it is possible to efficiently release the heat generated in the driving signal output circuit 50 even when the positional deviation occurs at the fixing position of the heat sink 610 with respect to the wiring substrate 530.

Then, by inserting the reference pin 661 through the through-hole 561 of the wiring substrate 530 and inserting the reference pin 662 through the through-hole 562, as illustrated in FIG. 22, in a plan view of the wiring substrate 530, at least a part of the integrated circuit 500 included in the driving circuit 51a provided on the wiring substrate 530 and at least a part of the projection portion 681 of the heat sink 610 are positioned overlapping each other, at least a part of the integrated circuit 500 included in the driving circuit 51b provided on the wiring substrate 530 and at least a part of the projection portion 682 of the heat sink 610 are positioned overlapping each other, at least a part of the integrated circuit 500 included in the driving circuit 52a provided on the wiring substrate 530 and at least a part of the projection portion 683 of the heat sink 610 are positioned overlapping each other, and at least a part of the integrated circuit 500 included in the driving circuit 52b provided on the wiring substrate 530 and at least a part of the projection portion 684 of the heat sink 610 are positioned overlapping each other.

As illustrated in FIG. 24, the elastic heat dissipating body 781 is positioned between the integrated circuit 500 included in the driving circuit 51a and the projection portion 681 of the heat sink 610, the elastic heat dissipating body 782 is positioned between the integrated circuit 500 included in the driving circuit 51b and the projection portion 682 of the heat sink 610, the elastic heat dissipating body 783 is positioned between the integrated circuit 500 included in the driving circuit 52a and the projection portion 683 of the heat sink 610, and the elastic heat dissipating body 784 is positioned between the integrated circuit 500 included in the driving circuit 52b and the projection portion 684 of the heat sink 610.

In other words, the elastic heat dissipating body 781 among the plurality of elastic heat dissipating bodies 780 is positioned between the heat sink 610 and the integrated circuit 500 included in the driving circuit 51a and is in contact with the heat sink 610 and the integrated circuit 500 included in the driving circuit 51a, the elastic heat dissipating body 782 among the plurality of elastic heat dissipating bodies 780 is positioned between the heat sink 610 and the integrated circuit 500 included in the driving circuit 51b and is in contact with the heat sink 610 and the integrated circuit 500 included in the driving circuit 51b, the elastic heat dissipating body 783 among the plurality of elastic heat dissipating bodies 780 is positioned between the heat sink 610 and the integrated circuit 500 included in the driving circuit 52a and is in contact with the heat sink 610 and the integrated circuit 500 included in the driving circuit 52a, and the elastic heat dissipating body 774 among the plurality of elastic heat dissipating bodies 780 is positioned between the heat sink 610 and the integrated circuit 500 included in the driving circuit 52b and is in contact with the heat sink 610 and the integrated circuit 500 included in the driving circuit 52b.

In this case, the area of the integrated circuit 500 included in the driving circuit 51a in a plan view is preferably smaller than the area of the projection portion 681 in a plan view, and the area of the integrated circuit 500 included in the driving circuit 51a in a plan view is preferably smaller than the area of the elastic heat dissipating body 781 in a plan view. Furthermore, in a plan view, all of the integrated circuits 500 included in the driving circuit 51a are preferably positioned overlapping the projection portion 681, and all of the integrated circuits 500 included in the driving circuit 51a are preferably positioned overlapping the elastic heat dissipating body 781.

Similarly, the areas of the integrated circuits 500 included in each of the driving circuits 51b, 52a, and 52b in a plan view are preferably smaller than the areas of the corresponding projection portions 682, 683, and 684 in a plan view, and the areas of the integrated circuits 500 included in each of the driving circuits 51b, 52a, and 52b in a plan view are preferably smaller than the areas of the corresponding elastic heat dissipating bodies 782, 783, and 784 in a plan view. Furthermore, all of the integrated circuits 500 included in each of the driving circuits 51b, 52a, and 52b in a plan view are preferably positioned overlapping the corresponding projection portions 682, 683, and 684 in a plan view, and all of the integrated circuits 500 included in each of the driving circuits 51b, 52a, and 52b are preferably positioned overlapping the corresponding elastic heat dissipating bodies 782, 783, and 784 in a plan view.

In other words, the area of the elastic heat dissipating body 781 when viewed along the normal direction of the surface 531 of the wiring substrate 530 is greater than the area of the integrated circuit 500 included in the driving circuit 51a when viewed along the normal direction of the surface 531 of the wiring substrate 530, the area of the elastic heat dissipating body 782 when viewed along the normal direction of the surface 531 of the wiring substrate 530 is greater than the area of the integrated circuit 500 included in the driving circuit 51b when viewed along the normal direction of the surface 531 of the wiring substrate 530, the area of the elastic heat dissipating body 783 when viewed along the normal direction of the surface 531 of the wiring substrate 530 is greater than the area of the integrated circuit 500 included in the driving circuit 52a when viewed along the normal direction of the surface 531 of the wiring substrate 530, and the area of the elastic heat dissipating body 784 when viewed along the normal direction of the surface 531 of the wiring substrate 530 is greater than the area of the integrated circuit 500 included in the driving circuit 52b when viewed along the normal direction of the surface 531 of the wiring substrate 530.

In this manner, by setting the areas of the elastic heat dissipating bodies 781, 782, 783, and 784 when viewed along the normal direction of the surface 531 of the wiring substrate 530 to be greater than the area of the corresponding integrated circuits 500 included in each of the driving circuits 51a, 51b, 52a, and 52b when viewed along the normal direction of the surface 531 of the wiring substrate 530, it becomes possible to efficiently conduct the heat generated by the integrated circuits 500 included in each of the driving circuits 51a, 51b, 52a, and 52b to the heat sink 610 via each of the elastic heat dissipating bodies 781, 782, 783, and 784, and as a result, it is possible to efficiently release the heat generated by the driving signal output circuit 50 when the positional deviation occurs at the fixing position of the heat sink 610 with respect to the wiring substrate 530.

By inserting the reference pin 661 through the through-hole 561 of the wiring substrate 530 and inserting the reference pin 662 through the through-hole 562, as illustrated in FIG. 22, in a plan view of the wiring substrate 530, the through-hole 551 provided on the wiring substrate 530 and the fixing section 651 of the heat sink 610 are positioned overlapping each other, the through-hole 552 provided on the wiring substrate 530 and the fixing section 652 of the heat sink 610 are positioned overlapping each other, and the through-hole 553 provided on the wiring substrate 530 and the fixing section 653 of the heat sink 610 are positioned overlapping each other.

As illustrated in FIGS. 23 and 24, the fixing member 751 is attached to the fixing section 651 via the through-hole 551, the fixing member 752 is attached to the fixing section 652 via the through-hole 552, and the fixing member 753 is attached to the fixing section 653 via the through-hole 553. The fixing members 751, 752, and 753 are, for example, screws. By tightening each of the fixing members 751, 752, and 753 to the fixing sections 651, 652, and 653 via the through-holes 551, 552, and 553, the wiring substrate 530 and the heat sink 610 are tightened to each other. Accordingly, the heat sink 610 is fixed to the wiring substrate 530.

In other words, the wiring substrate 530 has the through-holes 551, 552, and 553 to each of which the heat sink 610 is fixed, and the heat sink 610 is fixed to the wiring substrate 530 by the fixing members 751, 752, and 753 through which the through-holes 551, 552, and 553 are inserted.

The reference pin 661 is inserted through the through-hole 561 of the wiring substrate 530 and the reference pin 662 is inserted through the through-hole 562. Accordingly, as illustrated in FIG. 22, in a plan view of the wiring substrate 530, the heat sink 610 which is in contact with the integrated circuits 500 and the transistors M1 and M2 of each of the driving circuits 51a, 51b, 52a, and 52b via the plurality of elastic heat dissipating bodies 770 and 780 is positioned being apart from the coils L1 of each of the driving circuits 51a, 51b, 52a, and 52b. In other words, the heat sink 610 is positioned to protrude on the side 541 side of the wiring substrate 530 in a state of being in contact with the integrated circuits 500 and the transistors M1 and M2 of each of the driving circuits 51a, 51b, 52a, and 52b via the plurality of elastic heat dissipating bodies 770 and 780.

Specifically, in the heat sink 610, the side 621 of the base portion 620 is preferably positioned further on the side 541 side than the end portion on the side 541 side of the wiring substrates 530 of at least one of the integrated circuits 500 arranged side by side in each of the driving circuits 51a, 51b, 52a, and 52b, and the side 622 of the base portion 620 is preferably positioned overlapping the end portion on the side 542 side of the wiring substrate 530 of at least one of the transistors M1 and M2 arranged side by side in each of the driving circuits 51a, 51b, 52a, and 52b. In other words, in a plan view when the head unit 20 is viewed along the Z direction, which is the normal direction of the wiring substrate 530, the heat sink 610 is fixed to the wiring substrate 530 such that the shortest distance between the integrated circuits 500 included in the driving circuits 51a, 51b, 52a, and 52b and the side 621 of the base portion 620 is longer than the shortest distance between the transistors M1 and M2 included in the driving circuits 51a, 51b, 52a, and 52b and the side 621 of the base portion 620.

As described above, the heat sink 610 is made of a metal having excellent thermal conductivity such as aluminum, iron, and copper. Accordingly, the heat dissipation performance of the driving signal output circuit 50 by the heat sink 610 is improved. Meanwhile, since the heat sink 610 is made of a metal which is a conductive member such as aluminum, iron, and copper, there is a concern that the magnetic flux generated in the coil L1 interferes with the heat sink 610 due to the high-frequency amplified modulated signals AMs supplied to the coil L1 included in each of the driving circuits 51a, 51b, 52a, and 52b. When the magnetic flux generated in the coil L1 interferes with the heat sink 610, the magnetic flux of the coil L1 is disturbed, and as a result, there is a concern that distortion occurs in the waveforms of the driving signals COMA1, COMB1, COMA2, and COMB2 output by each of the driving circuits 51a, 51b, 52a, and 52b.

In the head unit 20 of the present embodiment, the heat sink 610 is fixed to the wiring substrate 530 such that the shortest distance between the integrated circuits 500 included in the driving circuits 51a, 51b, 52a, and 52b and the side 621 of the base portion 620 is longer than the shortest distance between the transistors M1 and M2 included in the driving circuits 51a, 51b, 52a, and 52b and the side 621 of the base portion 620, in a plan view when the head unit 20 is viewed along the Z direction, which is the normal direction of the wiring substrate 530. Accordingly, while reducing the concern that the area of the wiring substrate 530 increases, it is possible to efficiently release the heat generated in the driving signal output circuit 50 provided on the wiring substrate 530 by the heat sink 610 which is in contact therewith via the plurality of elastic heat dissipating bodies 770 and 780, and further, it is possible to reduce the concern that distortion occurs in the waveforms of the driving signals COMA1, COMB1, COMA2, and COMB2. In other words, in the head unit 20 of the present embodiment, even when the head unit 20 is miniaturized, the heat generated in the driving signal output circuit 50 is efficiently released, and it is possible to reduce the concern that the heat sink 610 used for releasing the heat affects the signal waveforms of the driving signals COMA1, COMB1, COMA2, and COMB2 output by the driving signal output circuit 50.

Here, the integrated circuits 500 included in each of the driving circuits 51a, 51b, 52a, and 52b and the transistors M1 and M2 have different numbers of terminals, and different voltage value and current value of the signal to be input and output. Therefore, the sizes of the integrated circuit 500 and the transistors M1 and M2 are different. In other words, the length of the integrated circuit 500 included in each of the driving circuits 51a, 51b, 52a, and 52b in the normal direction of the surface 531 on the wiring substrate 530, and the length of the transistors M1 and M2 included in each of the driving circuits 51a, 51b, 52a, and 52b in the normal direction of the surface 531 on the wiring substrate 530, are different from each other.

Then, when the heat sink 610 is fixed to the wiring substrate 530, the heat sink 610 is fixed by being tightened to the wiring substrate 530 by the fixing members 751, 752, and 753 which are inserted through the through-holes 551, 552, and 553 of the wiring substrate 530 and tightened to the fixing sections 651, 652, and 653. In this case, the elastic heat dissipating body 771 positioned between the heat sink 610 and the transistor pair including the transistors M1 and M2 included in the driving circuit 51a is deformed as the heat sink 610 is tightened to the wiring substrate 530, and similarly, the elastic heat dissipating bodies 772, 773, and 774 positioned between the heat sink 610 and the transistor pair including the transistors M1 and M2 included in each of the driving circuits 51b, 52a, and 52b are deformed as the heat sink 610 is tightened to the wiring substrate 530. The elastic heat dissipating body 781 positioned between the heat sink 610 and the integrated circuit 500 included in the driving circuit 51a is deformed as the heat sink 610 is tightened to the wiring substrate 530, and similarly, the elastic heat dissipating bodies 782, 783, and 784 positioned between the heat sink 610 and the integrated circuit 500 included in each of the driving circuits 51b, 52a, and 52b are deformed as the heat sink 610 is tightened to the wiring substrate 530.

FIGS. 26A and 26B are views for describing the plurality of elastic heat dissipating bodies 770 and 780 that are deformed as the heat sink 610 is tightened to the wiring substrate 530. Here, FIGS. 26A and 26B are views schematically illustrating a state where the heat sink 610 is tightened to the wiring substrate 530. In FIGS. 26A and 26B, the configuration that corresponds to the heat sink 610 in the present embodiment is illustrated as a heat sink HS, the configuration that corresponds to the fixing sections 651, 652, and 653 is illustrated as a fixing section FP, the configuration that corresponds to the plurality of projection portions 670 and 680 is illustrated as a projection portion PS, the configuration that corresponds to the wiring substrate 530 is illustrated as a wiring substrate PB, the configuration that corresponds to the integrated circuit 500 and the transistors M1 and M2 is illustrated as an electronic component EP, the configuration that corresponds to the plurality of elastic heat dissipating bodies 770 and 780 is illustrated as an elastic heat dissipating body HG, and the configuration that corresponds to the fixing members 751, 752, and 753 is illustrated as a fixing member FE. FIGS. 26A and 26B illustrate "(1) before the heat sink HS is tightened to the wiring substrate PB" and "(2) after the heat sink HS is tightened to the wiring substrate PB".

As illustrated in FIGS. 26A and 26B, a length h1 which is the sum of the length of the projection portion PS along the Z direction, the length of the electronic component EP along the Z direction, and the length of the elastic heat dissipating body HG along the Z direction before the heat sink HS is tightened to the wiring substrate PB, is longer than a length h2 which is the sum of the length of the projection portion PS along the Z direction, the length of the electronic component EP along the Z direction, and the length of the elastic heat dissipating body HG along the Z direction after the heat sink HS is tightened to the wiring substrate PB. In other words, when the heat sink HS is tightened to the wiring substrate PB, the length of the elastic heat dissipating body HG having elasticity along the Z direction is deformed from a length t1 to a lengths t2 by Δt.

In other words, the length t1 of the elastic heat dissipating body HG along the Z direction, which is the normal direction, before the heat sink HS is fixed to the wiring substrate PB, is longer than the length t2 of the elastic heat dissipating body HG in the Z direction, which is the normal direction, after the heat sink HS is fixed to the wiring substrate PB. In other words, in the present embodiment, the length of at least one of the plurality of elastic heat dissipating bodies 770 including the elastic heat dissipating bodies 771, 772, 773, and 774 before the heat sink 610 is fixed to the wiring substrate 530 in the Z direction, which is the normal direction, is longer than the length of at least one of the plurality of elastic heat dissipating bodies 770 including the elastic heat dissipating bodies 771, 772, 773, and 774 after the heat sink 610 is fixed to the wiring substrate 530 along the Z direction, which is the normal direction, and the length of at least one of the plurality of elastic heat dissipating bodies 780 including the elastic heat dissipating bodies 781, 782, 783, and 784 before the heat sink 610 is fixed to the wiring substrate 530 along the Z direction, which is the normal direction, is longer than the length of at least one of the plurality of elastic heat dissipating bodies 780 including the elastic heat dissipating bodies 781, 782, 783, and 784 after the heat sink 610 is fixed to the wiring substrate 530 along the Z direction, which is the normal direction.

Accordingly, the reliability of contact between the transistors M1 and M2 and the integrated circuit 500 which are included in each of the driving circuits 51a, 51b, 52a, and 52b, and the plurality of elastic heat dissipating bodies 770 and 780 is improved, and the reliability of contact between the plurality of elastic heat dissipating bodies 770 and 780 and the heat sink 610, is improved. As a result, the reliability of heat dissipation of the transistors M1 and M2 and the integrated circuit 500 which are included in the driving circuit 51a via the elastic heat dissipating bodies 771 and 781, the reliability of heat dissipation of the transistors M1 and M2 and the integrated circuit 500 which are included in the driving circuit 51b via the elastic heat dissipating bodies 772 and 782, the reliability of heat dissipation of the transistors M1 and M2 and the integrated circuit 500 which are included in the driving circuit 52a via the elastic heat dissipating bodies 773 and 783, and the reliability of heat dissipation of the transistors M1 and M2 and the integrated circuit 500 which are included in the driving circuit 52b via the elastic heat dissipating bodies 774 and 784, are improved.

In particular, when the lengths of the transistors M1 and M2 included in each of the driving circuits 51a, 51b, 52a, and 52b and the integrated circuit 500 included in each of the driving circuits 51a, 51b, 52a, and 52b, in the normal direction of the surface 531 on the wiring substrate 530 are different from each other as described in the present embodiment, even when the heat sink 610 is fixed to the wiring substrate 530, there is a concern that the heat sink 610 and the transistors M1 and M2 included in each of the driving circuits 51a, 51b, 52a, and 52b do not sufficiently come into contact with each other, or the heat sink 610 and the integrated circuits 500 included in each of the driving circuits 51a, 51b, 52a, and 52b do not sufficiently come into contact with each other. As a result, there is a concern that the heat generated by the transistors M1 and M2 and the integrated circuits 500 which are included in each of the driving circuits 51a, 51b, 52a, and 52b cannot be sufficiently released via the heat sink 610.

In response to such a problem, by fixing the heat sink 610 to the wiring substrate 530 such that the lengths along the normal direction of the plurality of elastic heat dissipating bodies 770 positioned between the heat sink 610 and the transistors M1 and M2 included in each of the driving circuits 51a, 51b, 52a, and 52b before the heat sink 610 is fixed to the wiring substrate 530 is longer than that after the heat sink 610 is fixed to the wiring substrate 530, the length along the normal direction of the plurality of elastic heat dissipating bodies 780 positioned between the heat sink 610 and the integrated circuit 500 included in each of the driving circuits 51a, 51b, 52a, and 52b before the heat sink 610 is fixed to the wiring substrate 530 is longer than that after the heat sink 610 is fixed to the wiring substrate 530. Accordingly, the heat sink 610 and the transistors M1 and M2 included in each of the driving circuits 51a, 51b, 52a, and 52b are thermally coupled to each other via the plurality of elastic heat dissipating bodies 770, and the heat sink 610 and the integrated circuit 500 included in each of the driving circuits 51a, 51b, 52a, and 52b are thermally coupled to each other via the plurality of elastic heat dissipating bodies 780. As a result, the reliability of heat dissipation by the heat sink 610 in the transistors M1 and M2 and the integrated circuit 500 which are included in each of the driving circuits 51a, 51b, 52a, and 52b, is improved. In other words, the plurality of elastic heat dissipating bodies 770 and 780 have elasticity for absorbing the gap generated between the heat sink 610 and the transistors M1 and M2 and the integrated circuit 500 which are included in each of the driving circuits 51a, 51b, 52a, and 52b, and thus, the reliability of heat dissipation by the heat sink 610 in the transistors M1 and M2 and the integrated circuit 500 which are included in each of the driving circuits 51a, 51b, 52a, and 52b, is improved.

As described above, as the plurality of elastic heat dissipating bodies 770 and 780 are deformed, the adhesion to the transistors M1 and M2 and the integrated circuit 500 is improved, and as a result, the conductivity of heat generated by the transistors M1 and M2 and the integrated circuit 500 to the heat sink 610 is improved. The plurality of elastic heat dissipating bodies 770 and 780 preferably have high thermal conductivity. Specifically, when the thermal conductivity of the plurality of elastic heat dissipating bodies 770 and 780 is preferably 11.0 W/m·K or greater when measured by a hot disk method, and preferably 17.0 W/m·K or greater when measured by a method conforming to ASTM D5470. Accordingly, the heat generated by the transistors M1 and M2 and the integrated circuit 500 can be sufficiently conducted to the heat sink 610.

The plurality of elastic heat dissipating bodies 770 and 780 of which the adhesion to the transistors M1 and M2 and the integrated circuit 500 is improved by the deformation have high adhesion to the transistors M1 and M2 and the integrated circuit 500, and thus, the plurality of elastic heat dissipating bodies 770 and 780 preferably have high elasticity, and specifically, the elasticity of the plurality of elastic heat dissipating bodies 770 and 780 is preferably 40% or greater when measured by a method conforming to JIS K 6251. Accordingly, the followability to the shapes of the transistors M1 and M2 and the integrated circuit 500 in the plurality of elastic heat dissipating bodies 770 and 780 is improved, and as a result, the adhesion to the transistors M1 and M2 and the integrated circuit 500 in the plurality of elastic heat dissipating bodies 770 and 780 can further be improved.

Furthermore, the plurality of elastic heat dissipating bodies 770 and 780 propagate the heat of the transistors M1 and M2 and the integrated circuits 500 in each of the driving circuits 51a, 51b, 52a, and 52b, each of which generates a large amount of heat, to the heat sink 610. Therefore, the plurality of elastic heat dissipating bodies 770 and 780 are required to have high flame retardancy so as to sufficiently withstand the transistors M1 and M2 and the integrated circuit 500. The plurality of elastic heat dissipating bodies 770 and 780 closely adhere to the transistors M1 and M2 and the integrated circuit 500 by being deformed, and accordingly, the heat generated by the transistors M1 and M2 and the integrated circuit 500 is propagated to the heat sink 610. However, there is a concern that the plurality of elastic heat dissipating bodies 770 and 780 are in contact with a conductive section, which is formed on the wiring substrate 530, by being deformed, and the heat sink 610, to which the heat generated by the transistors M1 and M2 and the integrated circuit 500 which are included in each of the driving circuits 51a, 51b, 52a, and 52b are conducted, are made of a metal such as aluminum, iron, or copper having high thermal conductivity. Therefore, the plurality of elastic heat dissipating bodies 770 and 780 are required to have high insulation performance. In other words, the plurality of elastic heat dissipating bodies 770 and 780 have flame retardancy and electric insulation property, and are in the form of a gel that closely adheres to the transistors M1 and M2 and the integrated circuit 500 by being deformed.

Accordingly, the plurality of elastic heat dissipating bodies 770 and 780 can efficiently propagate the heat of the transistors M1 and M2 and the integrated circuit 500 which are included in each of the driving circuits 51a, 51b, 52a, and 52b, each of which generates a large amount of heat, to the heat sink 610. At the same time, the concern that unintended short circuit abnormalities and heat dissipation abnormalities via the heat sink 610 occur is reduced, and as a result, the reliability of heat dissipation by the heat sink 610 of the transistors M1 and M2 and the integrated circuit 500 included in each of the driving circuits 51a, 51b, 52a, and 52b is further improved.

Here, the flame retardancy of the plurality of elastic heat dissipating bodies 770 and 780 is preferably UL-94V-0 or greater. Accordingly, even when abnormal heat generation occurs in the transistors M1 and M2 and the integrated circuit 500 which are included in each of the driving circuits 51a, 51b, 52a, and 52b, for example, it is possible to reduce the concern that the abnormality caused by the heat generation spreads to other configurations included in the liquid discharge apparatus 1 and the head unit 20.

As for the insulation performance of the plurality of elastic heat dissipating bodies 770 and 780, the breakdown voltage of the wiring substrate 530 in the normal direction when the plurality of elastic heat dissipating bodies 770 and 780 are in contact with the wiring substrate 530 is 10 kV/mm or greater when measured by a method conforming to JIS K 6249, and the volume resistivity of the wiring substrate 530 in the normal direction is preferably $1 \times 10^{11}$ Ω·m or greater when measured by a method conforming to JIS K 6249. Accordingly, even when the plurality of elastic heat dissipating bodies 770 and 780 are in contact with the conductive section formed on the wiring substrate 530 by being deformed, the concern that the conductive section and the heat sink 610 are short-circuited is reduced, and as a result, the concern that operation abnormalities occur in the liquid discharge apparatus 1 and the head unit 20 due to a case where the potential of the heat sink 610 becomes an unintended potential, is reduced. In other words, the stability of the operation of the liquid discharge apparatus 1 and the head unit 20 is improved.

In the head unit 20 of the liquid discharge apparatus 1 configured as described above, at least one of the driving signals COMA1 and COMB1 is an example of a first driving signal, and a collection of the plurality of piezoelectric elements 60 included in any of the discharge heads 100a, 100b, and 100c driven by the driving signal VOUT based on the driving signals COMA1 and COMB1 is an example of a first driving element group. At least one of the driving circuit 51a that outputs the driving signal COMA1 and the driving circuit 51b that outputs the driving signal COMB1 is an example of a first driving circuit, the integrated circuit 500 included in the driving circuit 51a or the driving circuit 51b that corresponds to the first driving circuit is an example of a first integrated circuit, and the reference driving signal dA1 or the reference driving signal dB1 input to the integrated circuit 500 that corresponds to the first integrated circuit is an example of a first reference driving signal. The gate signal Hgd output by the integrated circuit 500 that corresponds to the first integrated circuit is an example of a first gate signal, and the transistor M1 driven by the gate signal Hgd that corresponds to the first gate signal is an example of a first transistor. The gate signal Lgd output by the integrated circuit 500 that corresponds to the first integrated circuit is an example of a second gate signal, and the transistor M2 driven by the gate signal Lgd that corresponds to the second gate signal is an example of a second transistor. The amplifier circuit 550 including the transistor M1 that corresponds to the first transistor and the transistor M2 that corresponds to the second transistor is an example of a first amplifier circuit, the smoothing circuit 560 that smoothes the amplified modulated signal AMs output by the amplifier circuit 550 that corresponds to the first amplifier circuit is an example a first smoothing circuit, and the coil L1 included in the smoothing circuit 560 that corresponds to the first smoothing circuit is an example of a first inductor element.

In the head unit 20, at least one of the driving signals COMA2 and COMB2 is an example of a second driving signal, and a collection of the plurality of piezoelectric elements 60 included in any of the discharge heads 100d, 100e, and 100f driven by the driving signal VOUT based on the driving signals COMA2 and COMB2 is an example of a second driving element group. At least one of the driving circuit 52a that outputs the driving signal COMA2 and the driving circuit 52b that outputs the driving signal COMB2 is an example of a second driving circuit, the integrated circuit 500 included in the driving circuit 52a or the driving circuit 52b that corresponds to the second driving circuit is an example of a second integrated circuit, and the reference driving signal dA2 or the reference driving signal dB2 input to the integrated circuit 500 that corresponds to the second integrated circuit is an example of a second reference driving signal. The gate signal Hgd output by the integrated circuit 500 that corresponds to the second integrated circuit is an example of a third gate signal, and the transistor M1 driven by the gate signal Hgd that corresponds to the third gate signal is an example of a third transistor. The gate signal Lgd output by the integrated circuit 500 that corresponds to the second integrated circuit is an example of a third gate signal, and the transistor M2 driven by the gate signal Lgd that corresponds to the third gate signal is an example of a third transistor. The amplifier circuit 550 including the transistors M1 and M2 that correspond to the third transistor is an example of a second amplifier circuit, the smoothing circuit 560 that smoothes the amplified modulated signal AMs output by the amplifier circuit 550 that corresponds to the second amplifier circuit is an example a second smoothing circuit, and the coil L1 included in the smoothing circuit 560 that corresponds to the second smoothing circuit is an example of a second inductor element.

The wiring substrate 530 provided with the driving signal output circuit 50 including the driving circuits 51*a*, 51*b*, 52*a*, and 52*b*, and propagating the driving signals COMA1, COMB1, COMA2, and COMB2 is an example of a substrate, the side 541 of the wiring substrate 530 is an example of a first side, the side 542 is an example of a second side, the side 543 is an example of a third side, and the side 544 is an example of a fourth side. The side 621 of the base portion 620 of the heat sink 610 is an example of a fifth side, and the side 622 is an example of a sixth side.

The plurality of elastic heat dissipating bodies 770 and 780 positioned between the wiring substrate 530 and the heat sink 610 are examples of a plurality of heat conductive elastic bodies. Among the plurality of elastic heat dissipating bodies 770 and 780 that correspond to the plurality of heat conductive elastic bodies, at least one of the elastic heat dissipating body 781 which is in contact with the heat sink 610 and the integrated circuit 500 included in the driving circuit 51*a* and the elastic heat dissipating body 782 which is in contact with the heat sink 610 and the integrated circuit 500 included in the driving circuit 51*b* is an example of a first heat conductive elastic body, at least one of the elastic heat dissipating body 771 which is in contact with the heat sink 610 and the transistors M1 and M2 included in the driving circuit 51*a* and the elastic heat dissipating body 772 which is in contact with the heat sink 610 and the transistors M1 and M2 included in the driving circuit 51*b* is an example of a second heat conductive elastic body, at least one of the elastic heat dissipating body 783 which is in contact with the heat sink 610 and the integrated circuit 500 included in the driving circuit 52*a* and the elastic heat dissipating body 784 which is in contact with the heat sink 610 and the integrated circuit 500 included in the driving circuit 52*b* is an example of a third heat conductive elastic body, and at least one of the elastic heat dissipating body 773 which is in contact with the heat sink 610 and the transistors M1 and M2 included in the driving circuit 52*a* and the elastic heat dissipating body 774 which is in contact with the heat sink 610 and the transistors M1 and M2 included in the driving circuit 52*b* is an example of a fourth heat conductive elastic body.

6. Operational Effect

As described above, in the liquid discharge apparatus 1 in the present embodiment, the elastic heat dissipating body 781 among the plurality of elastic heat dissipating bodies 780 is positioned between the heat sink 610 and the integrated circuit 500 included in the driving circuit 51*a* and is in contact with the heat sink 610 and the corresponding integrated circuit 500, and the elastic heat dissipating body 771 among the plurality of elastic heat dissipating bodies 770 is positioned between the heat sink 610 and the transistor M1 included in the driving circuit 51*a* and is in contact with the heat sink 610 and the corresponding transistor M1. Accordingly, even when the component heights of the integrated circuit 500 and the transistor M1 are different from each other, it is possible to release the heat generated in the integrated circuit 500 and the transistor M1 from the heat sink 610 without increasing the size of the head unit 20.

The integrated circuit 500, the transistor M1, and the coil L1 which are included in the driving circuit 51*a* are positioned in order of the integrated circuit 500, the transistor M1, and the coil L1 along the direction from the side 541 toward the side 542 of the wiring substrate 530, and the heat sink 610 is positioned such that the shortest distance between the side 621 of the base portion 620 included in the heat sink 610 and the side 541 of the wiring substrate 530 is shorter than the shortest distance between the side 622 of the base portion 620 and the side 541 of the wiring substrate 530, and is positioned such that the shortest distance between the integrated circuit 500 included in the driving circuit 51*a* and the side 621 is longer than the shortest distance between the transistor M1 included in the driving circuit 51*a* and the side 622 in a plan view when viewed from the normal direction of the wiring substrate 530. In other words, the heat sink 610 is provided being apart from the coil L1 in the driving circuit 51*a* in which the integrated circuit 500, the transistor M1, and the coil L1 are positioned in this order along the direction from the side 541 toward the side 542 of the wiring substrate 530. Accordingly, the concern that the magnetic flux generated in the coil L1 interferes with the heat sink 610 is reduced, and the concern that the magnetic flux generated in the coil L1 is disturbed is reduced. As a result, the concern that waveform distortion occurs in the driving signal COMA1 output by the driving circuit 51*a* is reduced.

In other words, in the head unit 20 of the present embodiment, it is possible to efficiently release the heat generated in the miniaturized driving signal output circuit 50, and it is possible to reduce the concern that the ink discharge accuracy deteriorates due to releasing means that releases the heat.

Above, the embodiments have been described, but the present disclosure is not limited to the embodiments, and can be implemented in various modes without departing from the gist thereof. For example, the above-described embodiments can also be appropriately combined with each other.

The present disclosure includes substantially the same configurations (for example, configurations having the same functions, methods, and results, or configurations having the same objects and effects) as the configurations described in the embodiments. Further, the present disclosure includes configurations in which non-essential parts of the configuration described in the embodiments are replaced. In addition, the present disclosure includes configurations that achieve the same operational effects as the configurations described in the embodiment, or configurations that can achieve the same objects. Further, the present disclosure includes configurations in which a known technology is added to the configurations described in the embodiments.

The following contents are derived from the above-described embodiments and modification examples.

According to an aspect, there is provided a head unit having a first driving element group driven by a first driving signal and discharging a liquid in response to drive of the first driving element group, including: a substrate that propagates the first driving signal; a first driving circuit disposed on the substrate and outputting the first driving signal; a heat sink fixed to the substrate; and a plurality of heat conductive elastic bodies positioned between the substrate and the heat sink, in which the first driving circuit includes a first integrated circuit that outputs a first gate signal based on a first reference driving signal that is a reference of the first driving signal, a first amplifier circuit including a first transistor driven by the first gate signal, and a first smoothing circuit that has a first inductor element, smoothes output from the first amplifier circuit, and outputs the first driving signal, a first heat conductive elastic body among the plurality of heat conductive elastic bodies is positioned between the heat sink and the first integrated circuit, and is in contact with the heat sink and the first integrated circuit, a second heat conductive elastic body among the plurality of heat conductive elastic bodies is positioned between the heat sink and the first transistor, and is in contact with the heat sink and the first transistor, the substrate has a first side and a second side which are positioned facing each other, and a third side and a fourth side which are shorter than the first side and positioned facing each other, the first integrated circuit, the first transistor, and the first inductor element are positioned in order of the first integrated circuit, the first transistor, and the first inductor element along a direction from the first side toward the second side, the heat sink has a fifth side and a sixth side which are positioned facing each other, and is positioned such that the fifth side and the sixth side extend along the first side and a shortest distance between the fifth side and the first side is shorter than a shortest distance between the sixth side and the first side, and a shortest distance between the first integrated circuit and the fifth side is longer than a shortest distance between the first transistor and the sixth side in a plan view when viewed from a normal direction of the substrate.

According to the head unit, the substrate on which the first driving circuit for outputting the first driving signal is disposed, the heat sink fixed to the substrate, and the plurality of heat conductive elastic bodies positioned between the substrate and the heat sink are provided, the first driving circuit includes the first integrated circuit for outputting the first gate signal, the first amplifier circuit including the first transistor driven by the first gate signal, and the first smoothing circuit that has the first inductor element, smoothes the output from the first amplifier circuit, and outputs the first driving signal, and the first integrated circuit, the first transistor, and the first inductor element are arranged in this order from the first side to the second side on the substrate. Then, the first integrated circuit of the first driving circuit is in contact with the first heat conductive elastic body, the first transistor of the first driving circuit is in contact with the second heat conductive elastic body, and the first heat conductive elastic body and the second heat conductive elastic body are also in contact with the heat sink. Accordingly, the heat generated in the first driving circuit is released via the heat sink. The heat sink which is in contact with the first heat conductive elastic body and the second heat conductive elastic body has the fifth side extending along the first side of the substrate, and the sixth side positioned further on the second side of the substrate than the fifth side and extending along the first side of the substrate. The heat sink is fixed to the substrate such that the shortest distance between the fifth side and the first integrated circuit is longer than the shortest distance between the sixth side and the first transistor. In other words, the heat sink is fixed to the substrate being apart from the first inductor element. Accordingly, the magnetic flux of the first inductor element, which is generated due to the frequency component of the signal output by the first amplifier circuit and smoothed by the first smoothing circuit, contributes to the heat sink, and due to this, the concern that disturbance occurs in the magnetic flux is reduced. As a result, the accuracy of the first driving signal output by the first smoothing circuit is improved.

In other words, according to this head unit, it is possible to efficiently release the heat generated in the first driving circuit, and it is possible to reduce the concern that the heat sink for releasing the heat affects the operation of the driving circuit.

In the head unit according to the aspect, the first integrated circuit may output a second gate signal based on the first reference driving signal, the first amplifier circuit may include a second transistor driven by the second gate signal, and the second heat conductive elastic body may be positioned between the heat sink and the first and second transistors, and may be in contact with the heat sink and the first and second transistors.

According to the head unit, even when the first driving circuit includes the second transistor, it is possible to release the heat generated in the first transistor and the second transistor from the heat sink via the second heat conductive elastic body, and the concern that disturbance occurs in the magnetic flux in the first inductor element due to the arrangement of the heat sink is reduced. Accordingly, the heat sink releases the heat generated in the first driving circuit, and the concern that the heat sink affects the operation of the driving circuit is reduced.

In the head unit according to the aspect, a second driving element group that discharges a liquid by being driven by a second driving signal; and a second driving circuit disposed on the substrate and outputting the second driving signal, may be provided, the second driving circuit may include a second integrated circuit that outputs a third gate signal based on a second reference driving signal that is a reference of the second driving signal, a second amplifier circuit having a third transistor driven by the third gate signal, and a second smoothing circuit that has a second inductor element, smoothes output from the second amplifier circuit, and outputs the second driving signal, a third heat conductive elastic body among the plurality of heat conductive elastic bodies may be positioned between the heat sink and the second integrated circuit, and may be in contact with the heat sink and the second integrated circuit, a fourth heat conductive elastic body among the plurality of heat conductive elastic bodies may be positioned between the heat sink and the third transistor, and may be in contact with the heat sink and the third transistor, the second integrated circuit, the third transistor, and the second inductor element may be positioned in order of the second integrated circuit, the third transistor, and the second inductor element along the direction from the first side toward the second side, and a shortest distance between the second integrated circuit and the fifth side may be longer than a shortest distance between the third transistor and the sixth side, in the plan view.

According to the head unit, the second driving circuit for outputting the second driving signal is disposed on the substrate, the second driving circuit includes the second integrated circuit that outputs the third gate signal, the second amplifier circuit including the third transistor driven by the third gate signal, and the second smoothing circuit that includes the second inductor element, smoothes the output from the second amplifier circuit, and outputs the second driving signal, and the second integrated circuit, the third transistor, and the second inductor element are arranged in this order from the first side toward the second side on the substrate. Then, the second integrated circuit of the second driving circuit is in contact with the third heat conductive elastic body, the third transistor of the second driving circuit is in contact with the fourth heat conductive elastic body, and the third heat conductive elastic body and the fourth heat conductive elastic body are also in contact with the heat sink. Accordingly, the heat generated in the second driving circuit is released via the heat sink. The heat sink, which is in contact with the third heat conductive elastic body and the fourth heat conductive elastic body, is fixed to the substrate such that the shortest distance between the fifth side and the second integrated circuit is longer than the shortest distance between the sixth side and the third transistor. In other words, the heat sink is fixed to the substrate being apart from the second inductor element. Accordingly, the magnetic flux of the second inductor element, which is generated due to the frequency component of the signal output by the second amplifier circuit and smoothed by the second smoothing circuit, contributes to the heat sink, and due to this, the concern that disturbance occurs in the magnetic flux is reduced. As a result, the accuracy of the second driving signal output by the second smoothing circuit is improved.

In other words, according to this head unit, it is possible to efficiently release the heat generated in the second driving circuit, and it is also possible to reduce the concern that the heat sink for releasing the heat affects the operation of the driving circuit.

In the head unit according to the aspect, the plurality of heat conductive elastic bodies may be in a form of a gel having flame retardancy and electric insulation property.

According to the head unit, since the plurality of heat conductive elastic bodies have flame retardancy and electric insulation property, even when the heat of the first driving circuit is propagated to the heat sink by using the plurality of heat conductive elastic bodies, the concern that the reliability of the operation of the head unit deteriorates is reduced, and since the plurality of heat conductive elastic bodies are in the form of a gel, the followability to the shapes of the first integrated circuit and the first transistor is improved in the plurality of heat conductive elastic bodies, and the reliability of contact of the plurality of heat conductive elastic bodies, the first integrated circuit, and the first transistor, is improved. As a result, it is possible to more efficiently release the heat generated in the first driving circuit.

In the head unit according to the aspect, the plurality of heat conductive elastic bodies may be silicone gels.

According to the head unit, even when the heat of the first driving circuit is propagated to the heat sink by using the plurality of heat conductive elastic bodies, by using silicone gel which is in the form of a gel having flame retardancy and electric insulation property as the plurality of heat conductive elastic bodies, the concern that the reliability of the operation of the head unit deteriorates is reduced, the reliability of contact of the plurality of heat conductive elastic bodies, the first integrated circuit, and the first transistor, is improved, and it is possible to more efficiently release the heat generated in the first driving circuit which is disposed on the substrate by the heat sink.

In the head unit according to the aspect, oscillation frequencies of the first driving circuit may be 1 MHz or greater and 8 MHz or less.

According to the head unit, while reducing the concern that the power consumption in the first driving circuit increases, and it is possible to reduce the concern that the waveform accuracy of the first driving signal output by the first driving circuit deteriorates.

In the head unit according to the aspect, oscillation frequencies of the first driving circuit may be 1 MHz or greater and 4 MHz or less.

According to the head unit, while reducing the concern that the power consumption in the first driving circuit increases, and it is possible to reduce the concern that the waveform accuracy of the first driving signal output by the first driving circuit deteriorates.

In the head unit according to the aspect, an area of the first heat conductive elastic body when viewed along the normal direction may be greater than an area of the first integrated circuit when viewed along the normal direction.

According to the head unit, the concern that the positional deviation occurs when fixing the heat sink to the substrate is reduced, and as a result, the reliability of contact of the first heat conductive elastic body, the first driving circuit, and the heat sink, is improved. Accordingly, the heat generated in the first driving circuit can be more efficiently released via the heat sink.

In the head unit according to the aspect, an area of the second heat conductive elastic body when viewed along the normal direction may be greater than an area of the first transistor when viewed along the normal direction.

According to the head unit, the concern that the positional deviation occurs when fixing the heat sink to the substrate is reduced, and as a result, the reliability of contact of the second heat conductive elastic body, the first driving circuit, and the heat sink, is improved. Accordingly, the heat generated in the first driving circuit can be more efficiently released via the heat sink.

According to an aspect, there is provided a liquid discharge apparatus including: the head unit; and a transport unit that transports a medium on which a liquid discharged from the head unit lands.

According to this liquid discharge apparatus, it is possible to more efficiently release the heat generated in the first driving circuit in the head unit by the heat sink, and as the heat sink is disposed being apart from the first inductor element of the first driving circuit, the concern that disturbance occurs in the magnetic flux generated by the first inductor element is reduced, and the accuracy of the first driving signal output by the first driving circuit is improved. In other words, in the head unit, it is possible to efficiently release the heat generated in the first driving circuit, and it is possible to reduce the concern that the heat sink for releasing the heat affects the operation of the driving circuit.

What is claimed is:

1. A head unit having a first driving element group driven by a first driving signal and discharging a liquid in response to drive of the first driving element group, comprising:
    a substrate that propagates the first driving signal;
    a first driving circuit disposed on the substrate and outputting the first driving signal;
    a heat sink fixed to the substrate; and
    a plurality of heat conductive elastic bodies positioned between the substrate and the heat sink, wherein
    the first driving circuit includes a first integrated circuit that outputs a first gate signal based on a first reference driving signal that is a reference of the first driving signal, a first amplifier circuit including a first transistor driven by the first gate signal, and a first smoothing circuit that has a first inductor element, smoothes output from the first amplifier circuit, and outputs the first driving signal,
    a first heat conductive elastic body among the plurality of heat conductive elastic bodies is positioned between the heat sink and the first integrated circuit, and is in contact with the heat sink and the first integrated circuit,
    a second heat conductive elastic body among the plurality of heat conductive elastic bodies is positioned between the heat sink and the first transistor, and is in contact with the heat sink and the first transistor,
    the substrate has a first side and a second side which are positioned facing each other, and a third side and a fourth side which are shorter than the first side and positioned facing each other, the first integrated circuit, the first transistor, and the first inductor element are positioned in order of the first integrated circuit, the first transistor, and the first inductor element along a direction from the first side toward the second side, the heat sink has a fifth side and a sixth side which are positioned facing each other, and is positioned such that the fifth side and the sixth side extend along the first side and a shortest distance between the fifth side and the first side is shorter than a shortest distance between the sixth side and the first side, and a shortest distance between the first integrated circuit and the fifth side is longer than a shortest distance between the first transistor and the sixth side in a plan view when viewed from a normal direction of the substrate.

2. The head unit according to claim 1, wherein
the first integrated circuit outputs a second gate signal based on the first reference driving signal,
the first amplifier circuit includes a second transistor driven by the second gate signal, and
the second heat conductive elastic body is positioned between the heat sink and the first and second transistors, and is in contact with the heat sink and the first and second transistors.

3. The head unit according to claim 1, further comprising:
a second driving element group that discharges a liquid by being driven by a second driving signal; and
a second driving circuit disposed on the substrate and outputting the second driving signal, wherein
the second driving circuit includes a second integrated circuit that outputs a third gate signal based on a second reference driving signal that is a reference of the second driving signal, a second amplifier circuit having a third transistor driven by the third gate signal, and a second smoothing circuit that has a second inductor element, smoothes output from the second amplifier circuit, and outputs the second driving signal,
a third heat conductive elastic body among the plurality of heat conductive elastic bodies is positioned between the heat sink and the second integrated circuit, and is in contact with the heat sink and the second integrated circuit, a fourth heat conductive elastic body among the plurality of heat conductive elastic bodies is positioned between the heat sink and the third transistor, and is in contact with the heat sink and the third transistor, the second integrated circuit, the third transistor, and the second inductor element are positioned in order of the second integrated circuit, the third transistor, and the second inductor element along the direction from the first side toward the second side, and a shortest distance between the second integrated circuit and the fifth side is longer than a shortest distance between the third transistor and the sixth side, in the plan view.

4. The head unit according to claim 1, wherein
the plurality of heat conductive elastic bodies are in a form of a gel having flame retardancy and electric insulation property.

5. The head unit according to claim 1, wherein
the plurality of heat conductive elastic bodies are silicone gels.

6. The head unit according to claim 1, wherein
oscillation frequencies of the first driving circuit are 1 MHz or greater and 8 MHz or less.

7. The head unit according to claim 1, wherein
oscillation frequencies of the first driving circuit are 1 MHz or greater and 4 MHz or less.

8. The head unit according to claim 1, wherein
an area of the first heat conductive elastic body when viewed along the normal direction is greater than an area of the first integrated circuit when viewed along the normal direction.

9. The head unit according to claim 1, wherein
an area of the second heat conductive elastic body when viewed along the normal direction is greater than an area of the first transistor when viewed along the normal direction.

10. A liquid discharge apparatus comprising:
the head unit according to claim 1; and
a transport unit that transports a medium on which a liquid discharged from the head unit lands.

* * * * *